United States Patent
Rol et al.

(10) Patent No.: US 9,786,811 B2
(45) Date of Patent: Oct. 10, 2017

(54) TILTED EMISSION LED ARRAY

(71) Applicant: Cree, Inc., Durham, NC (US)

(72) Inventors: Fabian Rol, Goleta, CA (US); Eric Tarsa, Goleta, CA (US); Bernd Keller, Santa Barbara, CA (US); Theodore D. Lowes, Lompoc, CA (US); David T. Emerson, Chapel Hill, NC (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 13/833,272

(22) Filed: Mar. 15, 2013

(65) Prior Publication Data

US 2014/0117386 A1    May 1, 2014

Related U.S. Application Data

(63) Continuation-in-part of application No. 13/021,496, filed on Feb. 4, 2011, and a continuation-in-part of
(Continued)

(51) Int. Cl.
*H01L 29/18*   (2006.01)
*H01L 33/00*   (2010.01)
(Continued)

(52) U.S. Cl.
CPC .......... *H01L 33/08* (2013.01); *H01L 25/0753* (2013.01); *H01L 33/58* (2013.01);
(Continued)

(58) Field of Classification Search
CPC ....................................................... H01L 33/58
(Continued)

(56) References Cited

U.S. PATENT DOCUMENTS

| 3,674,990 A | 7/1972 | Kurauchi et al. ........ 235/462.16 |
| 3,900,863 A | 8/1975 | Kim ................................ 257/95 |

(Continued)

FOREIGN PATENT DOCUMENTS

| CN | 1406450 A | 3/2003 |
| CN | 1460393 | 12/2003 |

(Continued)

OTHER PUBLICATIONS

Decision of Rejection from Chinese Patent Application No. 200980125244.X, dated Jan. 13, 2014.
(Continued)

*Primary Examiner* — Igwe U Anya
(74) *Attorney, Agent, or Firm* — Koppel, Patrick, Heybl & Philpott

(57) ABSTRACT

The present disclosure is directed to LED components, and systems using such components, having a light emission profile that may be controlled independently of the lens shape by varying the position and/or orientation of LED chips with respect to one or both of an overlying lens and the surface of the component. For example, the optical centers of the LED emitting surface and the lens, which are normally aligned, may be offset from each other to generate a controlled and predictable emission profile. The LED chips may be positioned to provide a peak emission shifted from a perpendicular centerline of the lens base. The use of offset emitters allows for LED components with shifted or tilted emission patterns, without causing output at high angles of the components. This is beneficial as it allows a lighting system to have tilted emission from the LED component and primary optics.

54 Claims, 35 Drawing Sheets

Related U.S. Application Data application No. 13/441,540, filed on Apr. 6, 2012, and a continuation-in-part of application No. 13/441,558, filed on Apr. 6, 2012.

(60) Provisional application No. 61/650,659, filed on May 23, 2012.

(51) Int. Cl.
*H01L 33/08* (2010.01)
*H01L 25/075* (2006.01)
*H01L 33/58* (2010.01)
*H01L 33/20* (2010.01)
*H01L 33/54* (2010.01)

(52) U.S. Cl.
CPC ............ *H01L 33/20* (2013.01); *H01L 33/54* (2013.01); *H01L 2924/0002* (2013.01)

(58) Field of Classification Search
USPC .......................................................... 257/88
See application file for complete search history.

(56) References Cited

U.S. PATENT DOCUMENTS

| | | | |
|---|---|---|---|
| 4,322,735 A | 3/1982 | Sadamasa et al. ............... 257/89 |
| 4,500,914 A | 2/1985 | Watanabe et al. ............. 348/280 |
| 4,946,547 A | 8/1990 | Palmour et al. .............. 156/643 |
| 4,992,704 A | 2/1991 | Stinson ........................ 315/312 |
| 5,184,114 A | 2/1993 | Brown ........................... 345/83 |
| 5,200,022 A | 4/1993 | Kong et al. ................... 156/612 |
| 5,278,432 A | 1/1994 | Ignatius et al. ................ 257/88 |
| RE34,861 E | 2/1995 | Davis et al. .................. 437/100 |
| 5,453,405 A | 9/1995 | Fan et al. ....................... 438/34 |
| 5,578,998 A | 11/1996 | Kasprowicz .................. 340/642 |
| 5,643,834 A | 7/1997 | Harada et al. ................ 438/122 |
| 5,766,987 A | 6/1998 | Mitchell et al. .............. 438/126 |
| 5,924,785 A | 7/1999 | Zhang et al. .................. 362/241 |
| 5,946,022 A | 8/1999 | Kamimura .................... 347/238 |
| 5,990,497 A | 11/1999 | Kamakura et al. |
| 6,093,940 A | 7/2000 | Ishinaga et al. ................ 257/99 |
| 6,149,283 A | 11/2000 | Conway et al. ............... 362/236 |
| 6,153,448 A | 11/2000 | Takahashi .................... 438/114 |
| 6,224,216 B1 | 5/2001 | Parker et al. ................... 353/31 |
| 6,297,598 B1 | 10/2001 | Wang et al. ................ 315/169.3 |
| 6,422,716 B2 | 7/2002 | Henrici et al. ................ 362/235 |
| 6,452,217 B1 | 9/2002 | Wojnarowski et al. ........ 257/99 |
| 6,476,410 B2 | 11/2002 | Ishinaga ......................... 257/13 |
| 6,498,355 B1 | 12/2002 | Harrah et al. .................. 257/99 |
| 6,501,084 B1 | 12/2002 | Sakai et al. ............... 250/504 R |
| 6,501,100 B1 | 12/2002 | Srivastava |
| 6,522,065 B1 | 2/2003 | Srivastava |
| 6,573,537 B1 | 6/2003 | Steigerwald et al. ........ 257/103 |
| 6,577,073 B2 | 6/2003 | Shimizu et al. |
| 6,590,152 B1 | 7/2003 | Horio ............................ 174/354 |
| 6,617,795 B2 | 9/2003 | Bruning ........................ 315/151 |
| 6,637,921 B2 | 10/2003 | Coushaine .................... 362/517 |
| 6,653,765 B1 | 11/2003 | Levinson |
| 6,661,029 B1 | 12/2003 | Duggal .......................... 257/89 |
| 6,672,741 B1 | 1/2004 | Young ........................... 362/311 |
| 6,722,777 B2 | 4/2004 | Erber ............................ 362/518 |
| 6,739,735 B2 | 5/2004 | Talamo et al. ................ 362/237 |
| 6,767,112 B2 | 7/2004 | Wu ................................ 362/247 |
| 6,791,259 B1 | 9/2004 | Stokes |
| 6,803,732 B2 | 10/2004 | Kraus et al. .................. 315/307 |
| 6,811,277 B2 | 11/2004 | Amano ........................... 362/31 |
| 6,846,101 B2 | 1/2005 | Coushaine .................... 362/517 |
| 6,891,200 B2 | 5/2005 | Nagai et al. .................... 257/88 |
| 6,893,140 B2 | 5/2005 | Storey et al. ................. 362/191 |
| 6,899,443 B2 | 5/2005 | Rizkin et al. ................. 362/327 |
| 6,909,123 B2 | 6/2005 | Hayashimoto et al. ........ 257/98 |
| 6,939,481 B2 | 9/2005 | Srivastava |
| 6,948,825 B2 | 9/2005 | Christoph ....................... 362/33 |
| 7,001,047 B2 | 2/2006 | Holder et al. ................. 362/296 |
| 7,002,546 B1 | 2/2006 | Stuppi et al. ................. 345/102 |
| 7,008,080 B2 | 3/2006 | Bachl et al. .................. 362/237 |
| 7,015,512 B2 | 3/2006 | Park et al. ....................... 257/99 |
| 7,023,019 B2 | 4/2006 | Maeda et al. .................. 257/89 |
| 7,029,150 B2 | 4/2006 | Finch ............................ 362/298 |
| 7,055,987 B2 | 6/2006 | Staufert ........................ 362/235 |
| 7,095,053 B2 | 8/2006 | Mazzochette et al. .......... 257/81 |
| 7,097,334 B2 | 8/2006 | Ishida et al. .................. 362/516 |
| 7,121,691 B2 | 10/2006 | Coushine et al. ............. 362/298 |
| 7,131,760 B2 | 11/2006 | Mayer et al. ................. 362/555 |
| 7,176,503 B2 | 2/2007 | Kim et al. ..................... 257/100 |
| 7,178,937 B2 | 2/2007 | McDermott .................. 362/187 |
| 7,204,607 B2 | 4/2007 | Yano et al. .................... 362/231 |
| 7,213,940 B1 | 5/2007 | Van de Ven et al. |
| 7,230,280 B2 | 6/2007 | Yaw et al. ....................... 257/98 |
| 7,246,921 B2 | 7/2007 | Jacobson et al. ............. 362/294 |
| 7,252,408 B2 | 8/2007 | Mazzochette et al. ........ 362/294 |
| 7,259,400 B1 | 8/2007 | Taskar ............................ 257/98 |
| 7,262,437 B2 | 8/2007 | Bogner et al. .................. 257/95 |
| 7,270,448 B1 | 9/2007 | Maley, Sr. .................... 362/334 |
| 7,278,755 B2 | 10/2007 | Inamoto ........................ 362/240 |
| 7,286,296 B2 | 10/2007 | Chaves et al. ................ 359/641 |
| 7,355,562 B2 | 4/2008 | Schubert et al. .............. 345/1.3 |
| 7,381,995 B2 | 6/2008 | Tain et al. |
| 7,387,421 B2 | 6/2008 | Lee et al. ...................... 362/612 |
| 7,439,549 B2 | 10/2008 | Marchl et al. .................. 257/88 |
| 7,478,922 B2 | 1/2009 | Garbus, Jr. ................... 362/231 |
| 7,528,421 B2 | 5/2009 | Mazzochette .................. 257/99 |
| 7,601,550 B2 | 10/2009 | Bogner |
| 7,605,452 B2 | 10/2009 | Yamanaka et al. ............ 257/676 |
| 7,621,655 B2 | 11/2009 | Roberts et al. ........... 362/249.02 |
| 7,665,861 B2 | 2/2010 | Blumel et al. ............ 362/249.02 |
| 7,700,964 B2 | 4/2010 | Morimoto et al. .............. 257/98 |
| 7,723,744 B2 | 5/2010 | Gillies et al. ................... 257/98 |
| 7,772,609 B2 | 8/2010 | Yan |
| 7,821,023 B2 | 10/2010 | Yuan et al. ...................... 257/98 |
| 7,829,899 B2 * | 11/2010 | Hutchins ........................ 257/79 |
| 7,897,980 B2 | 3/2011 | Yuan et al. ...................... 257/88 |
| 7,902,560 B2 | 3/2011 | Bierhuizen et al. ............ 257/82 |
| 7,993,036 B2 * | 8/2011 | Holder ..................... F21K 9/00 |
| | | 362/311.02 |
| 8,022,626 B2 | 9/2011 | Hamby et al. ................. 313/512 |
| 8,035,603 B2 | 10/2011 | Furukawa et al. ............ 345/102 |
| 8,098,364 B2 | 1/2012 | Yu et al. ......................... 355/55 |
| 8,272,757 B1 | 9/2012 | Fan ................................ 257/778 |
| 8,368,100 B2 | 2/2013 | Donofrio et al. |
| 8,511,855 B2 | 8/2013 | Marchl et al. |
| 2001/0032985 A1 | 10/2001 | Bhat ............................... 257/88 |
| 2001/0033726 A1 | 10/2001 | Shie et al. ..................... 385/133 |
| 2002/0001193 A1 | 1/2002 | Osawa |
| 2002/0001869 A1 | 1/2002 | Fjelstad |
| 2002/0029071 A1 | 3/2002 | Whitehurst .................... 607/88 |
| 2002/0070681 A1 | 6/2002 | Shimizu et al. ............... 315/246 |
| 2002/0093820 A1 | 7/2002 | Pederson |
| 2002/0113246 A1 | 8/2002 | Nagai et al. |
| 2002/0136025 A1 | 9/2002 | Zhang |
| 2002/0153529 A1 | 10/2002 | Shie .............................. 257/99 |
| 2002/0171089 A1 | 11/2002 | Okuyama et al. .............. 257/88 |
| 2002/0171090 A1 | 11/2002 | Oohata et al. .................. 257/88 |
| 2003/0053310 A1 | 3/2003 | Sommers et al. |
| 2003/0058641 A1 | 3/2003 | Watanabe |
| 2003/0063475 A1 | 4/2003 | Simmons |
| 2003/0072153 A1 | 4/2003 | Matsui et al. |
| 2003/0116769 A1 | 6/2003 | Song et al. |
| 2003/0142712 A1 | 7/2003 | Ikeda et al. .................... 372/36 |
| 2003/0147055 A1 | 8/2003 | Yokoyama |
| 2003/0171150 A1 | 9/2003 | Oki et al. ....................... 463/51 |
| 2003/0189829 A1 | 10/2003 | Shimizu et al. ............... 362/240 |
| 2004/0026706 A1 | 2/2004 | Bogner et al. .................. 257/99 |
| 2004/0037076 A1 * | 2/2004 | Katoh .................... H01L 33/54 |
| | | 362/235 |
| 2004/0089939 A1 | 5/2004 | Ogihara ........................ 257/690 |
| 2004/0099874 A1 | 5/2004 | Chang et al. ................... 257/98 |
| 2004/0104391 A1 | 6/2004 | Maeda et al. .................. 257/79 |
| 2004/0135522 A1 | 7/2004 | Berman et al. |
| 2004/0155565 A1 | 8/2004 | Holder et al. |
| 2004/0184272 A1 | 9/2004 | Wright et al. ................. 362/373 |
| 2004/0188696 A1 | 9/2004 | Hsing Chen .................... 257/99 |
| 2004/0222433 A1 | 11/2004 | Mazzochette et al. |

(56) References Cited

U.S. PATENT DOCUMENTS

| | | | |
|---|---|---|---|
| 2004/0239242 A1 | 12/2004 | Mano et al. | |
| 2004/0245532 A1 | 12/2004 | Maeda et al. | 257/89 |
| 2004/0256626 A1 | 12/2004 | Wang | |
| 2004/0264193 A1 | 12/2004 | Okumura | |
| 2005/0057929 A1 | 3/2005 | Yano et al. | 362/240 |
| 2005/0073840 A1 | 4/2005 | Chou et al. | |
| 2005/0082475 A1 | 4/2005 | Doan | 250/307 |
| 2005/0093422 A1 | 5/2005 | Wang | |
| 2005/0093430 A1 | 5/2005 | Ibbetson et al. | 313/501 |
| 2005/0119352 A1 | 6/2005 | Li | 362/374 |
| 2005/0122018 A1 | 6/2005 | Morris | 313/46 |
| 2005/0122031 A1 | 6/2005 | Itai et al. | |
| 2005/0141584 A1 | 6/2005 | Ohe et al. | 372/108 |
| 2005/0179041 A1 | 8/2005 | Harbers et al. | 257/80 |
| 2005/0225976 A1 | 10/2005 | Zampini et al. | |
| 2005/0247944 A1 | 11/2005 | Haque | 257/79 |
| 2005/0253151 A1 | 11/2005 | Sakai et al. | 257/79 |
| 2005/0276053 A1 | 12/2005 | Nortrup et al. | 362/294 |
| 2006/0006406 A1 | 1/2006 | Kim et al. | 257/100 |
| 2006/0017402 A1 | 1/2006 | McKinney et al. | |
| 2006/0039143 A1* | 2/2006 | Katoh et al. | 362/244 |
| 2006/0043406 A1 | 3/2006 | Tsubokura et al. | 257/99 |
| 2006/0049782 A1 | 3/2006 | Vornsand et al. | |
| 2006/0102914 A1* | 5/2006 | Smits et al. | 257/98 |
| 2006/0105478 A1 | 5/2006 | Camras et al. | 438/22 |
| 2006/0105484 A1 | 5/2006 | Basin | |
| 2006/0139580 A1 | 6/2006 | Conner | 353/98 |
| 2006/0157721 A1 | 7/2006 | Tran et al. | |
| 2006/0163589 A1 | 7/2006 | Fan et al. | 257/88 |
| 2006/0180818 A1 | 8/2006 | Nagai et al. | |
| 2006/0231852 A1 | 10/2006 | Kususe et al. | 257/99 |
| 2006/0258028 A1 | 11/2006 | Paolini et al. | 438/22 |
| 2006/0262524 A1 | 11/2006 | Kah, Jr. | |
| 2006/0289878 A1 | 12/2006 | Brunner et al. | 257/89 |
| 2007/0013057 A1 | 1/2007 | Mazzochette | 257/723 |
| 2007/0030670 A1 | 2/2007 | Ichihara et al. | |
| 2007/0046176 A1 | 3/2007 | Bukesov et al. | 313/496 |
| 2007/0109779 A1 | 5/2007 | Sekiguchi et al. | |
| 2007/0115670 A1 | 5/2007 | Roberts et al. | |
| 2007/0139920 A1 | 6/2007 | Van De Ven et al. | 362/235 |
| 2007/0158668 A1 | 7/2007 | Tarsa | 257/79 |
| 2007/0189017 A1 | 8/2007 | Hofmann | |
| 2007/0223219 A1 | 9/2007 | Medendorp, Jr. et al. | |
| 2007/0247414 A1 | 10/2007 | Roberts | 345/102 |
| 2007/0247855 A1 | 10/2007 | Yano | |
| 2007/0252924 A1 | 11/2007 | Haga et al. | 349/68 |
| 2007/0257272 A1* | 11/2007 | Hutchins | H01L 25/0753 257/98 |
| 2007/0267983 A1 | 11/2007 | Van De Ven et al. | |
| 2007/0278503 A1 | 12/2007 | Van De Ven et al. | |
| 2007/0278934 A1 | 12/2007 | Van de Ven et al. | |
| 2007/0279903 A1 | 12/2007 | Negley et al. | |
| 2007/0291467 A1 | 12/2007 | Nagai et al. | 362/84 |
| 2007/0295972 A1 | 12/2007 | Tsai et al. | 257/88 |
| 2007/0295975 A1 | 12/2007 | Omae | 257/89 |
| 2008/0024696 A1 | 1/2008 | Arai et al. | 349/62 |
| 2008/0043444 A1 | 2/2008 | Hasegawa | 361/717 |
| 2008/0074885 A1 | 3/2008 | Brands et al. | |
| 2008/0084685 A1 | 4/2008 | Van De Ven et al. | |
| 2008/0084701 A1 | 4/2008 | Van De Ven et al. | |
| 2008/0100774 A1 | 5/2008 | Jeon et al. | 349/62 |
| 2008/0106895 A1 | 5/2008 | Van De Ven et al. | 362/231 |
| 2008/0106907 A1 | 5/2008 | Trott et al. | |
| 2008/0112164 A1 | 5/2008 | Teshirogi | 362/231 |
| 2008/0112168 A1 | 5/2008 | Pickard et al. | |
| 2008/0128735 A1 | 6/2008 | Yoo | |
| 2008/0130285 A1 | 6/2008 | Negley et al. | |
| 2008/0137357 A1 | 6/2008 | Friedrichs et al. | 362/507 |
| 2008/0142816 A1 | 6/2008 | Bierhuizen et al. | 257/82 |
| 2008/0151527 A1 | 6/2008 | Ueno | |
| 2008/0170396 A1 | 7/2008 | Yuan et al. | 362/244 |
| 2008/0173884 A1 | 7/2008 | Chitnis | 438/22 |
| 2008/0174996 A1* | 7/2008 | Lu | F21V 5/04 362/235 |
| 2008/0179611 A1 | 7/2008 | Chitnis | 257/98 |
| 2008/0186702 A1 | 8/2008 | Camras et al. | 362/231 |
| 2008/0203415 A1 | 8/2008 | Thompson et al. | |
| 2008/0204366 A1 | 8/2008 | Kane et al. | 345/44 |
| 2008/0225520 A1 | 9/2008 | Garbus | 362/231 |
| 2008/0232079 A1 | 9/2008 | Awazu | 362/3 |
| 2008/0238335 A1 | 10/2008 | Lee | |
| 2008/0239722 A1* | 10/2008 | Wilcox | F21V 5/04 362/268 |
| 2008/0278655 A1 | 11/2008 | Moon | 349/58 |
| 2008/0285268 A1 | 11/2008 | Oku et al. | 362/231 |
| 2009/0008662 A1 | 1/2009 | Ashdown et al. | |
| 2009/0050907 A1 | 2/2009 | Yuan et al. | 257/88 |
| 2009/0050908 A1* | 2/2009 | Yuan | F21K 9/00 257/88 |
| 2009/0108281 A1 | 4/2009 | Keller et al. | 257/98 |
| 2009/0160363 A1 | 6/2009 | Negley | |
| 2009/0195189 A1 | 8/2009 | Zampini et al. | |
| 2009/0201679 A1 | 8/2009 | Konaka | 362/235 |
| 2009/0212717 A1 | 8/2009 | Trattler | 315/297 |
| 2009/0231832 A1 | 9/2009 | Zukauskas et al. | 362/84 |
| 2009/0257240 A1 | 10/2009 | Koike | 362/538 |
| 2009/0316073 A1 | 12/2009 | Chen et al. | 349/64 |
| 2010/0014290 A1* | 1/2010 | Wilcox | F21V 5/04 362/244 |
| 2010/0025700 A1 | 2/2010 | Jung et al. | 257/89 |
| 2010/0046231 A1 | 2/2010 | Medinis | 362/294 |
| 2010/0079059 A1 | 4/2010 | Roberts et al. | |
| 2010/0103660 A1 | 4/2010 | Van De Ven | 362/231 |
| 2010/0149783 A1 | 6/2010 | Takenaka et al. | 362/84 |
| 2010/0302786 A1* | 12/2010 | Wilcox | F21V 5/008 362/327 |
| 2011/0001149 A1 | 1/2011 | Chan et al. | |
| 2011/0037084 A1* | 2/2011 | Sekii | F21V 5/04 257/89 |
| 2011/0075428 A1* | 3/2011 | Chen | F21V 5/04 362/311.02 |
| 2011/0095311 A1 | 4/2011 | Marchl et al. | |
| 2011/0149601 A1* | 6/2011 | Jang | H01L 25/0753 362/612 |
| 2011/0257272 A1 | 6/2011 | Jang | 362/612 |
| 2011/0164425 A1* | 7/2011 | Chen | F21V 5/04 362/311.06 |
| 2011/0222280 A1 | 9/2011 | Kim | 362/235 |
| 2011/0242807 A1* | 10/2011 | Little, Jr. | F21V 5/007 362/235 |
| 2012/0075858 A1 | 3/2012 | Hsieh | 362/249.02 |
| 2012/0134154 A1 | 5/2012 | Marchl et al. | |

FOREIGN PATENT DOCUMENTS

| | | |
|---|---|---|
| CN | 1470072 | 1/2004 |
| CN | 1470072 A | 1/2004 |
| CN | 1512601 A | 7/2004 |
| CN | 1641899 A | 7/2005 |
| CN | 1667845 A | 9/2005 |
| CN | 1910762 A | 2/2007 |
| CN | 1983590 A | 6/2007 |
| CN | 101217840 | 7/2008 |
| CN | 101253813 | 8/2008 |
| CN | 201119078 | 9/2008 |
| CN | 101288341 | 10/2008 |
| CN | 101271674 | 12/2010 |
| DE | 2315709 | 3/1973 |
| DE | 19848078 | 4/2000 |
| DE | 102005059362 | 9/2006 |
| DE | 102005028403 | 12/2006 |
| EP | 0594427 A2 | 4/1994 |
| EP | 2337072 A2 | 6/2011 |
| EP | 2341280 A2 | 7/2011 |
| JP | 6284942 | 5/1987 |
| JP | 03209781 | 9/1991 |
| JP | 0545812 | 6/1993 |
| JP | 09246602 | 9/1997 |
| JP | 10012915 | 1/1998 |
| JP | 10261821 | 9/1998 |
| JP | 2001000043 | 1/2001 |
| JP | 2001057446 | 2/2001 |
| JP | 2001351404 | 12/2001 |

(56) References Cited

FOREIGN PATENT DOCUMENTS

| | | |
|---|---|---|
| JP | 200293830 | 3/2002 |
| JP | 2002184207 | 6/2002 |
| JP | 2002184207 A | 6/2002 |
| JP | 2003-168305 | 6/2003 |
| JP | 2003168305 | 6/2003 |
| JP | 2003168305 A | 6/2003 |
| JP | 2003258011 | 9/2003 |
| JP | 2004095580 | 3/2004 |
| JP | 2004512687 | 4/2004 |
| JP | 2004266168 | 9/2004 |
| JP | 2005142311 | 6/2005 |
| JP | 2005158957 | 6/2005 |
| JP | 2005-228695 | 8/2005 |
| JP | 2005228695 | 8/2005 |
| JP | 2005228695 A | 8/2005 |
| JP | 2006019598 | 1/2006 |
| JP | 2006054329 | 2/2006 |
| JP | 2006054329 A | 2/2006 |
| JP | 2006114854 | 4/2006 |
| JP | 2006-128512 | 5/2006 |
| JP | 2006128512 | 5/2006 |
| JP | 2006173271 | 6/2006 |
| JP | 2006261039 | 9/2006 |
| JP | 2006261375 | 9/2006 |
| JP | 2006294898 | 10/2006 |
| JP | 2006344690 | 12/2006 |
| JP | 2007049172 | 2/2007 |
| JP | 200759260 | 3/2007 |
| JP | 2007059207 | 3/2007 |
| JP | 2007067103 | 3/2007 |
| JP | 2007112134 | 5/2007 |
| JP | 2007189239 | 7/2007 |
| JP | 2007519221 | 7/2007 |
| JP | 2007227679 | 9/2007 |
| JP | 2007251214 | 9/2007 |
| JP | 2007529105 | 10/2007 |
| JP | 2007324608 | 12/2007 |
| JP | 200810691 | 1/2008 |
| JP | 200828171 | 2/2008 |
| JP | 2008505433 | 2/2008 |
| JP | 2008123818 | 5/2008 |
| JP | 2008218486 | 9/2008 |
| JP | 2008252262 | 10/2008 |
| JP | 2010511978 | 4/2010 |
| JP | 2011521469 | 7/2011 |
| RU | WO 2006111805 A1 * | 10/2006 ............... G09F 9/33 |
| TW | 540163 | 7/2003 |
| TW | 540163 B | 7/2003 |
| TW | 200525775 | 8/2005 |
| TW | 200633265 | 9/2006 |
| TW | 200620718 | 10/2007 |
| TW | 200827618 | 7/2008 |
| TW | 1404226 | 8/2013 |
| WO | WO 02/097884 A1 | 12/2002 |
| WO | WO02097884 A1 | 12/2002 |
| WO | WO03019072 | 3/2003 |
| WO | WO03019072 | 6/2003 |
| WO | WO2005013365 A2 | 7/2004 |
| WO | WO 2005/013365 A2 | 2/2005 |
| WO | WO2005013365 A2 | 2/2005 |
| WO | WO2006001221 | 1/2006 |
| WO | WO2006001221 A1 | 1/2006 |
| WO | WO2006013800 | 2/2006 |
| WO | WO2006016326 | 2/2006 |
| WO | WO 2006/068297 | 6/2006 |
| WO | WO2006068297 | 6/2006 |
| WO | WO2006068297 A1 | 6/2006 |
| WO | WO2006111805 | 10/2006 |
| WO | WO2006135005 | 12/2006 |
| WO | WO2007055455 | 5/2007 |
| WO | WO2007121486 A2 | 10/2007 |
| WO | WO2007126720 A2 | 11/2007 |
| WO | WO2009157999 A1 | 12/2009 |
| WO | WO 2010015825 A1 | 2/2010 |
| WO | WO2010133772 | 11/2010 |

OTHER PUBLICATIONS

Office Action from Japanese Patent Appl. No. 2013-064671, dated Feb. 3, 2014.
Appeal Board's Questioning from Japanese Patent Appl. No. 2011-512442, dated Jan. 17, 2014.
Extended European Search Report from European Patent Appl. No. 13197857.9, dated Feb. 7, 2014.
European Search Report from European Patent Appl. No. 10757645.6, dated Feb. 2, 2014.
Decision of Rejection from Japanese Patent Appl. No. 2007-228699, dated Mar. 18, 2014.
European Search Report from European Patent appl. No. 08252829.0. dated Feb. 28, 2014.
Office Action from Taiwanese Patent appl. No. 098109589, dated Feb. 18, 2014.
European Examination from European Patent appl. No. 11748482.4-1757, dated Feb. 21, 2014.
Office Action from U.S. Appl. No. 12/156,995, dated Jan. 24, 2014.
Office Action from Japanese Patent Appl. No. 2008-221738 dated Apr. 8, 2014.
Second Office Action from Chinese Patent Appl. No. 200980125251.X dated Apr. 3, 2014.
Office Action from Japanese Patent Appl. No. 2011-533175 dated Apr. 28, 2014.
Office Action from U.S. Appl. No. 12/643,670, dated Mar. 31, 2014.
Second Office Action from Chinese Patent Application No. 201980142352.8, dated May 6, 2013.
Third Office Action from Chinese Patent Application No. 200980125244.X, dated May 31, 2013.
Office Action from U.S. Appl. No. 12/156,995, dated Apr. 12, 2012.
Office Action from U.S. Appl. No. 11/982,276, dated Aug. 7, 2012.
Response to OA from U.S. Appl. No. 12/156,995, filed Sep. 12, 2012.
Response to OA from U.S. Appl. No. 11/982,276, filed Sep. 25, 2012.
Office Action from U.S. Appl. No. 12/643,670, dated Oct. 1, 2012.
Office Action from U.S. Appl. No. 11/982,276, dated Oct. 10, 2012.
Office Action from U.S. Appl. No. 13/489,035, dated Jan. 22, 2013.
Office Action from U.S. Appl. No. 12/862,640, dated Jan. 24, 2013.
Office Action from U.S. Appl. No. 13/029,005, dated Jan. 24, 2013.
Response to OA from U.S. Appl. No. 12/643,670, filed Dec. 21, 2012.
Response to OA from U.S. Appl. No. 11/982,276, filed Oct. 31, 2012.
Response to OA from U.S. Appl. No. 13/489,035, filed Jun. 5, 2013.
Response to OA from U.S. Appl. No. 12/862,640, filed Apr. 17, 2013.
Response to OA from U.S. Appl. No. 13/029,005, filed Apr. 17, 2013.
Office Action from U.S. Appl. No. 13/177,415, dated Jan. 25, 2013.
Office Action from U.S. Appl. No. 12/629,735, dated Feb. 8, 2013.
Office Action from U.S. Appl. No. 12/544,131, dated Jan. 15, 2013.
Office Action from U.S. Appl. No. 12/643,705, dated Jun. 13, 2012.
Response to OA from U.S. Appl. No. 13/177,415, filed Apr. 23, 2013.
Response to OA from U.S. Appl. No. 12/629,735, filed Jun. 10, 2013.
Response to OA from U.S. Appl. No. 12/544,131, filed Mar. 13, 2013.
Response to OA from U.S. Appl. No. 12/643,705, filed Sep. 10, 2012.
Office Action from U.S. Appl. No. 11/982,276, dated May 29, 2013.
Office Action from U.S. Appl. No. 12/862,640, dated Apr. 30, 2013.
Office Action from U.S. Appl. No. 12/288,957, dated Mar. 26, 2013.
Office Action from U.S. Appl. No. 13/177,415, dated May 2, 2013.
Response to OA from U.S. Appl. No. 12/288,957, filed Jun. 21, 2013.
Fourth Office Action from Chinese Patent Appl. No. 2009801423528, dated May 29, 2014.
U.S. Appl. No. 12/418,796, filed Apr. 6, 2009, Pickard, et al.
U.S. Appl. No. 12/873,303, filed Aug. 31, 2010, Edmond, et al.
U.S. Appl. No. 13/429,080, filed Mar. 23, 2012, Edmond, et al.

(56) References Cited

OTHER PUBLICATIONS

U.S. Appl. No. 13/028,946, filed Feb. 16, 2011, Le, et al.
U.S. Appl. No. 13/441,540, filed Apr. 6, 2012, Wilcox, et al.
U.S. Appl. No. 13/441,558, filed Apr. 6, 2012, Wilcox, et al.
U.S. Appl. No. 11/656,759, filed Jan. 22, 2007, Chitnis, et al.
Notice of Reasons for Rejection from Japanese Patent Application No. 2011-533175, dated Apr. 2, 2013.
Decision of Rejection from Japanese Patent Application No. 2008-221738, dated Feb. 26, 2013.
Decision of Dismissal of Amendment from Japanese Patent Application No. 2008-221738, dated Feb. 26, 2013.
Office Action from Japanese Patent Application No. 2011-512442, dated Feb. 22, 2013.
Satoshi Emoto, "How to make Mobile", [on line]. May 30, 2001, ITmedia (searched on Feb. 15, 2013), internet URL:http//www.itmedia.co.jp/mobile/rensai/howtomake/04.
Office Action from Japanese Patent Appl. No. 2007-228699, dated Mar. 6, 2013.
PCT Preliminary Report and Written Opinion from PCT Appl. No. PCT/US2011/001200, dated Jan. 17, 2013.
Search Report from Chinese Patent Application No. 200980125244.X, dated Nov. 5, 2012.
Second Office Action from Chinese Patent Application No. 200980125244.X, dated Nov. 26, 2012.
First Office Action from Chinese Patent Appl. No. 200980142352.8, dated Aug. 27, 2012.
Reason for Rejection for Japanese Patent Application No. 2011-510484, dated Aug. 7, 2012.
First Office Action for Chinese Patent Application No. 200980125244.X, dated May 28, 2012.
Notice of Reasons for Rejection in Japanese Patent Application No. 2011-512442, dated Aug. 7, 2012.
Notice of Reasons for Rejection from Japanese Patent Application No. 2008-221738, dated May 29, 2012.
International Search Report and Written Opinion from PCT/US2011/001200, dated Apr. 27, 2012.
First Office Action for Chinese Patent Application No. 201230001815.3, dated Apr. 11, 2012.
Summary of Notice of Reasons for Rejection from Japanese Patent Application No. 2007-228699, dated May 8, 2012.
Office Action for U.S. Appl. No. 12/883,979, mailed on Sep. 12, 2011.
Response to Office Action Sep. 12, 2011, U.S. Appl. No. 12/883,979, filed Feb. 7, 2012.
Notice of Allowance from U.S. Appl. No. 12/883,979, mailed Mar. 19, 2012.
Office Action for U.S. Appl. No. 12/156,995, mailed on Aug. 30, 2011.
Response to Office Action mailed Aug. 30, 2011, U.S. Appl. No. 12/156,995, filed Nov. 29, 2011.
Office Action for U.S. Appl. No. 12/288,957, mailed Oct. 18, 2011.
Response to Office Action mailed Oct. 18, 2011, U.S. Appl. No. 12/288,957, filed Dec. 19, 2011.
Advisory Action for U.S. Appl. No. 12/288,957, mailed Jan. 11, 2012.
Response to Advisory Action U.S. Appl. No. 12/288,957, filed Feb. 15, 2012.
Office Action for U.S. Appl. No. 11/982,276, mailed Feb. 22, 2012.
Office Action from U.S. Appl. No. 12/629,735, mailed on Mar. 10, 2011.
Response to Office Action U.S. Appl. No. 12/629,735, filed Aug. 8, 2011.
Office Action U.S. Appl. No. 12/156,995, mailed Mar. 10, 2010.
Response to Office Action U.S. Appl. No. 12/156,995, filed Sep. 10, 2010.
Office Action U.S. Appl. No. 12/629,735, mailed Sep. 22, 2010.
Response to Office Action U.S. Appl. No. 12/629,735, filed Dec. 22, 2010.
Office Action U.S. Appl. No. 12/156,995, mailed Nov. 17, 2010.
Response to Office Action U.S. Appl. No. 12/156,995, filed Apr. 18, 2011.
Office Action U.S. Appl. No. 12/288,957, mailed Sep. 21, 2010.
Response to Office Action U.S. Appl. No. 12/288,957, filed Dec. 21, 2010.
Office Action U.S. Appl. No. 12/288,957, mailed Mar. 9, 2011.
Response to Office Action U.S. Appl. No. 12/288,957, filed Aug. 8, 2011.
Summary of "Notice of Reasons for Rejection" for Japanese Application No. 2007-228699 dated May 10, 2011.
Notice of Reasons for Rejection for Japanese Patent Application No. 2008-221738 dated Aug. 3, 2011.
Communication pursuant to Article 94(3) EPC for Patent Application No. 09 758 647.3-1226, dated: Jun. 21, 2011.
Cree EZ700 EZBright LED chip data sheet, 2006, pp. 1-6.
Cree EZ1000 EZBright LED chip data sheet, 2006, pp. 1-6.
Cree XLamp XR-E and XR-C LED data sheet, 2007. pp. 1-11.
Lamina, Titan Turbo LED Light Engines data sheet, 2008.
International Search Report and Written Opinion for counterpart PCT application No. PCT/US2010/003168 mailed Apr. 26, 2011.
U.S. Appl. No. 61/041,404, "Solid State Lighting Devices and Methods of Manufacturing Same".
U.S. Appl. No. 60/130,411, "Light Source With Near Field Mixing".
U.S. Appl. No. 61/037,365.
International Search Report and Written Opinion fro PCT Application No. PCT/US2010/003190, mailed Apr. 6, 2011.
Office Action from Japanese Patent Application No. 2007-533459(Appeal No. 2009-006588) mailed Jul. 16, 2010.
Office Action from Chinese Patent Appl. No. 200780012387.0, mailed Jun. 30, 2010.
Patent Abstracts of Japan No. 2002-050799, dated Feb. 15, 2002 to Stanley Electric Co., Ltd.
From related application, Japanese Patent Appl. No. 2006-526964, Official Notice of Rejection, mailed Feb. 16, 2010.
Patent Abstracts of Japan. Pub. No. 2003-258011, dated Sep. 12, 2003.
Patent Abstracts of Japan, Pub. No. 2002-093830, dated Mar. 29, 2002.
Office Action from related U.S. Appl. No. 11/656,759, mailed: Nov. 25, 2009.
Office Action from related U.S. Appl. No. 11/398,214, mailed: Dec. 11, 2009.
Office Action from related U.S. Appl. No. 10/666,399, mailed: Dec. 22, 2009.
Office Action from related U.S. Appl. No. 11/982,276, mailed: Mar. 25, 2010.
Office Action from related U.S. Appl. No. 11/827,626, mailed: Apr. 1, 2010.
Office Action from U.S. Appl. No. 11/982,276, dated: May 19, 2009.
Response to Office Action from U.S. Appl. No. 11/982,276, filed Aug. 17, 2009.
Office Action from U.S. Appl. No. 12/288,957, dated: Sep. 21, 2010.
Response to Office Action from U.S. Appl. No. 12/288,957, filed Dec. 21, 2010.
Office Action from U.S. Appl. No. 12/629,735, dated: Sep. 22, 2010.
Response to Office Action from U.S. Appl. No. 12/629,735, filed Dec. 22, 2010.
Office Action from U.S. Appl. No. 12/288,957, dated: Mar. 9, 2011.
Office Action from U.S. Appl. No. 12/629,735, dated: Mar. 10, 2011.
Office Action from U.S. Appl. No. 12/156,995, dated: Mar. 10, 2010.
Response to Office Action from U.S. Appl. No. 12/156,995, filed Sep. 10, 2010.
Office Action from U.S. Appl. No. 12/156,995, dated: Nov. 17, 2010.
Response to Office Action from U.S. Appl. No. 12/156,995, filed Apr. 18, 2011.
Office Action from U.S. Appl. No. 11/982,276, dated: Dec. 7, 2009.
Response to Office Action from U.S. Appl. No. 11/982,276, filed Feb. 5, 2010.
Office Action from U.S. Appl. No. 11/982,276, dated: Feb. 18, 2010.

(56) References Cited

OTHER PUBLICATIONS

Response to Office Action from U.S. Appl. No. 11/982,276, filed Mar. 8, 2010.
Response to Office Action from U.S. Appl. No. 11/982,276, filed Jun. 21, 2010.
Office Action from U.S. Appl. No. 11/982,276, dated: Aug. 19, 2010.
Office Action from U.S. Appl. No. 12/156,995, dated May 7, 2014.
Office Action from U.S. Appl. No. 13/177,415, dated May 7, 2014.
Office Action from U.S. Appl. No. 13/971,547, dated May 8, 2014.
Response to Office Action from U.S. Appl. No. 13/971,547, dated Jul. 11, 2014.
Office Action from Taiwanese Patent Appl. No. 098136067, dated Jun. 26, 2014.
Office Action from Taiwanese Patent Appl. No. 098109589, dated Jul. 11, 2014.
Office Action from Japanese Patent Appl. No. 2011-533175, dated Jul. 25, 2013.
Notice of Reconsideration from Japanese Patent Appl. No. 2008-221738, dated Jul. 9, 2013.
International Search Report and Written Opinion for Appl. No. PCT/US2013/038391, dated Aug. 8, 2013.
Office Action and Search Report from Taiwanese Patent Appl. No. 098109421, dated Aug. 22, 2014.
Notice of Reasons for Reaction from Japanese Patent Appl. No. 2012-544480, dated Aug. 5, 2014.
Office Action from U.S. Appl. No. 12/288,957, dated Aug. 12, 2014.
Interrogation from Japanese Patent Appl. No. 2008-221738, dated Sep. 10, 2013.
First Office Action from Chinese Patent Appl. No. 200980125251, dated Aug. 8, 2013 (Received Oct. 4, 2013).
Search Report from Chinese Patent Appl. No. 200980125251, dated Jul. 31, 2013 (Received Oct. 14, 2013).
Office Action from U.S. Appl. No. 12/629,735, dated Sep. 18, 2013.
Office Action from U.S. Appl. No. 13/489,035, dated Aug. 5, 2013.
Response to OA from U.S. Appl. No. 13/489,035, filed Oct. 7, 2013.
Office Action from U.S. Appl. No. 12/156,995, dated Aug. 28, 2013.
Office Action from U.S. Appl. No. 12/268,957, dated Sep. 13, 2013.
Office Action from U.S. Appl. No. 12/643,670, dated Jun. 25, 2013.
Office Action from U.S. Appl. No. 13/177,415, dated Oct. 7, 2013.
Third Office Action and Search Report from Chinese Patent Appl. No. 2009801142352.8, dated Nov. 26, 2013.
Notice of Reasons for Rejection from Japanese Patent Appl. No. 2012-544480, dated Oct. 29, 2013.
Office Action from U.S. Appl. No. 11/982,276, dated Oct. 25, 2013.
Office Action from U.S. Appl. No. 13/971,547, dated Nov. 6, 2013.
Third Office Action from Chinese Appl. No. 200980125251.X, dated Oct. 31, 2014.
Pretrial Report from Japanese Appl. No. 2011-533175, dated Oct. 8, 2014.
Office Action from Taiwanese Patent Appl. No. 099105210, dated Oct. 20, 2014.
Reexamination Report from Japanese Appl. No. 2007-228699, dated Nov. 7, 2014.
Appeal Decision from Japanese Appl. No. 2013-12017, dated Nov. 25, 2014.
Reasons for Rejection from Japanese Appl. No. 2013-064671, dated Nov. 18, 2014.
International Preliminary Report from Appl. No. PCT/US2013/038391, dated Nov. 25, 2014.
Office Action from U.S. Appl. No. 12/156,995, dated Sep. 26, 2014.
Response to OA from U.S. Appl. No. 12/156,995, filed Nov. 19, 2014.
Office Action from U.S. Appl. No. 12/643,670, dated Oct. 15, 2014.
Office Action from U.S. Appl. No. 11/982,276, dated Oct. 23, 2014.
Office Action from U.S. Appl. No. 12/288,957, dated Nov. 19, 2014.
Office Action from U.S. Appl. No. 12/156,995, dated Dec. 8, 2014.
Office Action from U.S. Appl. No. 12/629,735, dated Dec. 18, 2014.
Office Action from U.S. Appl. No. 13/177,415, dated Jan. 8, 2015.
Office Action from U.S. Appl. No. 12/288,957, dated Feb. 5, 2015.
Fifth Office Action from Chinese Appl. No. 2009801423528, dated Dec. 31, 2014.
Second Office Action from Chinese Appl. No. 201080062058.9, dated Dec. 31, 2014.
Final Notice for Reasons for Rejection from Japanese Patent appl. No. 2013-064671, dated Jun. 2, 2015 (translations).
Decision of Rejection from Chinese Patent Appl. No. 200980142352.8, dated Jul. 14, 2015.
Office Action from U.S. Appl. No. 13/177,415, dated Jun. 18, 2015.
Response to OA from U.S. Appl. No. 13/177,415, filed Aug. 17, 2015.
Office Action from U.S. Appl. No. 12/629,735, dated Jul. 15, 2015.
Office Action from U.S. Appl. No. 12/288,957, dated Jul. 30, 2015.
Office Action from U.S. Appl. No. 11/982,276, dated Apr. 16, 2015.
Office Action from U.S. Appl. No. 12/643,670, dated Apr. 24, 2015.
Office Action from U.S. Appl. No. 12/156,995, dated May 5, 2015.
Office Action from Japanese Patent Appl. No. 2011-533175, dated Apr. 28, 2015.
Office Action from Taiwanese Patent Appl. No. 099145035, dated Apr. 24, 2015.
Summons to attend oral hearing from European Appl. No. 10757645.6-1802, dated Apr. 30, 2015.
Office Action from Japanese Appl. No. 2013-064671, dated Jun. 2, 2015.
Office Action from Taiwanese Appl. No. 098109421, dated Apr. 22, 2015.
Decision of Rejection and Non Acceptance of Amendment from Japanese Patent Appl. No. 2012-544480, dated May 12, 2015.
Office Action from U.S. Appl. No. 12/156,995, dated Sep. 4, 2015.
Office Action from U.S. Appl. No. 13/177,415, dated Oct. 16, 2015.
Office Action for Japanese Application No. 2007-228699; Dated Apr. 1, 2016.
Sixth Office Action for Chinese Application No. 2009801423528, Dated Apr. 1, 2016.
Notice of Allowance for Application No. 10757645.6; Dated Apr. 15, 2016.
Decision of Grant for Application No. 2012-544480; Dated May 31, 2016.
Notice of Issuance for Chinese Application No. 20098012544, Dated Jun. 16, 2016.
Notification of Reexamination from Chinese Patent Appl. No. 200980125244X, dated Oct. 15, 2015.
Notification of Filing Receipt (Reexamination) from Chinese Patent Appl. No. 200980142352.8, dated Nov. 10, 2015.
Trial Decision from Japanese Patent Appl. No. 2011-533175, dated Oct. 27, 2015.
Decision to Refuse a European Patent Application, European Patent Appl. No. 10757645.6, dated Oct. 27, 2015.
Decision of Reexamination from Chinese Patent Appl. No. 200980142352.8, dated Dec. 2, 2015.
Office Action from U.S. Appl. No. 11/982,276; Dated Aug. 18, 2016.
Office Action from U.S. Appl. No. 12/156,995; Dated Aug. 23, 2016.
Office Action from Chinese Patent Application No. 2009801423528; Dated Sep. 21, 2016.
Office Action from European Patent Application No. 11748482.4 Dated Oct. 18, 2016.
Decision of Rejection from Japanese Patent Appl. No. 2013-064671, dated Dec. 28, 2015.
Examination Report from European Patent appl. No. 11 748 482.4-1757, dated Nov. 16, 2015.
Office Action from Korean Appl. No. 10-2011-7000240, dated Feb. 17, 2015.
Office Action from Taiwanese Appl. No. 098136067, dated Jan. 21, 2015.
First Office Action and Search Report from Chinese Appl. No. 2011800428038, dated Jan. 21, 2015.
First Office Action from Chinese Patent Appl. No. 201210492856.6, dated Jan. 5, 2015.
Notification of Reexamination from Chinese Patent Appl. No. 200980125244X, dated Mar. 2, 2015.

(56) References Cited

OTHER PUBLICATIONS

Office Action from Korean Patent Appl. No. 10-2010-7028850, dated Feb. 17, 2015.
Office Action from U.S. Appl. No. 11/982,276; dated Feb. 4, 2016.
Office Action from U.S. Appl. No. 12/156,995; dated Feb. 16, 2016.
Office Action for U.S. Appl. No. 12/156,995; dated Dec. 23, 2017.
Official Decision for Japanese Patent Appl. No. 2007-228699; dated Jan. 20, 2017.

* cited by examiner

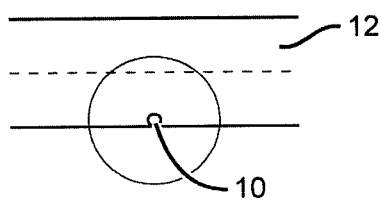
FIG. 1A
PRIOR ART
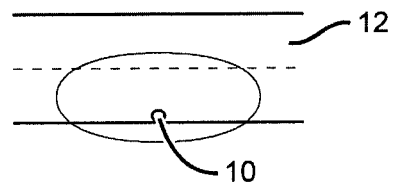
FIG. 1B
PRIOR ART
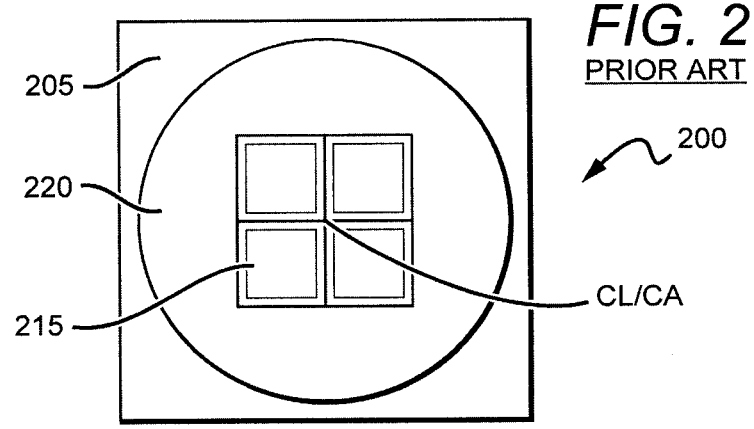
FIG. 2
PRIOR ART
FIG. 3
PRIOR ART
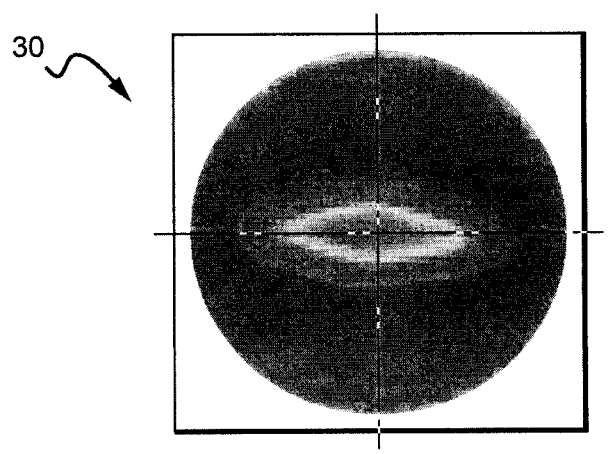

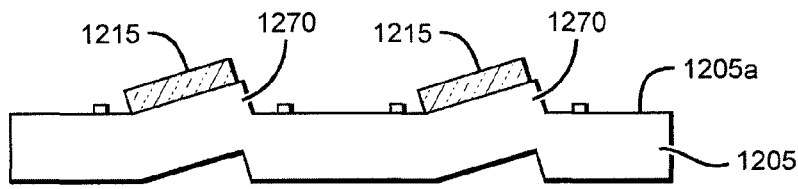
FIG. 12B
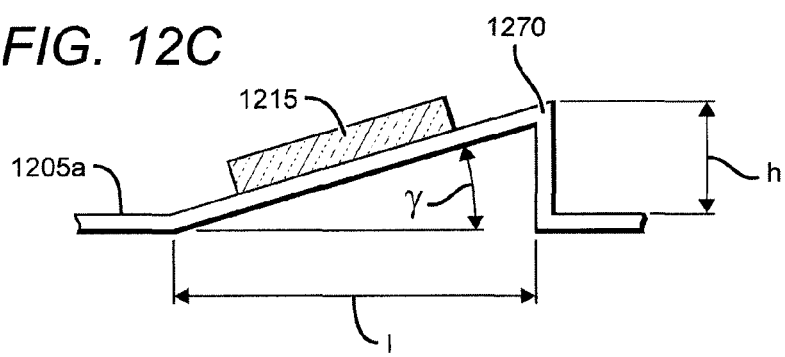
FIG. 12C
FIG. 13A
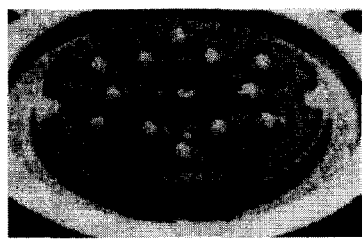
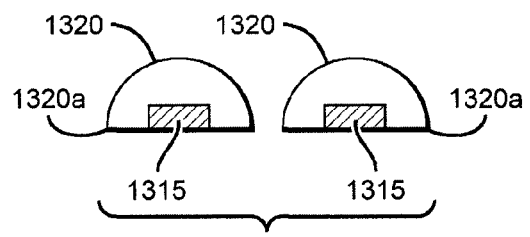
FIG. 13C
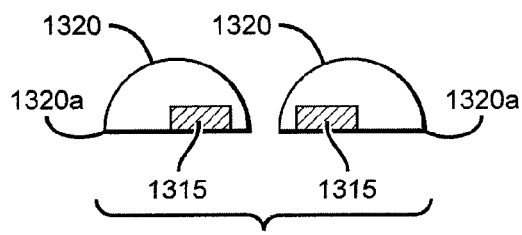
FIG. 13D
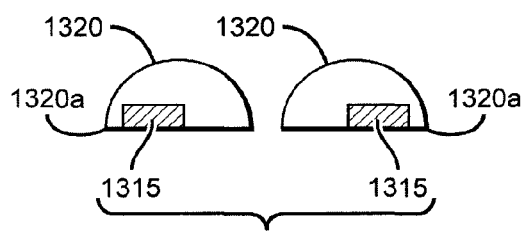
FIG. 13E

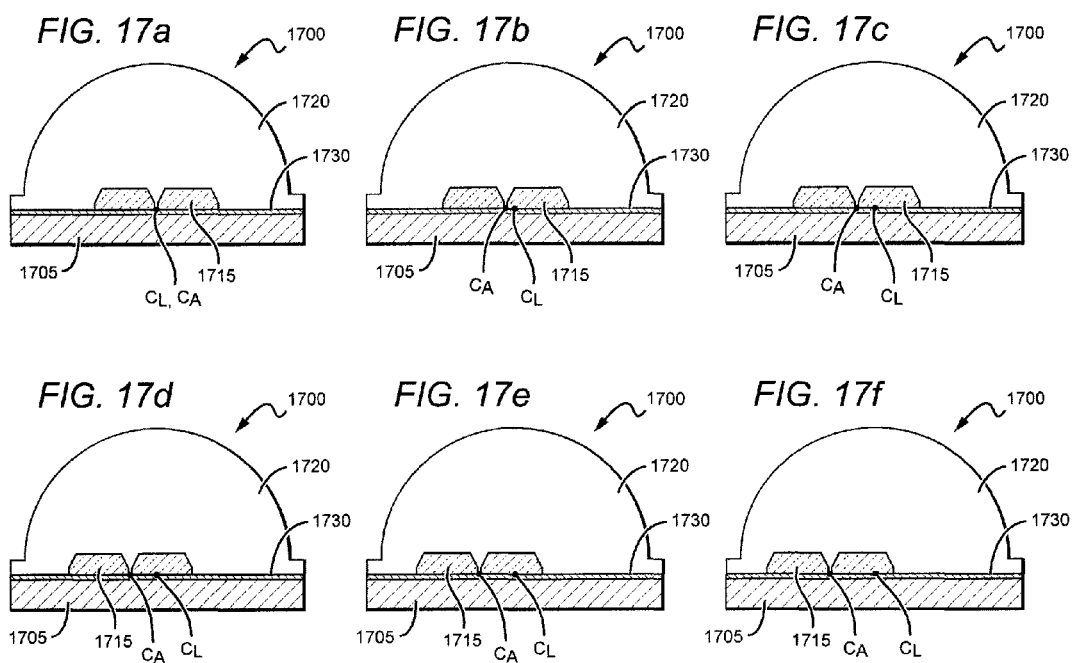

$C_L, C_A$ $C_A \quad C_L$ $C_A \quad C_L$ $C_A \quad C_L$ $C_A \quad C_L$ $C_A \quad C_L$

| Offset | Emission | Emission in % of 0 Degrees | Tilt Angle |
|--------|----------|----------------------------|------------|
| 0      | 359.029  | 100                        | 0          |
| 150    | 359.467  | 100.1219957                | 3.7        |
| 300    | 356.525  | 99.3025633                 | 7          |
| 450    | 356.107  | 99.18613817                | 9.7        |
| 600    | 351.597  | 97.92997223                | 11.2       |
| 750    | 345.244  | 96.16047729                | 13.75      |
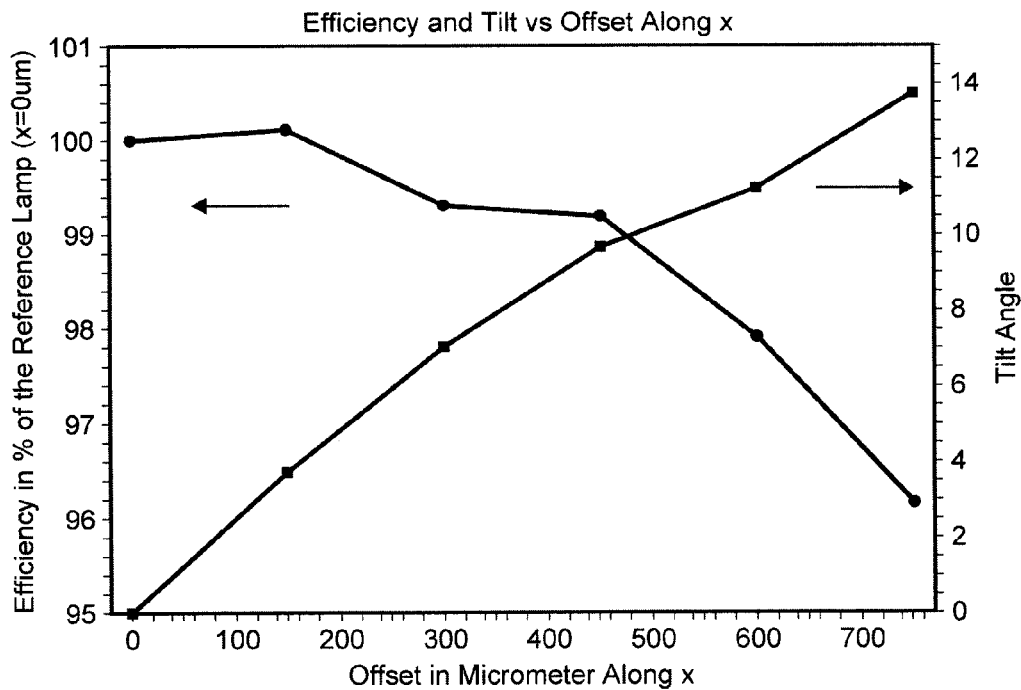
FIG. 22a
FIG. 22b
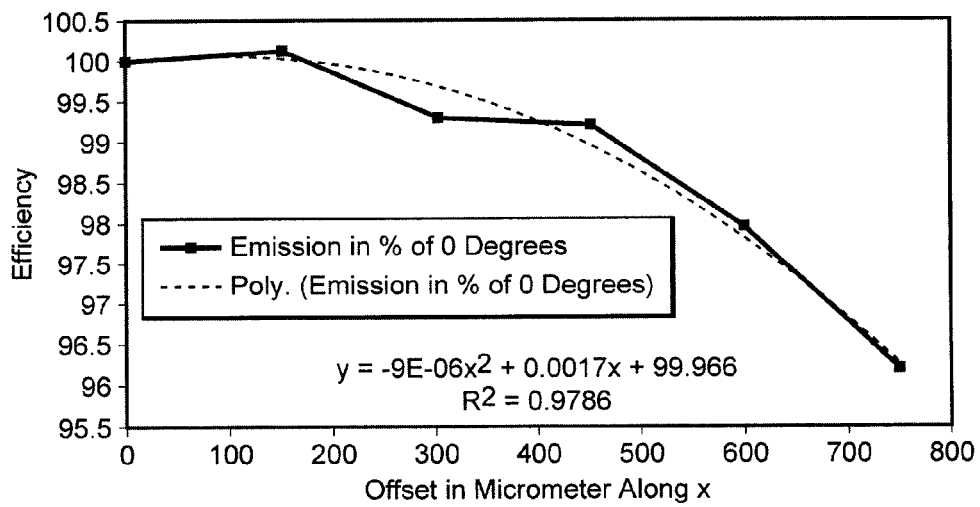
$y = -9E-06x^2 + 0.0017x + 99.966$
$R^2 = 0.9786$

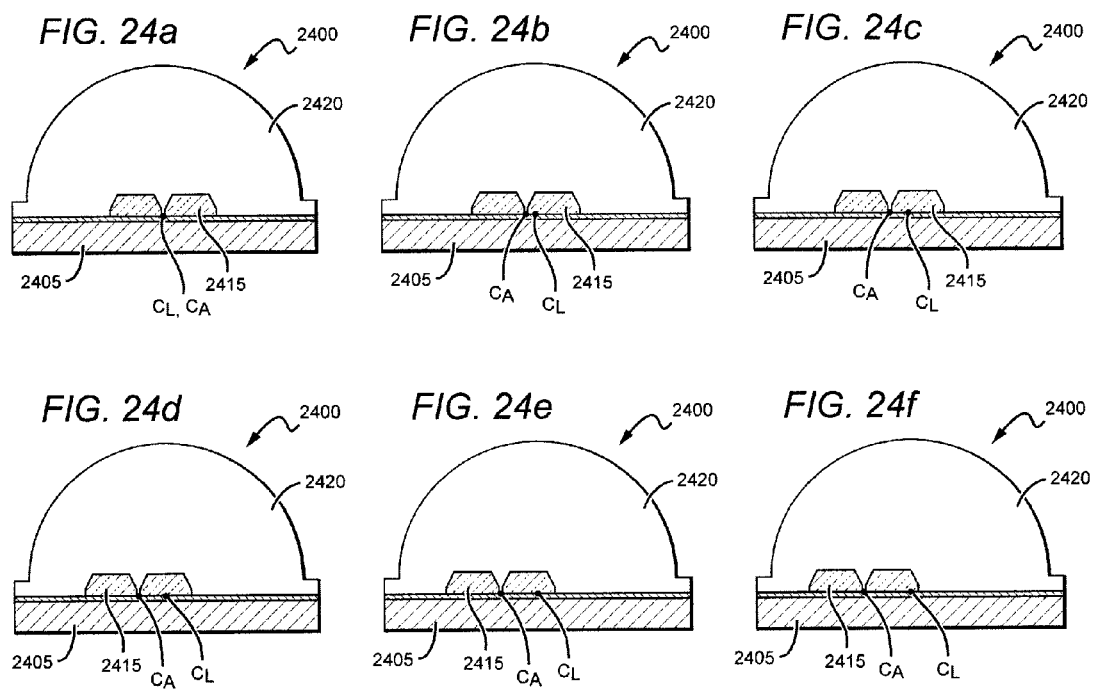

| Offset | X-over-D | 850 - Max Angle | 1000 - Max Angle |
|---|---|---|---|
| 0 | 0 | 0 | 0 |
| 0.033 | 0.033 | 3.5 | 4 |
| 0.066 | 0.066 | 9 | 7 |
| 0.1 | 0.1 |  | 10 |
| 0.13 | 0.13 | 17 | 11 |
| 0.17 | 0.17 | 20 | 14 |

| X-over-D for EZ | EZ1400 - Max Angle | EZ1000 - Max Angle |
|---|---|---|
| 0.095 | 9.9 | 17.4 |

| Offset | X-over-D | 850 - Max Angle | 1000 - Max Angle |
|---|---|---|---|
| 0 | 0 | 0 | 0 |
| 0.033 | 0.033 | 3.5 | 4 |
| 0.066 | 0.066 | 9 | 7 |
| 0.13 | 0.13 | 17 | 11 |
| 0.17 | 0.17 | 20 | 14 |

TILTED EMISSION LED ARRAY

This application claims the benefit of U.S. Provisional Application Ser. No. 61/650,659, filed on 23 May 2012, and is a continuation in part of and claims the benefit of U.S. patent application Ser. No. 13/021,496, entitled "Light-Emitting Diode Component", filed on Feb. 4, 2011, U.S. patent application Ser. No. 13/441,540, entitled "Multi-Lens LED-Array Optic System", filed on Apr. 6, 2012, and U.S. patent application Ser. No. 13/441,558, entitled "LED-Array Light Source With Aspect Ratio Greater Than 1", filed on Apr. 6, 2012.

BACKGROUND OF THE INVENTION

Field of the Invention

The present disclosure is directed generally to light emitting diodes (LEDs) and more particularly to LED components that can produce a desired light emission profile and these components within a system.

Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Technological advances over the last decade or more have resulted in LEDs having a smaller footprint, increased emitting efficiency, and reduced cost. LEDs also have an increased operation lifetime compared to other light emitters. For example, the operational lifetime of an LED can be over 50,000 hours, while the operational lifetime of an incandescent bulb is approximately 2,000 hours. LEDs can also be more robust than other light sources and can consume less power. For these and other reasons, LEDs are becoming more popular and are being used in applications that have traditionally been the realm of incandescent, fluorescent, halogen and other emitters. Indeed, lighting applications which previously had typically been served by fixtures using what are known as high intensity discharge (HID) lamps are now being served by LED lighting fixtures. Such lighting applications include, among a good many others, roadway lighting, factory lighting, parking lot lighting, and commercial building lighting.

In many of such products, achieving high levels of illumination over large areas with specific light-distribution requirements is particularly important. One example is fixtures for roadway lighting, an application in which the fixtures are generally placed along roadway edges while light distribution is desired along a significant portion of roadway length and, of course, on the roadway itself—generally to the exclusion of significant light off the roadway. And in such situations it is desirable to minimize the use of large complex reflectors and/or varying orientations of multiple light sources to achieve desired illumination patterns.

LEDs are also being used in displays, both big and small. Large screen LED based displays (often referred to as giant screens) are becoming more common in many indoor and outdoor locations, such as at sporting events, race tracks, concerts and in large public areas, such as Times Square in New York City.

Additionally, LEDs are being used in a variety of lighting applications. Some lighting applications require uniform ambient lighting, whereas others require particular beam shapes, emission profiles, or intensity levels. One example of such a use includes street lighting, which requires uniform light output of a particular intensity in a particular beam shape to allow for illumination of only a particular area.

Present technology utilizes optics and geometries that maximize light extraction from the LED to obtain uniform emission profiles. This usually entails a hemispherical lens coupled to a light emitting element where the optical centers of the lens and the emitting surface are perfectly aligned, and the peak light emission is along the optical axis. However, such a configuration may not be advantageous for all situations, such as when an LED display is mounted above the viewer's eye level or a directed lighting pattern is required, for example in street lighting.

Referring now to FIGS. 1A and 1B, exemplary LED downlights 10 are shown mounted at an elevated point above a street 12, functioning as a street light. The street 12 area to be lit is typically positioned below the downlight 10 and is at an angle with respect to the downlight's emission direction, which is perpendicular to the downlight surface. When light emission is required at an angle other than the center, as shown in FIG. 1A, light is wasted because secondary optics must be used to redirect the light and secondary optics cause some percentage of loss. FIG. 1A shows unmodified emission pattern. FIG. 1B shows a modified emission pattern using secondary optics. The LED downlight street light as shown in FIG. 1A includes a plurality of emitters, such as an LED package, which may include an LED mounted within the street light housing. Secondary optics must be placed over these LED packages to modify the emission pattern from that shown in FIG. 1A to the pattern shown in FIG. 1B. FIG. 2 shows an exemplary LED package 200, which may be used in the street lights of FIGS. 1A-1B. The LED package 200 includes an array of LED chips 215 on a substrate 205, with a lens 200. As shown, the center CA of the array of LED chips 215 is aligned with the center CL of the lens 220. The peak emission for the LED package 200 is along the package's longitudinal axis. FIG. 3 is a polar iso-candelar graph 30 for the LED package 200, showing the peak emission along the emitter's longitudinal axis.

FIG. 1A shows a light fixture 10 comprising a plurality of LED packages 200 emitting with characteristics that display a peak emission directed along a perpendicular direction. The intensity profile (Iv) and far field pattern (FFP) peak emission characteristics for the downlight 10 are also perpendicular to the fixture along the perpendicular axis.

One way to reduce the amount of light that is wasted is by mounting the light emitters at an angle to better match the desired illumination area or viewer's line of sight, but this can require complex and expensive mounting configurations or hardware that is difficult to use. Efforts have also been made to control the light emission from LED packages by modifying the shape of the encapsulant or lens, but this may require special, costly lens tooling and complex lens fabrication processes. Some systems may utilize secondary optics to alter beam profiles or redirect light patterns to different angles; however, the secondary optics may cause significant losses on the order of 10-12% and add cost to the display system.

SUMMARY OF THE INVENTION

The present invention is directed to LED components with primary optics providing improved emission characteristics. The present invention is also directed to light fixtures utilizing the LED components to provide improved light fixture emissions.

One configuration describes, a light emitting diode (LED) component system comprising a housing and a plurality of LED components within the housing, such that light emitted from the housing has a peak emission shifted from a perpendicular centerline of the housing. Each of the plurality of LED components comprises at least one LED chip on a mounting surface and an optical lens overlying the LED chip and having a lens base attached to the mounting surface. The LED chips are positioned to provide a peak emission shifted from a perpendicular centerline of the lens base.

Another configuration includes, a light emitting diode (LED) component system comprising a housing and a mounting board within the housing. The system further includes a plurality of LED components on the mounting board, such that light emitted from the housing has a peak emission shifted from a perpendicular centerline of the housing. Each of the plurality of LED components comprises at least one LED chip on the mounting board and an optical lens overlying at least one LED chip. The optical lens has a lens base on a side of the lens adjacent to at least one LED chip.

These and other aspects and advantages of the invention will become apparent from the following detailed description and the accompanying drawings, which illustrate by way of example the features of the invention.

BRIEF DESCRIPTION OF THE DRAWINGS

FIG. 1A is a top view of a prior art overhead street light and emission pattern on a street;

FIG. 1B is a top view of another prior art overhead street light downlight and a modified emission pattern on a street;

FIG. 2 is a top view of a LED Package;

FIG. 3 is polar iso-candelar graph showing the light emission characteristics of the LED package in FIG. 2;

FIGS. 12A-12C are schematics showing how a stamping process may be applied directly to a submount to create angled protrusions and depressions in the frontside and backside surfaces of the submount;

FIG. 13A is a photograph of an exemplary LED component that includes 12 LEDs, each with its own hemispherical lens;

FIGS. 13C-13E show an LED chip at the optical center of a hemispherical lens (FIG. 13C); an LED chip offset radially inward (FIG. 13D); and an LED chip offset radially outward (FIG. 13E);

FIGS. 17A-F are cross-sectional views of an LED component showing a range of progressively larger offsets between the center CA of the plurality of LED chips and the center CL of the lens base;

FIG. 22A is a graph with associated table of points demonstrating the relationship between efficiency and tilt of an LED component in relation to the offset size;

FIG. 22B is a graph and associated equation for such a graph demonstrating the relationship between efficiency and offset of the light emitter;

FIGS. 24A-F are cross-sectional views of the LED component of FIG. 23 showing a range of progressively larger offsets between the center CA of the plurality of LED chips and the center CL of the lens base;

DETAILED DESCRIPTION OF THE INVENTION

Figure 4A:
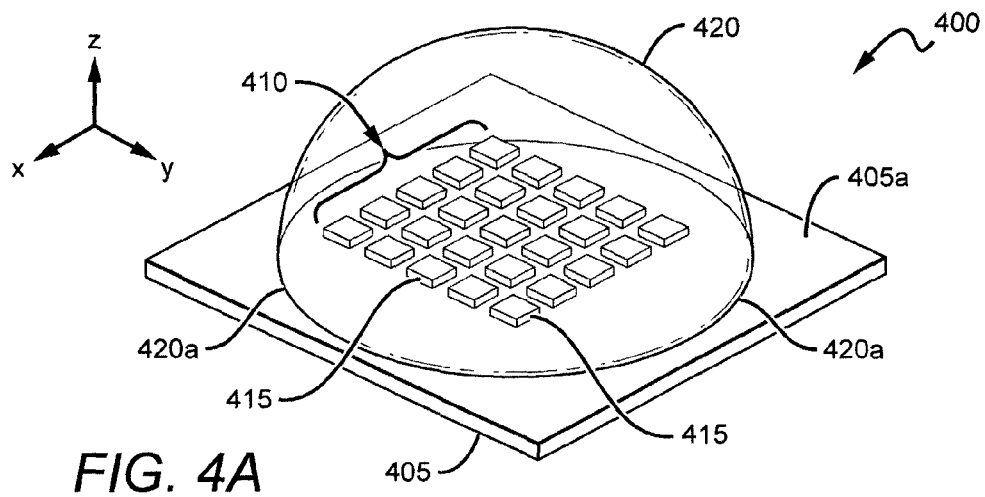
FIG. 4A is a perspective view of an exemplary LED component including an array of LED chips on a monolithic substrate with a single overlying lens.

The present disclosure is directed to LED components, and systems using such components, having a light emission profile that may be controlled independently of the lens shape by varying the position and/or orientation of LED chips with respect to one or both of an overlying lens and the surface of the component. For example, the optical centers of the LED emitting surface and the lens, which are normally aligned, may be offset from each other to generate a controlled, predictable emission profile.

The LED components include an array of LED chips disposed on a surface of a substrate or submount, where the LED chips are positioned to provide the desired light emission profile. In one configuration, the array of LED chips may be positioned off-center with respect to an overlying lens in order to shift the peak emission characteristics away from the perpendicular centerline. One or more of the LED chips may also or alternatively be mounted at an angle with respect to the surface of the substrate to alter the peak emission. Such LED components may be used alone or in combination with other components to form a light emission system that has a desirable set of emission characteristics.

Embodiments of the present invention are generally directed to LED components having primary optics and chip placement within the LED component that make the LED components more compatible with directed emission light. Embodiments of the present invention utilize custom placement of LED components within a primary optical element and, in some configurations, primary optical elements as part of an LED package component, which shape the angular distribution of the light emitted by the package into a desired profile. Specifically, different configurations can allow for the distribution of emitted light into angles typically not achieved with standard primary optical elements (which typically produce Lambertian or cosine-like beam profiles). Many applications, such as backlighting and downlighting, benefit from the spreading or directing of the Lambertian LED beam profile into higher angles, or to one side, to reduce pixilation, or undesirable near-field intensity and color variations across the emitting surface of the light. This in turn can result in improved far field distribution.

Embodiments of the present invention reduce or eliminate the need for secondary optical elements which can introduce efficiency loss and additional cost, while reducing overall lifetime and reliability. In cases where a secondary optical element is required, careful design of the primary optical element geometry can provide beneficial effects, such as reducing the cost and/or complexity of the secondary optic, increasing the overall system efficiency, and enabling a wider variety of achievable optical beam profiles than would be otherwise possible using only a standard primary optic.

Different embodiments of the present invention provide a variety of geometrical shapes for the primary LED package optical element, which differ significantly from standard hemispherical lens or flat lens encapsulation, thus providing custom light beam profile shaping. This beam shaping can be provided without the need for secondary optics, but it is understood that the LED packages according to embodiments of the present invention can also be used with secondary optics. The geometries of the primary optical elements are designed to allow for fabrication using conventional techniques, such as injection molding, compression molding, or dispense, for example. However, other more complex fabrication approaches may also be used.

As used in the present disclosure, the "perpendicular centerline" is generally defined with respect to the base of an overlying lens that is attached to the substrate of the LED component. The perpendicular centerline is positioned at the center of the lens base and extends from the surface of the substrate in a direction normal to the plane of the surface (the z-direction in the figures). In some applications in which an LED component is mounted above eye level, it may be advantageous to shift the peak emission of the component down with respect to the perpendicular centerline. Or if the component is mounted overhead, it may be advantageous to shift the light in one or more directions from the overhead light to evenly light a desired area. It is understood, however, that shifts of the peak emission may be in any direction—up, down, left, right, or directions in between, as discussed in more detail below.

Embodiments of the present invention can be used in many different lighting applications that would benefit from primary optic beam shaping. Applications include the use of embodiments of the present invention in systems, such as troffers to reduce the number of LED components (thereby reducing system cost) while avoiding pixilation (or non-uniform intensity and/or color variations) in the near field. Other potential applications include street lighting (downlighting), backlighting or any application in which it is desirable from an economic, efficiency and reliability standpoint to provide custom emission characteristics from LED components.

Some embodiments of the present invention are discussed with reference to direct emission light fixtures and light sources for use therein. Examples of direct light fixtures that could include LED components according to embodiments of the present invention, and where at least some light from the LED components emits directly from the fixture's emission surface, are shown and described in U.S. patent application Ser. No. 12/418,796, to Pickard et al., entitled "Reflector System for Lighting Device," which is commonly owned with the present application and incorporated by reference herein.

It is understood that embodiments of the present invention can also be directed to indirect light fixtures wherein light from the LED components can be reflected off one or more surfaces before exiting through the fixture's emission surface. Examples of indirect light fixtures that could incorporate LED components according to embodiments of the present invention are shown and described in U.S. patent application Ser. No. 12/418,796, to Pickard et al., entitled "Reflector System for Lighting Device," which is commonly owned with the present application and incorporated by reference herein. Other examples can comprise troffer-style indirect light fixtures, as shown and described in U.S. patent application Ser. No. 12/873,303, to Edmond et al., entitled "Troffer-Style Fixture," and U.S. patent application Ser. No. 13/429,080, to Edmond et al., entitled "Modular Indirect Troffer," both of which are commonly owned with the present application and incorporated by reference herein. Embodiments of the present invention can also be used with many different types of lighting fixtures and housings, but are particularly applicable to troffer-style fixtures of different sizes, such as those having a 2 ft by 4 ft troffer opening. Embodiments of the present invention can also be used in troffer-style fixtures having a 1 ft by 4 ft, or 2 ft by 2 ft opening, or openings having other dimensions.

It is further understood that LED components according to embodiments of the present invention can also be used for backlighting of displays, such as LCD displays, with the LED components utilized for edge lighting or direct lighting. The LED components can also be used as the light sources for LED lamps or LED bulbs, such as those described in U.S. patent application Ser. No. 13/028,946, to Long Larry Le et al., entitled "Solid State Lamp and Bulb," which is commonly owned with the present application and incorporated by reference herein.

The invention is described herein with reference to certain embodiments and configurations, but it is understood that the invention can be embodied in many different forms and should not be construed as limited to the embodiments or configurations set forth herein. In particular, embodiments of the present invention is described below in regards to downlight style light fixtures, but it is understood that it is applicable to many other lighting styles, types and applications. The embodiments are also described with reference to primary optics and LED chips, but it is understood that many different types and numbers of optics can be used that are arranged in many different ways. The fixtures can have LEDs or LED packages arranged in many different arrays having different shapes and different numbers of LEDs or LED packages. Many different commercially available LEDs can be used in the lighting fixtures according to embodiments of the present invention, such as those commercially available from Cree, Inc.

It is understood that when an element is referred to as being "on" another element, it can be directly on the other element or intervening elements may also be present. Furthermore, relative terms, such as "inner", "outer", "upper", "above", "lower", "beneath", and "below", and similar terms, may be used herein to describe a relationship of one element to another. It is understood that these terms are intended to encompass different orientations of the device, in addition to the orientation depicted in the figures.

Although the terms primary, secondary, etc., may be used herein to describe various features, elements, components, regions and/or sections, these elements, components, regions, and/or sections should not be limited by these terms. These terms are only used to distinguish one element, component, region, or section from another. Thus, unless expressly stated otherwise, a primary feature, element, component, region, or section discussed below could be termed a secondary feature, element, component, region, or section without departing from the teachings of the present invention.

As used herein, the term light source or LED component can be used to indicate a single light emitter or more than one light emitter functioning as a single source. Thus, the term "source" or "LED component" should not be construed as a limitation indicating either a single-element or a multi-element configuration unless clearly stated otherwise. For example, the LED components or lighting fixtures described herein can comprise light sources having a single-element or multi-element configuration.

Embodiments of the invention are described herein with reference to view illustrations. The actual thickness, angles or orientations of the elements can be different, and variations from the shapes of the illustrations as a result, for example, of manufacturing techniques and/or tolerances are expected. Thus, the elements illustrated in the figures are schematic in nature and their shapes are not intended to illustrate the precise shape of a region or feature of an embodiment and are not intended to limit the scope of the invention.

Figure 4B:
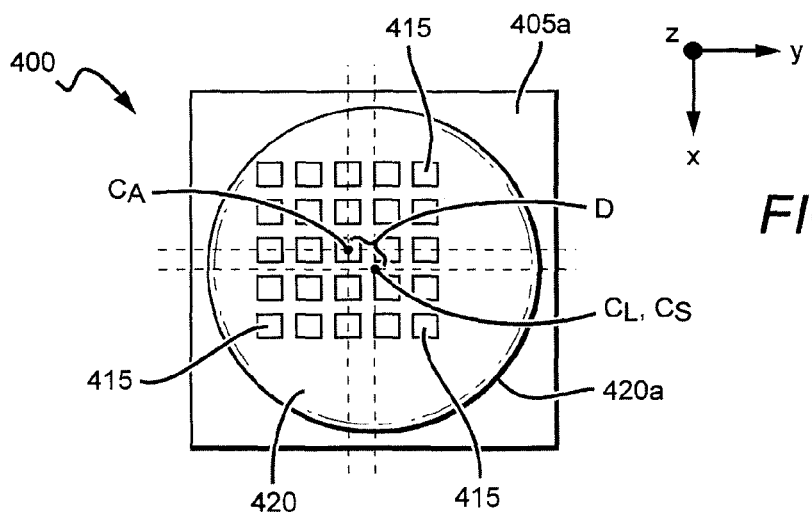
FIG. 4B is a top view of the LED component of FIG. 4A showing the offset between the center CA of the array of LED chips and the center CL of the lens base of the overlying lens.

Referring to FIGS. 4A and 4B, the LED component 400 includes a monolithic submount or substrate 405 having a surface 405a on which an array 410 of LED emitters or LED chips 415 is mounted. In this example, the array 410 is an ordered 5×5 array; other array sizes as well as disordered or aperiodic arrays are also possible. A center CA of the array 410 of LED chips 415 may be defined by the point of intersection of two lines that bisect the array 410 in the x-direction and the y-direction, respectively, as indicated in FIG. 4B.

The LED component 400 further includes an optical lens 420 that is attached to the surface 405a of the substrate 405 and overlies at least one of the LED chips 415 in the array 410. In this example, the lens 420 overlies all of the LED chips 415 in the array 410. (Alternatively, a plurality of lenses may be attached to the submount and may overlie individual LED chips, as discussed further below.) The lens 420 is designed to shape the emitted light beam as well as to provide environmental and/or mechanical protection for the LED chip(s). The lens 420 may have a hemispherical shape, as shown in FIG. 4A, or another symmetric or asymmetric shape, as shown for example in FIG. 16. Asymmetric lenses and the use of a plurality of lenses are shown and described in U.S. patent application Ser. No. 13/441,540, entitled "Multi-Lens LED-Array Optic System", to Wilcox et al., and U.S. patent application Ser. No. 13/441,558, entitled "LED-Array Light Source With Aspect Ratio Greater Than 1", to Wilcox et al., which are commonly owned with the present application and incorporated by reference herein.

The lens 420 has a lens base 420a that is attached (e.g., overmolded) to the submount 405. In this example, the lens 410 is directly attached to the submount 405; however, it is also possible for the lens to be indirectly attached to the submount by way of a connection to another object that is in turn attached to the submount. For example, the lens may be attached to a retaining ring that is in turn attached to the submount. A lens that is said to be "attached" to the submount or substrate may thus be directly or indirectly attached thereto. In other configurations, where a chip-on-board configuration is used, such that the LED chip is directly placed on a board (rather than also on a submount), the lens 420 is attached to this board. (See FIGS. 29 and 31).

A center CL of the lens base 420a may be defined by the point of intersection of two lines that bisect the lens base 420a in the x-direction and the y-direction, respectively, as indicated in FIG. 4B. The x- and y-directions lie in the plane of the substrate. Throughout the present patent document, where a "center" is designated for a given array or other object, the center is understood to be the point of intersection of two lines that bisect the array or other object in the x- and y-directions. Similarly, a center CS of the submount 405 may be defined by the point of intersection of two lines that bisect the surface 405a of the submount 405 in the x-direction and the y-direction, respectively. In FIG. 4B, the center CL of the lens base overlies the center CS of the submount. In this case, the center CS of the surface of the submount 405 corresponds to the physical center of the surface 405a of the submount 405. In another implementation, where the submount 405 may include additional (non-light emitting) components such as mounting pads along one side, the center CS may be defined to coincide with the center of the portion of the submount surface that does not include the additional components.

Traditionally, the lens is positioned on the submount, such that the center CL of the lens base is aligned with the center CA of the array. However, in order to provide a desired emission profile or peak emission shift, the center CA of the array 410 of LED chips 415 is displaced from the center CL of the lens base 420a, as shown in FIG. 4B. The offset or displacement D may be in the ±x-direction, the ±y-direction, or in a direction lying between the ±x-direction and the ±y-direction. The offset may be achieved during fabrication by positioning the array 410 of LED chips 415 on the surface 405a of the submount 405 such that the center CA of the array 410 is displaced from the center CS of the submount 405, and then centering the lens 420 on the submount, as shown in FIG. 4A-4B, or by centering the array of LED chips on the submount and then mounting the lens such that the center CL of the lens base is offset with respect to the center CA of the array (and the surface of the submount). The amount of the displacement D may depend on the size of the LED chips 415, the LED array 410, and/or the lens 420 as well as the desired shift in the peak emission, but typically lies between about 0.1 mm and 6.0 mm. The displacement D may also lie between about 0.1 mm and about 3.0 mm or between about 0.1 mm and about 1.0 mm.

FIGS. 17A-F are cross-sectional views of an LED component showing a range of progressively larger offsets between the center CA of the plurality or array of LED chips and the center CL of the lens base. FIG. 17A is a cross-sectional view of an LED component 1700 similar to the component shown in FIG. 2, such that it includes a lens 1720 and an array of LED chips 1715 arranged in a square at the center of the submount 1705 and lens base CL. The LED component 1700 of FIG. 17A also shows an exemplary converter layer 1730; however, it should be understood that a converter layer is not required and/or may be placed elsewhere. Though a hemispherical lens is shown here, it is understood that any type or shape of lens, including asymmetrical lenses may be used here. Furthermore, though an array of 4 LED chips 1715 is shown here, it is understood that arrays of any number of LED chips, including arrays forming different shapes, or even a singular LED chip may be used.

Figure 22C:
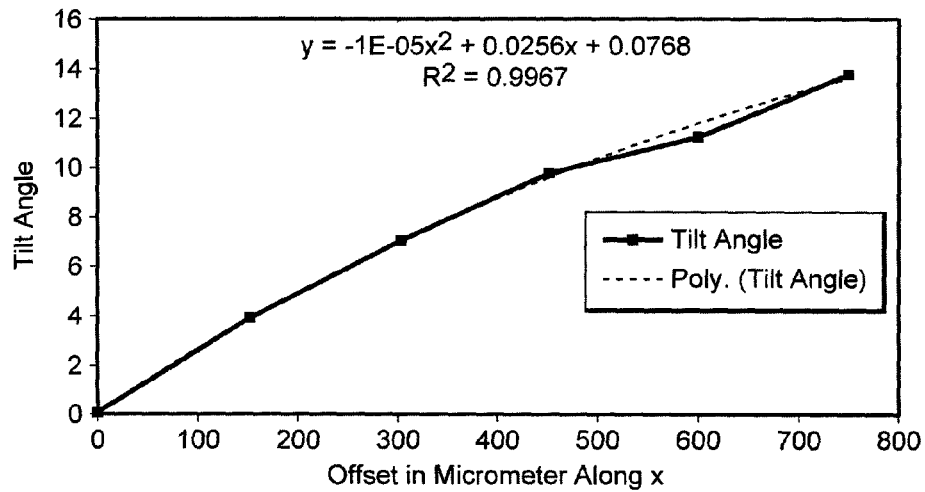
FIG. 22*c* is a graph and associated equation for such a graph demonstrating the relationship between tilt and offset of the light emitter.
Figure 35:
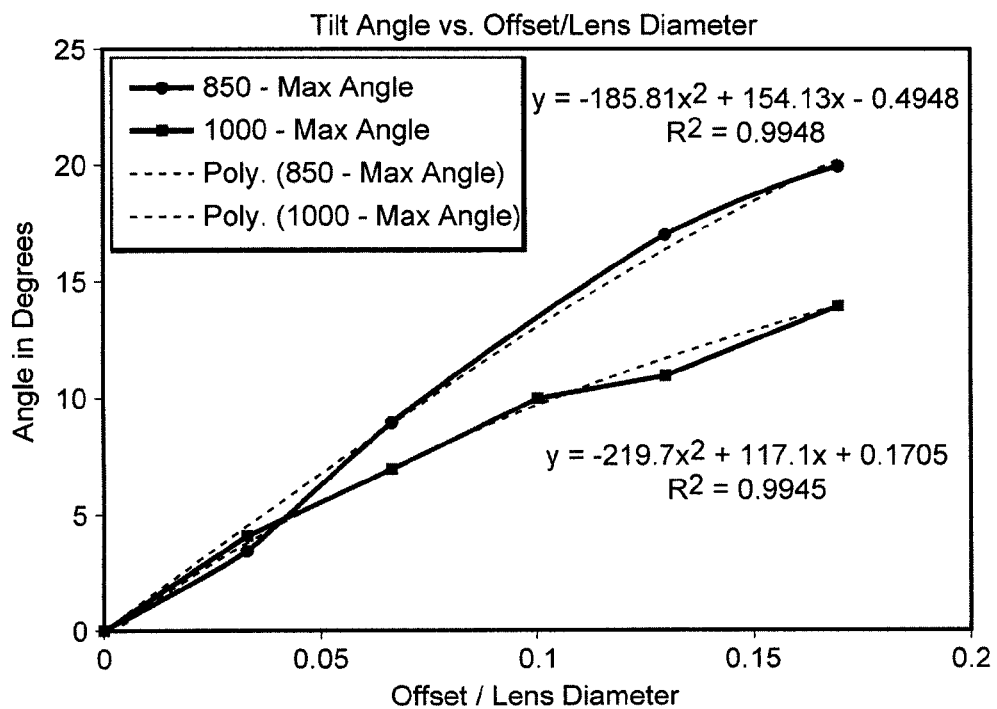
FIG. 35 is a graph and associated equation for such a graph demonstrating the relationship between tilt angle and offset over lens diameter of two light emitters with different widths.
Figure 36:
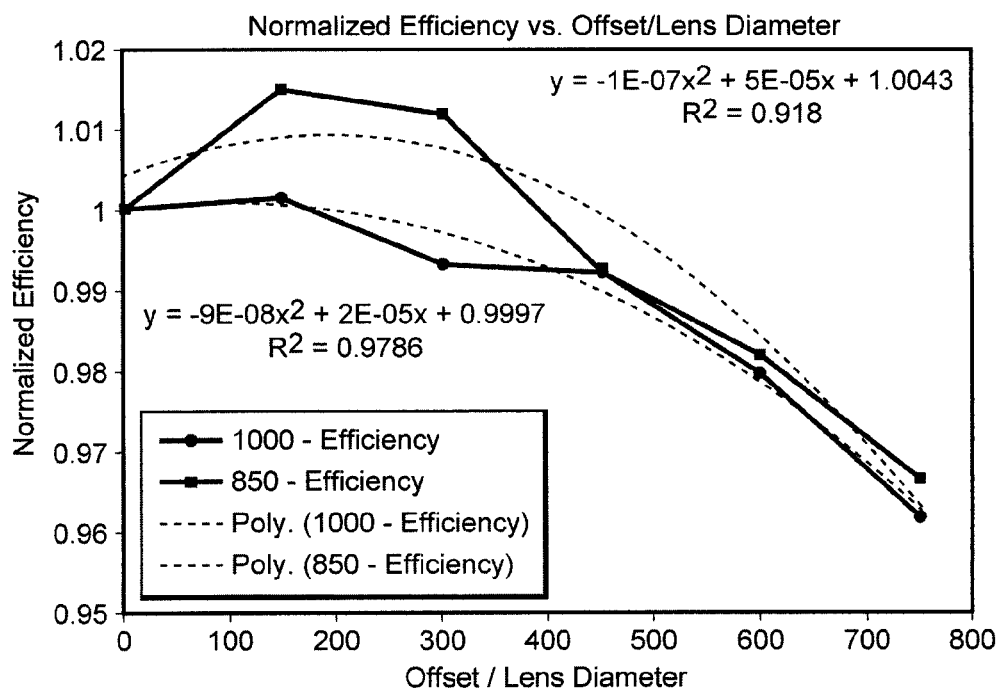
FIG. 36 is a graph and associated equation for such a graph demonstrating the relationship between normalized efficiency and offset over lens diameter of two light emitters with different widths.

FIGS. 17B-F show the LED component 1700 with varying arrangements such that the LED chip 1715 array is shifted progressively further from the center CL of the lens base. This is shown by the increased distance between the center CA of the LED chip 1715 array and the center CL of the lens 1720 base. In one particular example, the lens 1720 has a radius of 2.26 mm and each of the LED chips 1715 has a width of 1000 microns, with a space of 75 microns between each LED chip 1715. In this example, each of FIGS. 17A-F would show an additional offset of 150 microns. In such an example, the arrangements of each of the FIGS. 17A-F would result in a maximum emissions tilt angle of 0 degrees, 4 degrees, 7 degrees, 10 degrees, 11 degrees, and 14 degrees. These tilt angle emissions are shown in FIGS. 18A-22C. Though this example has been discussed in relation to an LED component and LED chips of certain dimensions, it should be understood that the results would be the same for any components and chips with proportional values. Furthermore, as shown in FIG. 22A, offsetting the LED chip array begins to impact emission efficiency after the offset places the LED chip array in a position, which causes a detrimental amount of TIR. Even when the proportional relationship between the LED chip or chip array size and lens size values may change, it can be expected that the same impact on efficiency is displayed due to the detrimental amount of TIR as the LED chip or chip arrays begin to approach the sides of the lens. This is demonstrated in the chart and equations shown in FIG. 36. The chart displays the relation of normalized efficiency vs. offset of the chip over lens diameter for two exemplary LED chip sizes. The first size, denoted by circular marks, are LEDs with a width of 1000 microns. The second set of data points, denoted by square marks, represent LEDs with a width of 850 microns. As shown in FIG. 35, though tilt angle increases in these packages with these LED chips or chip arrays, as the offset over lens diameter increases, the efficiency decreases as shown in FIG. 36. The showings of FIGS. 35 and 36 can be expected to be similar for packages with arrays of similar chips.

Each of the graphs in FIGS. 18A-20F and 22A-C show data demonstrating the emission tilt effects of the offset described above. Data shown in these and other various graphs regarding light intensity, efficiency and tilt vs. offset were produced by using LightTools ray tracing simulations. FIGS. 18A-F show graphs of the intensity slice data for each of the exemplary respective offset arrangements in FIGS. 17A-F. FIGS. 19A-F are graphs highlighting the maximum tilt intensity slice data, from FIGS. 18A-F, for each of the exemplary respective offset arrangements in FIGS. 17A-F. FIGS. 20A-F are graphs showing the normalized intensity slice data for each of the exemplary respective offset arrangements in FIGS. 17A-F. FIGS. 21A-F are side views of the LED components of FIGS. 17A-F demonstrating the impact of the LED chip array offset by ray tracing emissions from each of the exemplary respective offset arrangements in FIGS. 17A-F.

FIG. 22A is a graph demonstrating the relationship between efficiency and emission tilt of an LED component in relation to the offset size. FIGS. 22B and 22C show each of these separately and the associated equations describing the graph. As demonstrated, though tilt increases, the further the LED chip array is offset from the center CL of the lens base, the efficiency of the LED component also begins to decline after an amount of offset. This must be taken into consideration when using an offset to create emission tilt, as most lighting applications will want to maintain a certain amount of efficiency, such as greater than 90%, 95%, or any other chosen value. This limits the amount of tilt, which may be achieved by offsetting the array. However, as lens sizes and array sizes change, changing the proportional relationship between the two, the acceptable offset amount is also impacted.

For example, in some configurations, smaller LEDs or LED arrays may be shifted the same distance as larger ones, however, because the center of the smaller array is further from the center of the lens base, compared to the center of a larger sized array or chip, a higher degree of shift is accomplished. Therefore, it may be advantageous to use smaller sized LED arrays with equivalent outputs to achieve a higher shift or tilt. Though it may seem advantageous to maintain the LED chip or LED chip array size and instead use larger lenses, this may result in drawbacks, such as increased cost and larger overall package size limiting applicability.

In addition, emission tilt may also be achieved in directions other than the emission tilt caused by shifting of the LEDs, by employing LED arrays of different shapes. The impact of the shape of the LED array would function similarly to shifting of the LED as it would change the location of the origination of the light from the center of the lens to adjacent areas. Various examples of arrays of LEDs are shown and described in U.S. patent application Ser. No. 13/441,540 filed on Apr. 6, 2012, entitled "Multi-Lens LED-Array Optic System" and application Ser. No. 13/441,558 filed on Apr. 6, 2012, entitled "LED-Array Light Source With Aspect Ratio Greater Than 1", which are incorporated herein by reference. Also shown in FIGS. 32 and 34.

Figure 23:
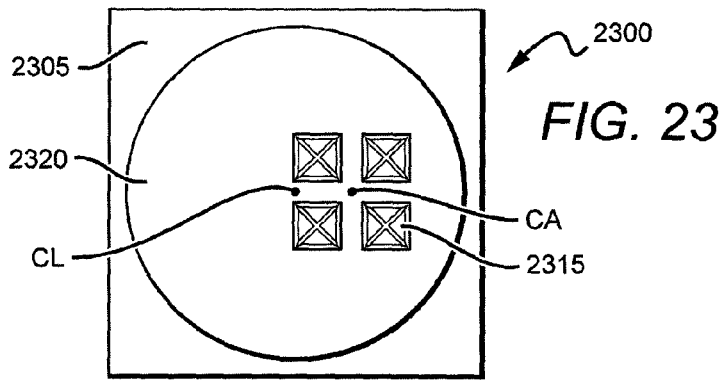
FIG. 23 shows another configuration of an LED component utilizing an offset to provide a tilted emission.

As discussed previously, in a configuration in which a smaller sized LED array is used with an equivalent sized lens, a higher shift or tilt in emission may be achieved. FIG. 23 shows another configuration of an LED component utilizing an offset to provide a tilted emission. The LED component 2300 of FIG. 23 is similar to that shown in FIGS. 17A-F, however, the LED chips 2315 and LED array have a smaller footprint, such that the proportions between the LED chip array and lens 2320 size are different than those of the LED component of FIGS. 17A-F. FIGS. 24A-F are cross-sectional views of the LED component 2400 of FIG. 23 showing a range of progressively larger offsets between the center CA of the plurality or array of LED chips and the center CL of the lens base, on submount 2305, 2405. The configuration shown in each of FIGS. 24A-F shows an additional stepped equal offset, for example 100 microns, 150 microns, or any other equally increased per step offset. FIGS. 25A-27F demonstrate the effect of offsetting a smaller chip array within a similarly sized lens 2420.

FIGS. 25A-F show graphs depicting the intensity slice data for each of the respective offsets in FIGS. 24A-F. The graphs of FIGS. 26A-F show the maximum tilt intensity slice data from FIGS. 25A-F for each of the respective offsets in FIGS. 24A-F. As shown, the maximum shift for each of the offsets shown in FIGS. 24A-F, beginning at no offset shown in FIG. 24A, are 0 degrees, 3.5 degrees, 9 degrees, 11 degrees, 17 degrees, and 20 degrees respectively. Therefore, the configuration of FIG. 24F, which is at the same offset distance as FIG. 17F, has a maximum tilt larger than that of the configuration of FIG. 17F. FIGS. 27A-F are graphs showing the normalized intensity slice data for each of the respective offsets in FIGS. 24A-F. As it can be seen, by these exemplary configurations, a smaller source size to lens diameter ration should increase the maximum achievable beam tilt. In addition, it should be noted that tilting or shifting can be achieved by offsetting without significantly increasing output at high angles. This is significant, as some applications may use secondary optics over these LED components and in many cases secondary optics cannot efficiently shape light emitted at high angles.

Figure 5A:
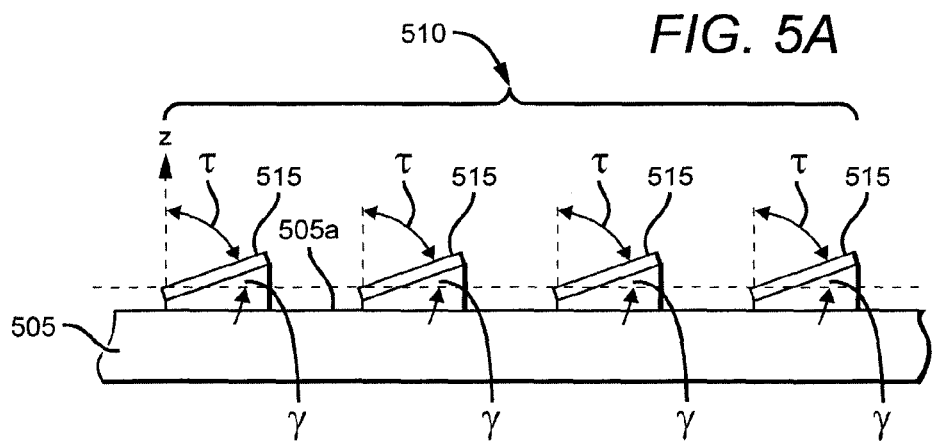
FIG. 5A is a cross-sectional view of a portion of an exemplary array of LED chips on a monolithic substrate where a plurality of the LED chips exhibit a tilt $\tau$ with respect to the perpendicular centerline.
Figure 5B:
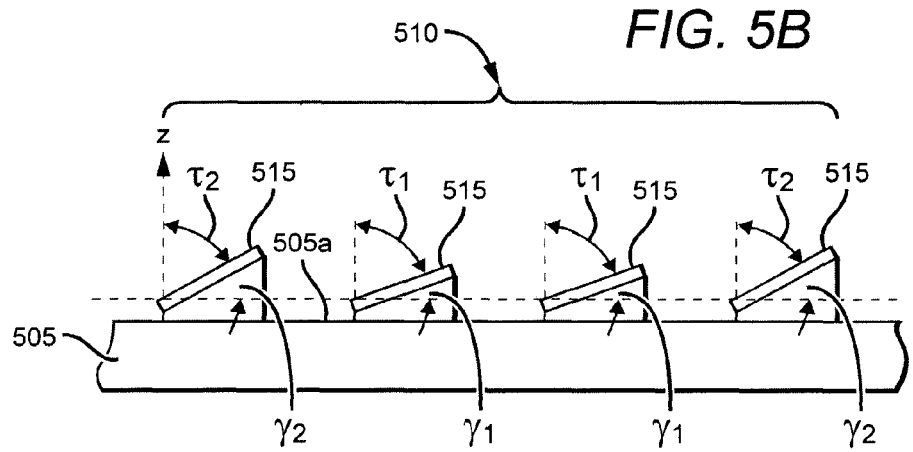
FIG. 5B is a cross-sectional view of a portion of another exemplary array of LED chips on a monolithic substrate where the LED chips exhibit different tilts $\tau 1$ and $\tau 2$.
Figure 10:
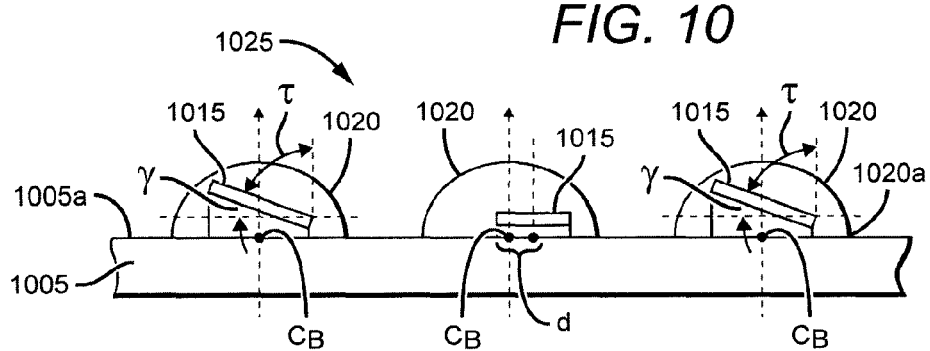
FIG. 10 is a cross-sectional view of a portion of an LED component including an array of LED chips with overlying lenses and a combination of tilts and displacements.

The emission profile may also be shifted off the centerline by tilting one or more of the LED chips on the submount. Referring to FIGS. 5A and 5B, one or more of the LED chips 515 in the array 510 may be mounted at an angle γ with respect to the surface 505a of the submount 505. FIG. 5A shows a cross-sectional side view of a portion of an exemplary submount 505 including LED chips 515 on its surface 505a. The LED chips 515 are part of an array 510 that is not shown in its entirety in this figure. The array 510 of LED chips 515 may include a single overlying lens, as shown in FIG. 4A, or a plurality of lenses, as shown in FIG. 10 and as discussed further below. The description that follows applies to both of these embodiments.

As shown in FIG. 5A, a plurality of the LED chips 515 in the array 510 may be mounted at a non-zero mounting angle γ with respect to the surface 505a of the submount 505, thereby exhibiting a tilt τ with respect to the centerline of the respective lens base. (The tilt and mounting angle are related as follows: τ=90°−γ, where γ is greater than 0° and thus τ is less than 90°.) It is assumed that the surface 505a is substantially planar, with the exception of any recessed or protruding features that may be formed on the surface 505a to mount the LED chips 515 at the desired mounting angle γ.

All or a portion of the LED chips in the array may exhibit the tilt τ with respect to the centerline. For example, from about 25% to about 75% of the LED chips in the array may be mounted at a non-zero mounting angle γ with respect to the surface, thereby including the tilt τ. The amount of the non-zero mounting angle γ may lie between about 5° and 35°, or between about 18° and 22°. Accordingly, the tilt τ may lie between about 55° and about 85°, or between about 68° and about 72°.

As indicated in FIG. 5A, the amount of the tilt τ may be the same for each LED chip 515, or, as shown schematically in FIG. 5B, the amount may be different for one or more of the LED chips 515 in the array 510. For example, a first portion of the LED chips 515 may exhibit a first tilt τ1 and a second portion of the LED chips 515 may exhibit a second tilt τ2, where the two different tilts τ1 and τ2 correspond to two different mounting angles γ1 and γ2, respectively, on the surface 505a of the submount 505. For any given array, there may be as many as n different tilts τ1, τ2, . . . τn and n different corresponding mounting angles γ1, γ2 . . . γn, where n is less than or equal to the number of LED chips in the array. It is also possible that none of the LED chips in the array includes a tilt τ; instead, displacements of the LED chips in the plane of the substrate may be relied upon to influence the emission profile.

Figure 6:
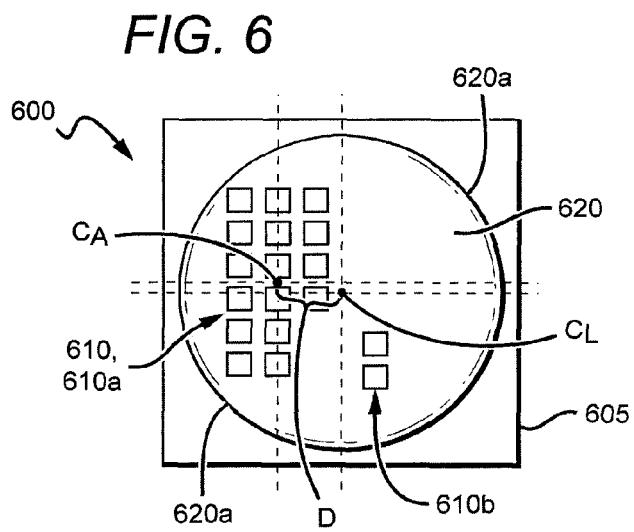
FIG. 6 is a top view of an exemplary LED component including an LED array having a subsection displaced to a different region of the substrate.

In another example of a possible displacement strategy, one or more of the LED chips in a given array may be displaced from the array to another location on the substrate. Referring to FIG. 6, the original array 610 may include a primary subsection 610a and a secondary subsection 610b, and the secondary subsection 610b of the array 610 may be displaced to another location on the submount 605. Such arrangements may have one or more effects on the emission profile of the LED component 600; for example, the peak emission of the LED array may be shifted and/or the intensity distribution of the LED array may be broadened compared to the original array. It may also be possible to obtain a multi-lobed emission profile. Referring again to FIG. 6, the original array 610 from which the subsection 610b is removed has a center CA that is offset with respect to the center CL of the lens base 620a of the overlying lens 620. It is also possible for the original array to be centered with respect to the lens base.

Figure 7:
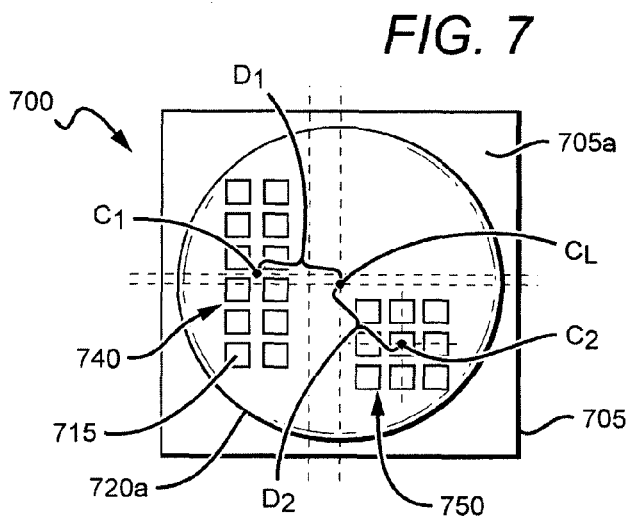
FIG. 7 is a top view of an exemplary LED component including two LED arrays, each array having a center displaced with respect to the center CL of the lens base.

In another example, the emission profile of the LED component 700 may be modified by including more than one array of LED chips on the submount (in different locations), where each array has a center that is offset with respect to the center of the lens base. FIG. 7 shows, for example, disposed on the surface 705a of a monolithic substrate 705, a 6×2 array 740 of LED chips 715 having a center C1 and a 3×3 array 750 of LED chips 715 having a center C2, where both the center C1 and the center C2 include an offset D1, D2, respectively, from the center CL of the lens base 720a. In this example, the offsets D1, D2 differ in both magnitude and direction. Alternatively, the offsets may differ in magnitude but not in direction, or they may differ in direction but not in magnitude.

The LED chips in the array may exhibit a combination of the tilts and displacements described above. For example, one or more of the LED chips shown in any of FIGS. 4A, 4B, 6 and 7 may include a tilt τ, where the tilt τ is as described above. It is also possible for all of the LED chips shown in any of these figures to include the tilt τ as described above. Similarly, the portions of the LED arrays 510 shown in FIGS. 5A and 5B, where the LED chips include a tilt τ, may further include displacements in the plane of the submount that are not apparent in FIGS. 5A and 5B.

As mentioned above, the LED component may include a plurality of optical lenses where each of the lenses overlies one or more of the LED chips in the array. There may be a total of n lenses, where n is equal to the number of LED chips in the array. Alternatively, and as discussed further below, the number of lenses n may be less than the number of LED chips in the array.

Figure 8A:
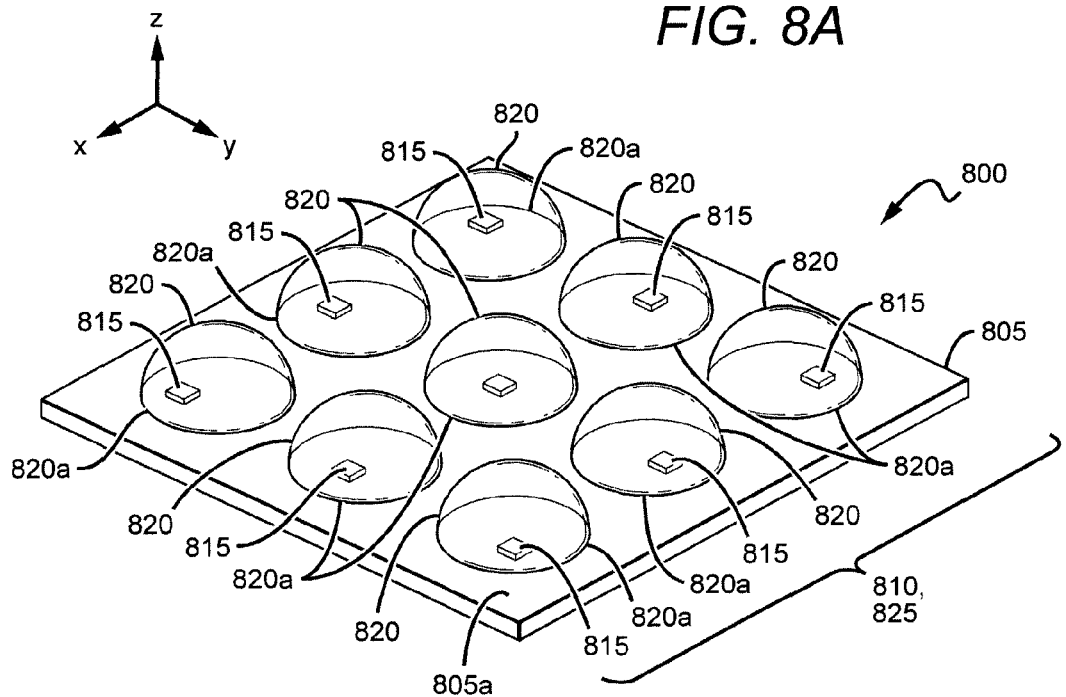
FIG. 8A is a perspective view of an exemplary LED component including an array of LED chips on a monolithic substrate where each LED chip includes an overlying lens.
Figure 8B:
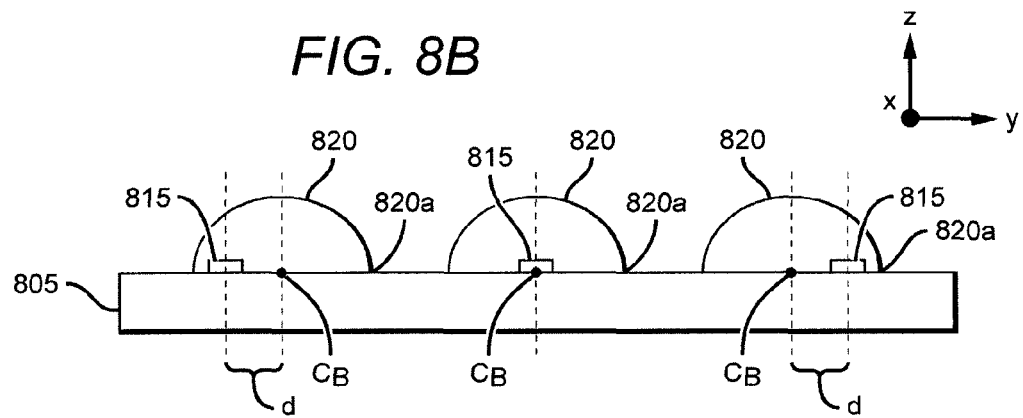
FIG. 8B is a cross-sectional view of the LED component of FIG. 8A.
Figure 16:
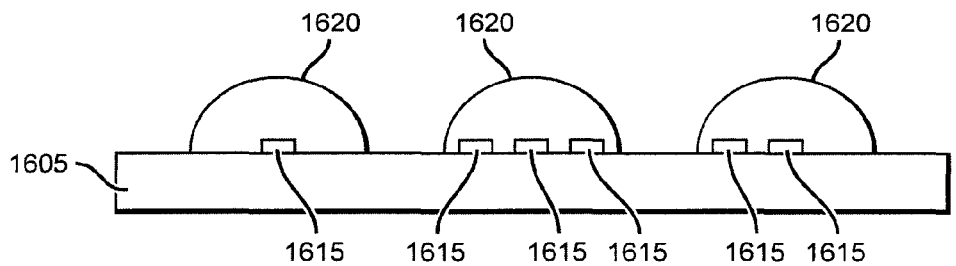
FIG. 16 a cross-sectional view of a portion of an LED component including an array of optical lenses where each lens overlies one or more LED chips, and further where some of the lenses have an asymmetric shape.
Figure 18A:
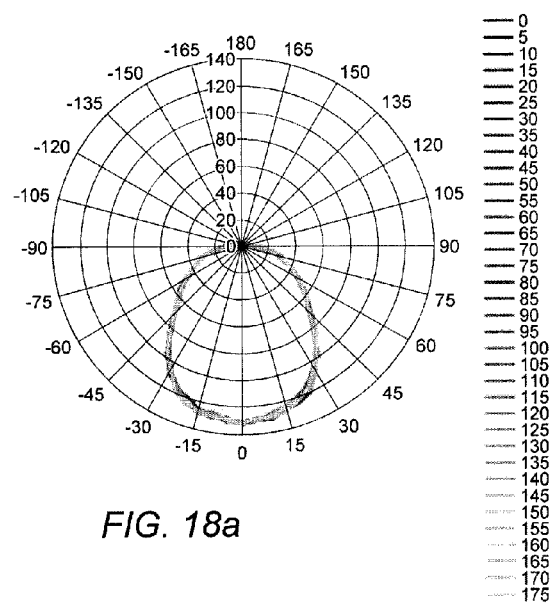
FIGS. 18A-F are graphs showing the intensity slice data for each of the respective offsets in FIGS. 17A-F.
Figure 18B:
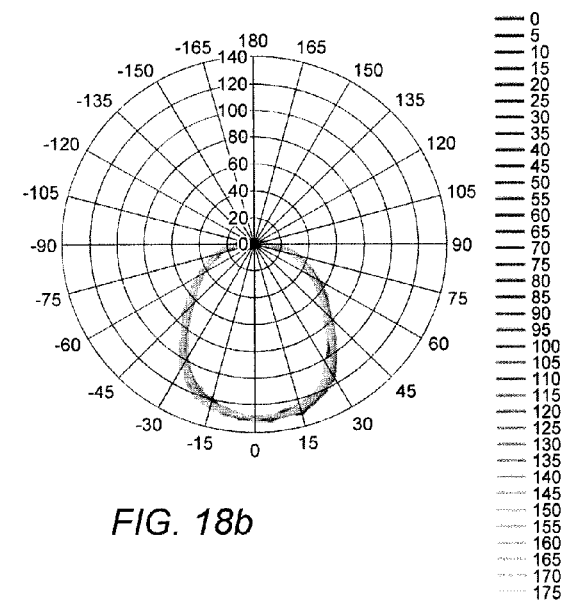
Figure 18C:
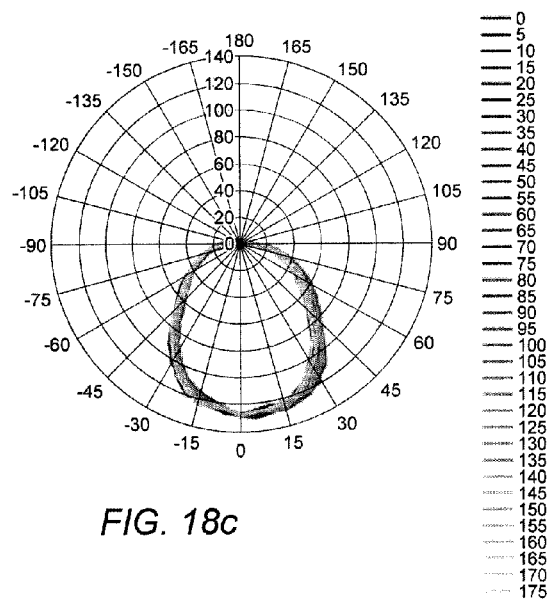
Figure 18D:
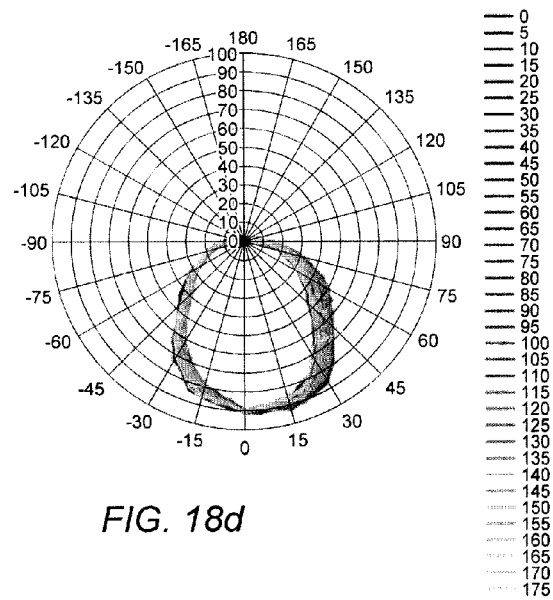
Figure 18E:
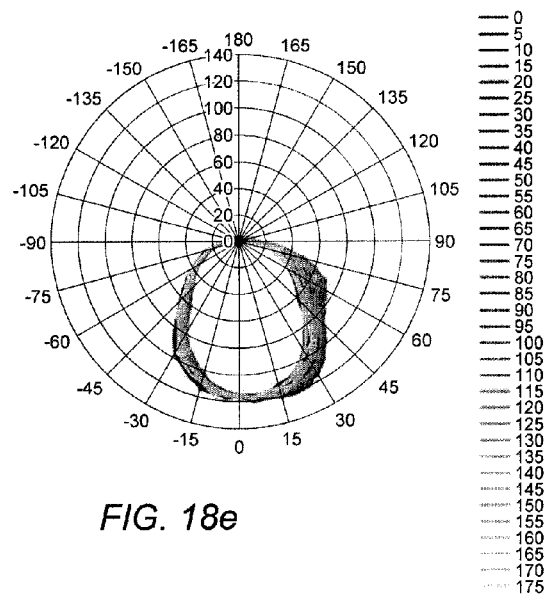
Figure 18F:
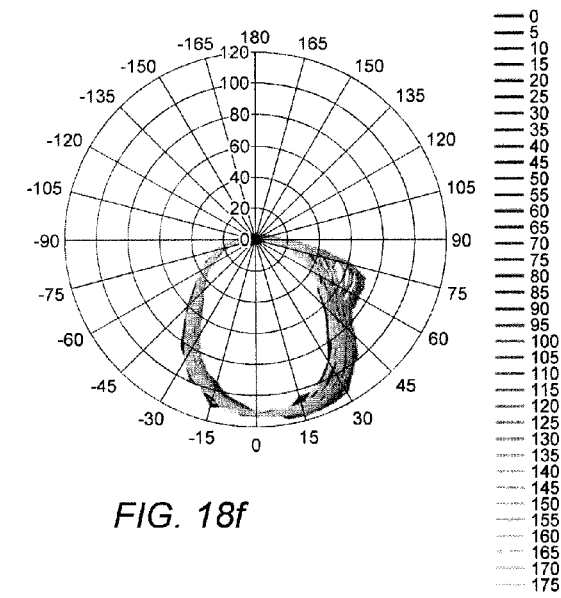
Figure 19A:
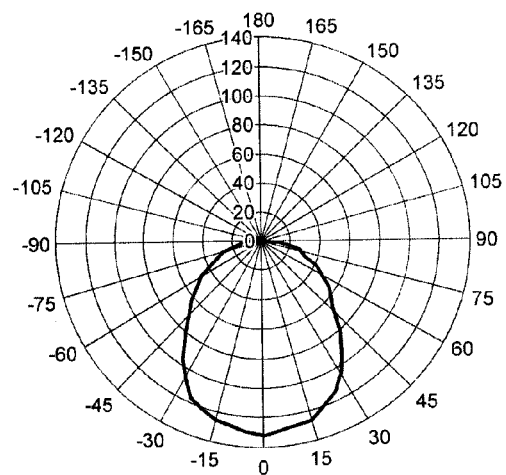
FIGS. 19A-F are graphs showing the maximum tilt intensity slice data for each of the respective offsets in FIGS. 17A-F.
Figure 19B:
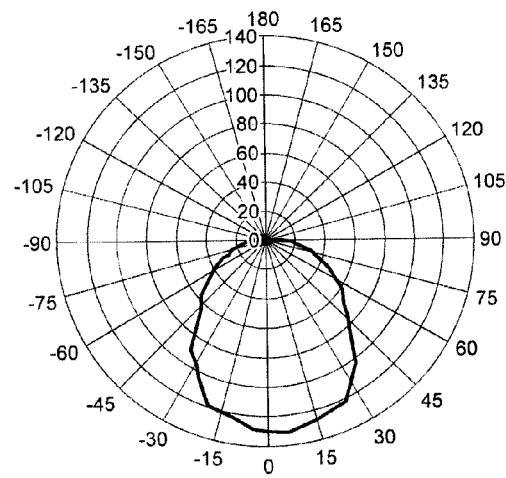
Figure 19C:
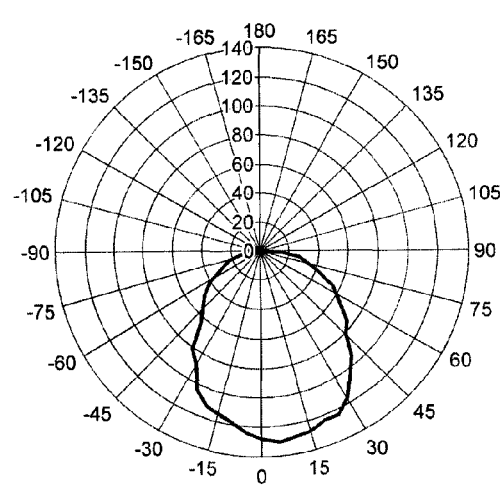
Figure 19D:
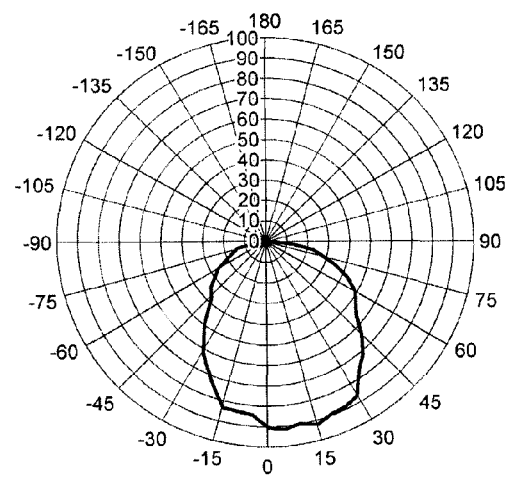
Figure 19E:
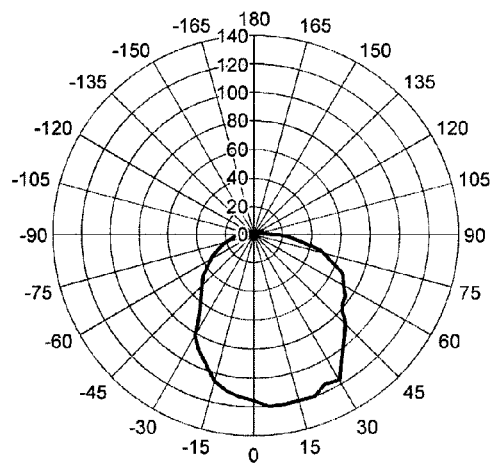
Figure 19F:
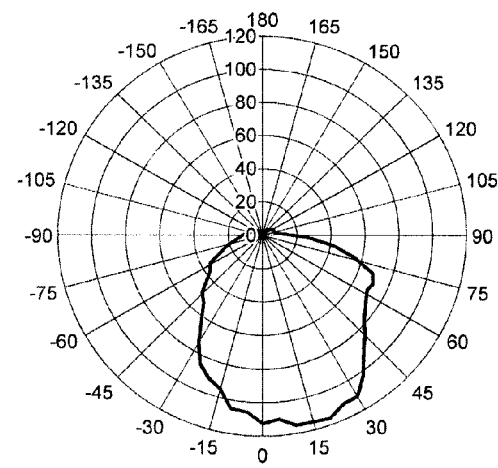
Figure 20A:
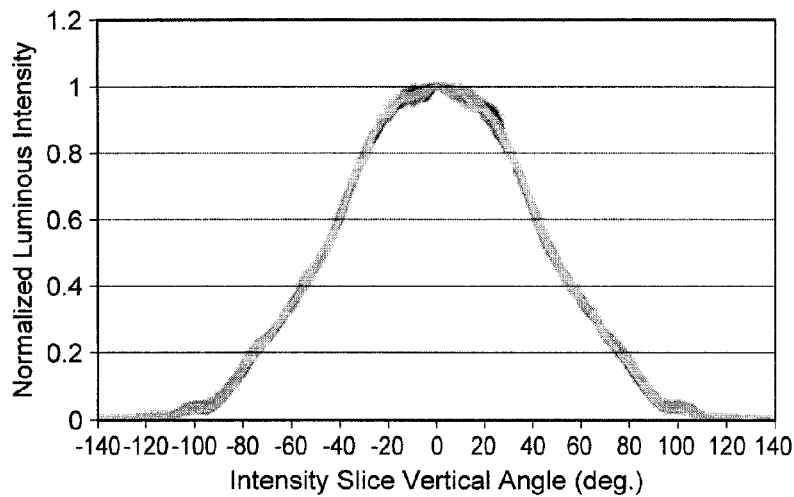
FIGS. 20A-F are graphs showing the normalized intensity slice data for each of the respective offsets in FIGS. 17A-F.
Figure 20B:
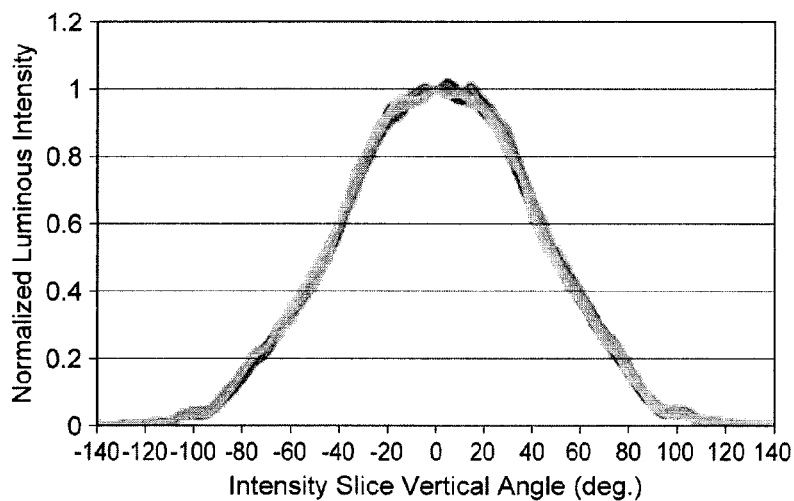
Figure 20C:
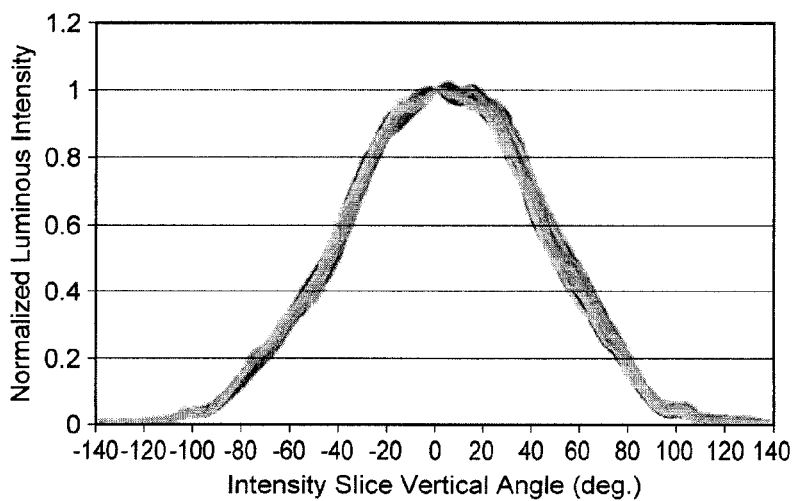
Figure 20D:
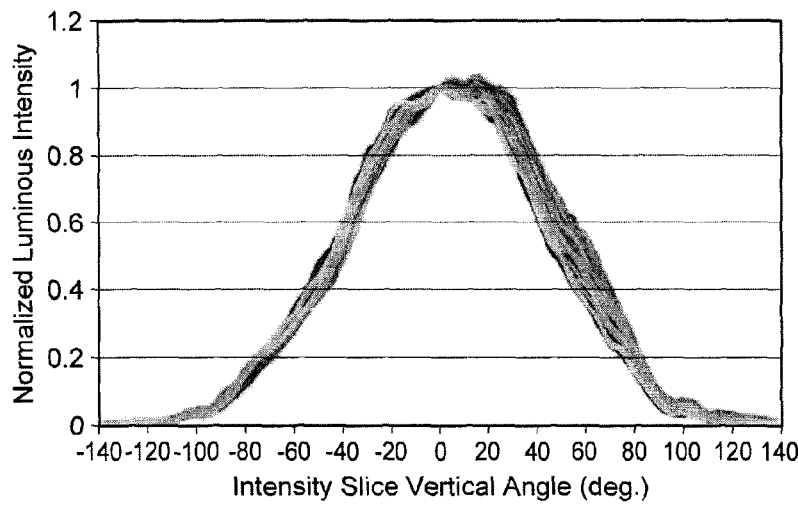
Figure 20E:
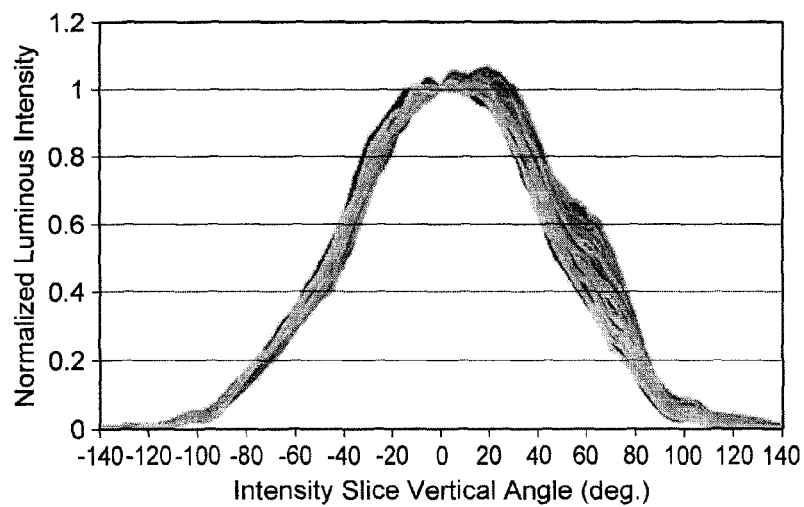
Figure 20F:
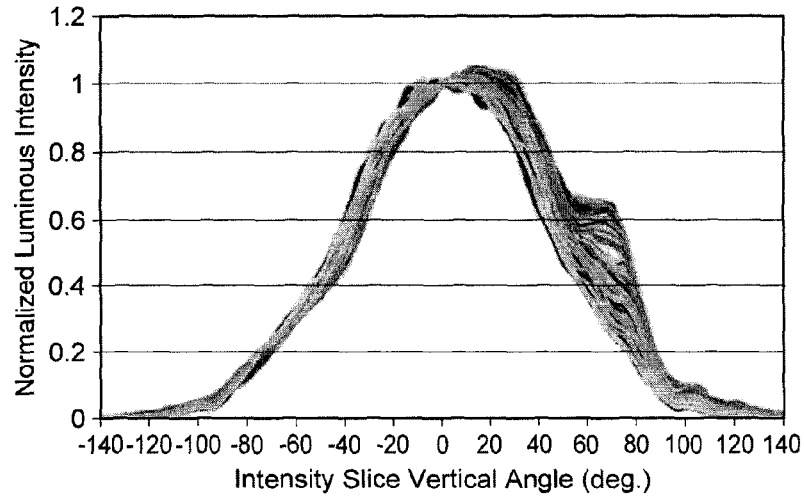
Figure 21A:
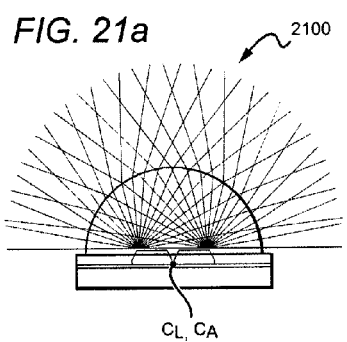
FIGS. 21A-F are side views of the LED components of FIGS. 17A-F demonstrating ray tracing results for each of the respective offsets in FIGS. 17A-F.
Figure 21B:
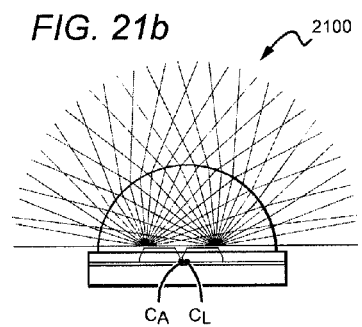
Figure 21C:
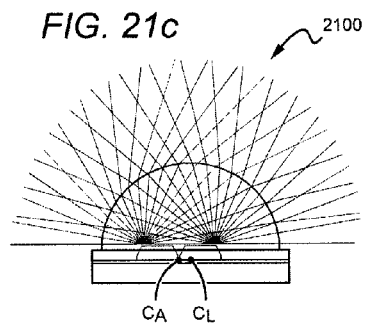
Figure 21D:
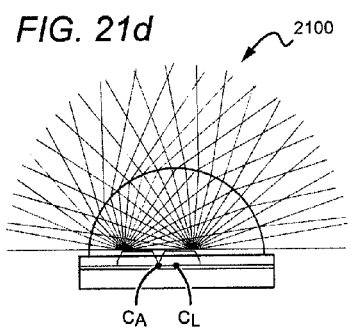
Figure 21E:
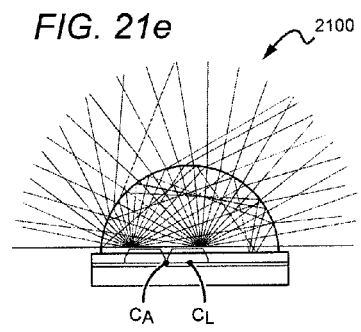
Figure 21F:
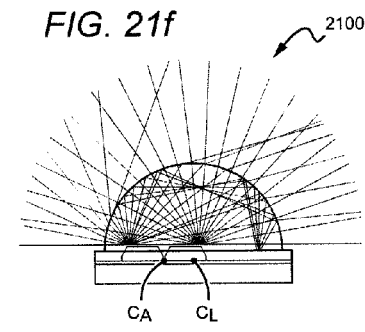

Referring to FIG. 8A, an array 825 of lenses 820 may be defined on the surface 805a of the monolithic submount 805, where each lens 820 has a lens base 820a and overlies, in this embodiment, a single LED chip 815. The array 825 of lenses 820 has a center CLA, and each lens base 820a has a center CB. In this example, the array 825 is a 3×3 array, but other array sizes are possible, as discussed further below. FIG. 8A shows lenses 820 that are hemispherical in shape; however, one or more of the lenses in the array may have another symmetric or asymmetric shape, as shown in FIG. 16, which is a side view of a submount 1605 supporting three lenses 1620 that each overlie one or more LED chips 1615.

In a traditional configuration, the LED chip 815 underlying each lens 820 is centered with respect to the respective lens base 820a. In order to provide a desired emission profile from the LED component 800, however, one or more of the LED chips 815 underlying one or more of the lenses 820 may include an offset d from the center CB of the respective lens base 820. The offset or displacement d is measured from the center of the LED chip 815 and may be in the ±x-direction, the ±y-direction, or in a direction lying between the ±x-direction and the ±y-direction. The amount of the displacement d may depend on the size of the lens 820 and the LED chip 815, but typically lies between about 0.1 mm and 1.2 mm. As a consequence of the displacement d, the peak emission of the LED chip 815 may be shifted from the perpendicular centerline of the respective lens base 820a. The overall effect of the displacement d of one or more of the LED chips 815, as shown for example in FIG. 8C, on the intensity profile of the LED component 800 may be a shifting and/or broadening of the emission profile. This is further discussed in Example 1.

Figure 8C:
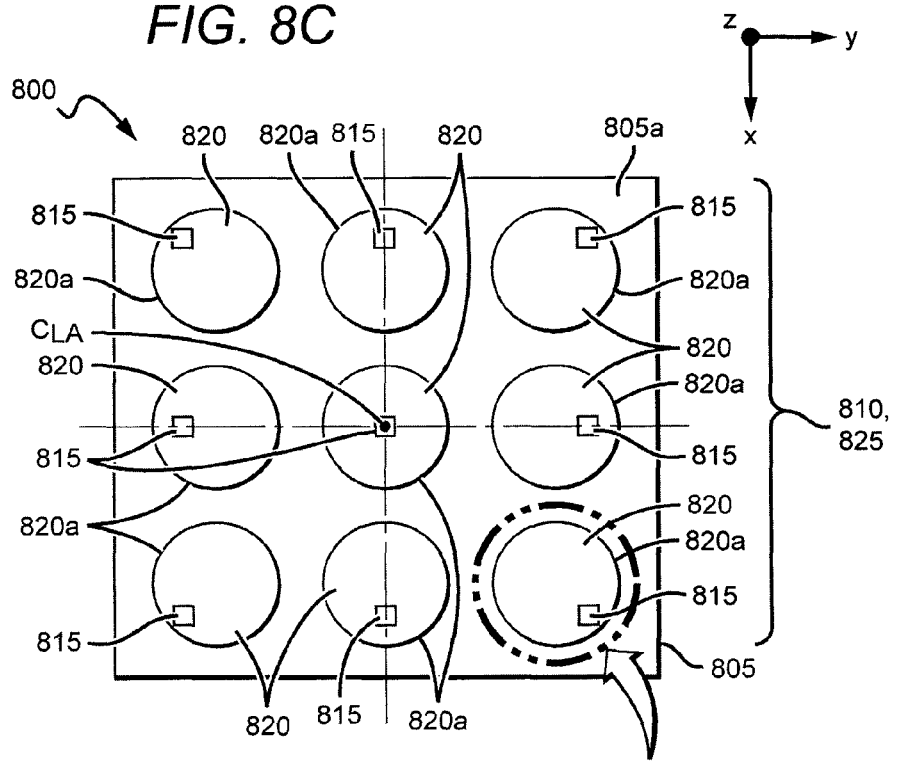
FIG. 8C is a top view of the LED component of FIG. 8A.
Figure 8D:
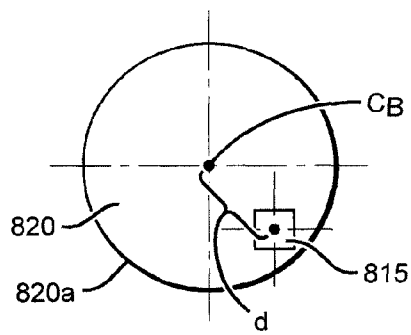
FIG. 8D is a close-up view of a portion of FIG. 8C showing the offset d between the center of the LED chip and the center CB of the lens base.

Referring to FIG. 8C, the array 825 of lenses 820 may thus include a first portion of LED chips 815, each having an offset d from the center of the respective lens base 820a, and a second portion of LED chips 815, each of which is centered with respect to the respective lens base 820a. In this example, the second portion includes only one LED chip 815; the LED chip 815 disposed in the center of the array 810 of LED chips 815 does not include an offset. In an alternative embodiment, all of the LED chips 815 in the array 810 may include an offset d from the center CB of the respective lens base 820a. The offset d for each LED chip may be the same, or different LED chips 815 may have offsets d that differ in magnitude and/or direction, as indicated schematically in FIGS. 8A-8D. Due to the displacements d of individual LED chips, the center CA of the array of LED chips may be displaced from the center CLA of the array of lenses.

Figure 9:
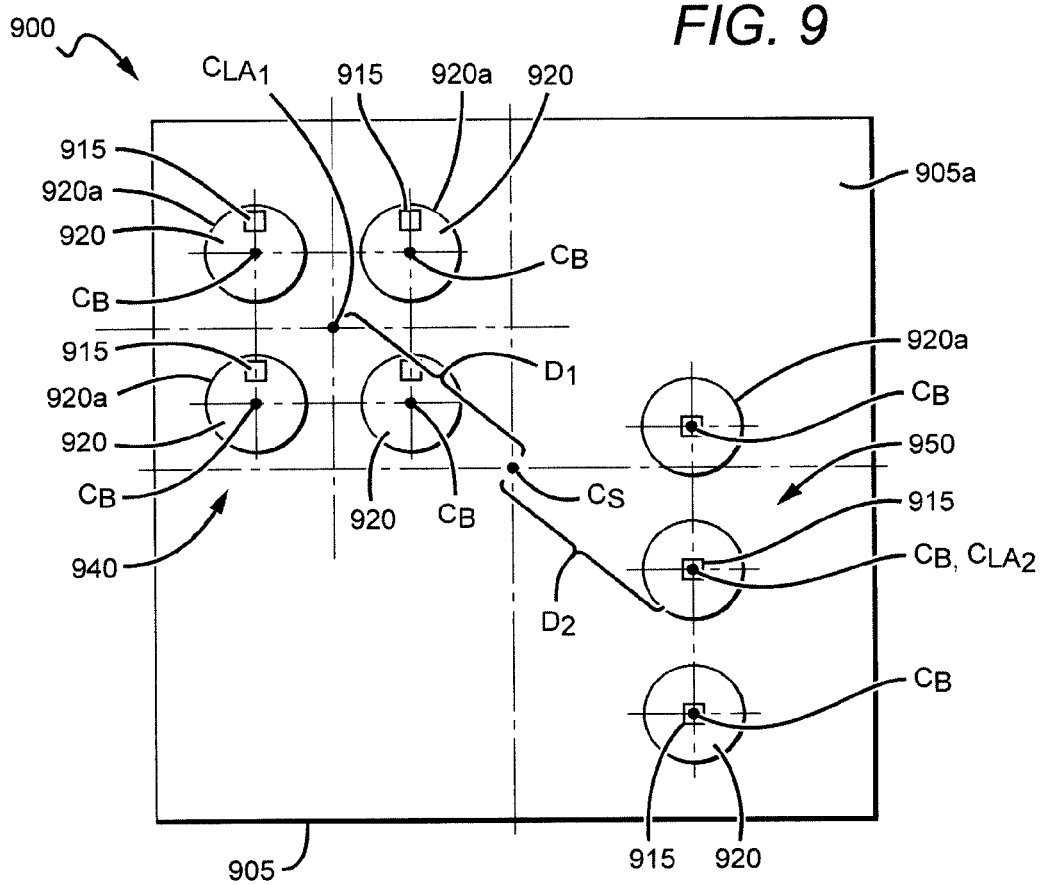
FIG. 9 is a top view of an exemplary LED component including two arrays of lenses having centers CLA1, CLA2 that are offset with respect to the center CS of the submount, where each lens overlies an LED chip that may be centered or offset with respect to the center CB of the respective lens base.

It is also contemplated that one or more of the lenses and the underlying LED chip(s) may be displaced from the original array of lenses, as described above and shown schematically in FIG. 6 for the single lens embodiment. The LED chip underlying each lens may remain centered with respect to the lens base or may include an offset with respect to the lens base, as discussed above. Furthermore, there may be more than one array of lenses overlying LED chips on the submount, where each array has a center that is displaced from the center of the submount. An exemplary LED component 900 including two arrays 940, 950 of lenses 920 overlying LED chips 915 is shown in FIG. 9; as can be seen, the center CLA1, CLA2 of each array 940, 950 includes an offset D1, D2 from the center CS of the surface 905a of the submount 905, and the offsets D1, D2 differ in both magnitude and direction. Alternatively, the offsets may differ in magnitude but not in direction, or they may differ in direction but not in magnitude. The LED chip 915 underlying each lens 920 may remain centered with respect to the lens base 920a, as is the case with the 3×1 array 950 shown in FIG. 9, or may include an offset d with respect to the center CB of the lens base, as is the case with the 2×2 array 940 shown in FIG. 9.

FIG. 10 shows a cross-sectional side view of a portion of an exemplary submount 1005 including LED chips 1015 on its surface 1005a. Each LED chip 1015 includes an overlying lens 1020. The lenses 1020 are part of an array 1025 of lenses 1020 that is not shown in its entirety in this figure. At least one of the LED chips 1015 is mounted at a non-zero mounting angle γ with respect to the surface 1005a of the submount 1005, thereby exhibiting a tilt τ with respect to the centerline of the lens base 1020a of the overlying lens 1020. FIG. 10 shows two LED chips 1015 that include the tilt τ, and one that does not. It is assumed that the surface 1005a is substantially planar, with the exception of any recessed or protruding features that may be formed on the surface 1005a to mount the LED chips 1015 at the desired mounting angle γ.

In general, as in the single lens embodiment, all or a portion of the LED chips in the array may exhibit the tilt τ with respect to the centerline of the lens base. For example, from about 25% to about 75% of the LED chips in the array may be mounted at a non-zero mounting angle γ with respect to the surface, thereby including the tilt τ. The amount of the non-zero mounting angle γ may lie between about 5° and 35°, or between about 18° and 22°. Accordingly, the tilt τ may lie between about 55° and about 85°, or between about 68° and about 72°.

As discussed above, the amount of the tilt τ may be the same for each LED chip, or the amount may be different for one or more of the LED chips in the array. For example, a first portion of the LED chips may exhibit a first tilt τ1 and a second portion of the LED chips may exhibit a second tilt τ2, where the two different tilts τ1 and τ2 correspond to two different mounting angles γ1 and γ2, respectively, on the surface of the submount. For any given array, there may be as many as n different tilts τ1, τ2, ... τn and n different corresponding mounting angles γ1, γ2 ... γn, where n is less than or equal to the number of LED chips in the array.

Furthermore, the LED chips in the multiple lens array may exhibit a combination of the tilts and displacements described above. For example, in FIG. 10 the outermost LED chips 1015 include the tilt τ and the innermost LED chip 1015 includes a displacement d with respect to the center CB of the lens base 1020a. Any or all of the LED chips shown in FIGS. 8A-8D and FIG. 9 may be mounted at an angle γ with respect to the surface of the submount, so as to exhibit a tilt τ as described above. Similarly, the portion of the multiple lens array 1025 shown in FIG. 10, where two of the LED chips 1015 include a tilt τ, may further include displacements in the plane of the submount that are not apparent in FIG. 10.

Figure 15A:
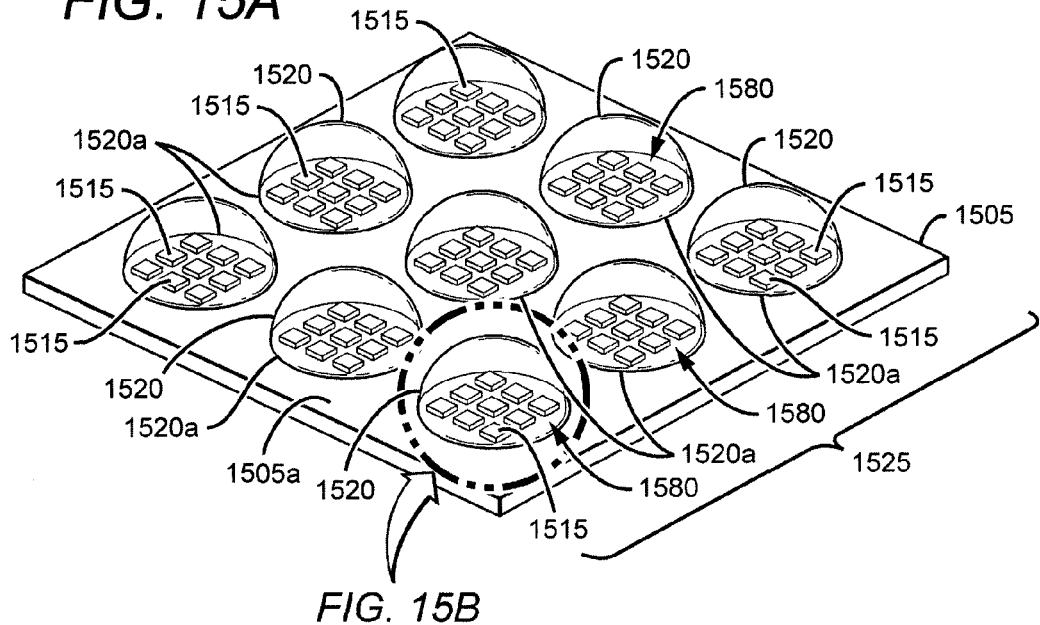
FIG. 15A is a perspective view of an exemplary LED component including an array of LED chips and an array of optical lenses on a monolithic substrate, where the number of LED chips exceeds the number of lenses and where each of the lenses overlies a plurality of LED chips.
Figure 15B:
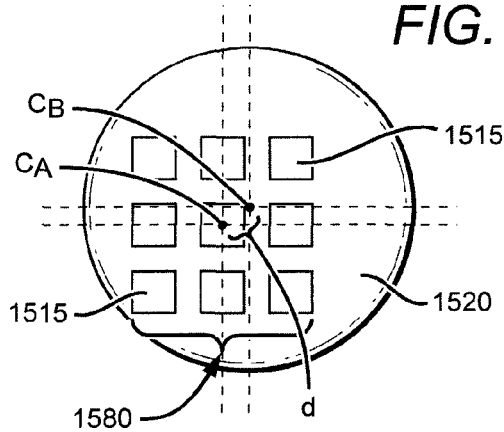
FIG. 15B is a close-up view of a portion of FIG. 15A showing the offset d between the center CA of the plurality of LED chips and the center CB of the lens base.

In an implementation in which the number n of lenses 1520 in the array 1525 is less than the number of LED chips 1515, at least one of the lenses 1520 in the multiple lens array 1525 may overlie a plurality 1580 of LED chips 1515, as shown for example in FIG. 15A. Similar to the preceding embodiments, a center CA of the plurality 1580 of LED chips 1515 may be displaced from a center CB of the respective lens base by a displacement amount d, as shown in FIG. 15B. It is also contemplated that at least one of the LED chips 1515 in the plurality 1580 may be mounted at a non-zero angle γ with respect to the surface 1505a of the substrate 1505, thereby comprising a tilt τ with respect to the perpendicular centerline of the respective lens base 1520a. Also, at least one of the optical lenses may have an asymmetric shape. It is also possible that at least one of the LED chips in the array may not underlie a lens when the number n of lenses is less than the number of LED chips.

The arrays of LED chips described herein may include any number of LED chips in order to provide the desired light output from the LED component. For example, the array may include at least two LED chips, at least four LED chips, at least eight LED chips, at least LED chips, or at least 20 LED chips. Much larger arrays are also possible. For example, the LED component may have an array of at least about 50, or at least about 100, LED chips arranged on its surface. The arrays may be symmetric or asymmetric. Exemplary LED chip arrays on monolithic substrates (chip on board (CoB) structures) are described in, for example, U.S. Pat. No. 7,821,023 to Yuan et al., issued on Oct. 26, 2010, and U.S. Patent Application Publication No. 2009/0108281 to Keller et al., published on Apr. 30, 2009, which are hereby incorporated by reference in their entirety.

Fabrication of conventional LEDs is generally known, and is only briefly described here. LEDs can be fabricated using known processes, with a suitable process being metal organic chemical vapor deposition (MOCVD). The layers of the LEDs generally comprise an active layer/region sandwiched between first and second oppositely doped epitaxial layers, all of which are formed successively on a growth substrate. LEDs can be formed on a wafer and then singulated for mounting in a package. It is understood that the growth substrate can remain as part of the final singulated LED or the growth substrate can be fully or partially removed.

Additional layers and elements may also be included in the LEDs, including but not limited to buffer, nucleation, contact and current spreading layers, as well as light extraction layers and elements. The active region can comprise single quantum well (SQW), multiple quantum well (MQW), double heterostructure or superlattice structures.

The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in U.S. Pat. Nos. Re. 34,861; 4,946,547; and 5,200,022.

LEDs can also comprise a conductive current spreading structure and wire bond pads on the top surface, both of which are made of a conductive material that can be deposited using known methods. Some materials that can be used for these elements include Au, Cu, Ni, In, Al, Ag or combinations thereof, as well as conducting oxides and transparent conducting oxides. The current spreading structure can comprise conductive fingers arranged in a grid on the LEDs with the fingers spaced to enhance current spreading from the pads into the top surface of the LEDs. In operation, an electrical signal is applied to the pads through a wire bond, and the electrical signal spreads through the fingers of the current spreading structure and the top surface into the LEDs. Current spreading structures are often used in LEDs where the top surface is p-type, but can also be used for n-type materials.

Some or all of the LEDs described herein can be coated with one or more phosphors with the phosphors absorbing at least some of the LED light, and emitting a different wavelength of light such that the LED emits a combination of light from the LED and the phosphor. In one embodiment according to the present invention the white emitting LEDs have an LED that emits light in the blue wavelength spectrum and the phosphor absorbs some of the blue light and re-emits yellow. The LEDs emit a white light combination of blue and yellow light. In other embodiments, the LED chips emit a non-white light combination of blue and yellow light as described in U.S. Pat. No. 7,213,940. In some embodiments the phosphor comprises commercially available YAG:Ce, although a full range of broad yellow spectral emission is possible using conversion particles made of phosphors based on the $(Gd,Y)_3(Al, Ga)_5O_{12}:Ce$ system, such as the $Y_3Al_5O_{12}:Ce$ (YAG). Other yellow phosphors that can be used for white emitting LED chips include: $Tb_{3-x}RE_xO_{12}:Ce(TAG)$; RE=Y, Gd, La, Lu; or $Sr_{2-x-y}Ba_xCa_ySiO_4:Eu$.

LEDs that emit red light can comprise LED structures and materials that permit emission of red light directly from the active region. Alternatively, the red emitting LEDs can comprise LEDs covered by a phosphor that absorbs the LED light and emits a red light. Some phosphors appropriate for these structures may include: Lu2O3:Eu3+; (Sr2-xLax) (Cel-xEux)04; Sr2-xEuxCeO4; SrTiO3: Pr3+, Ga3+; CaAlSiN3: Eu2+; and Sr2Si5N8: Eu2+.

LEDs may be coated with a phosphor using many different methods, with one suitable method being described U.S. patent application Ser. No. 11/656,759 (U.S. Patent Application Publication 2008/0173884) and Ser. No. 11/899,790 (U.S. Patent Application Publication 2008/0179611), both entitled "Wafer Level Phosphor Coating Method and Devices Fabricated Utilizing Method," and both of which are incorporated herein by reference. Alternatively, the LEDs can be coated using other methods, such as electrophoretic deposition (EPD), with a suitable EPD method described in U.S. patent application Ser. No. 11/473,089 (U.S. Patent Application Publication 2007/0158668) entitled "System for and Method for Closed Loop Electrophoretic Deposition of Phosphor Materials on Semiconductor Devices," which is also incorporated herein by reference. It is understood that LED components according to the present disclosure can also have multiple LEDs of different colors, one or more of which may be white emitting.

The submounts may be formed of many different materials with a preferred material being an electrically insulating material, such as a dielectric element, with the submount being between the LED array and the component backside. The submount may include a ceramic, such as alumina, aluminum nitride, silicon carbide, or a polymeric material, such as polymide and polyester, etc. In one embodiment, the dielectric material has a high thermal conductivity, such as with aluminum nitride and silicon carbide. In other embodiments, the submounts can include highly reflective material, such as reflective ceramic or metal layers like silver, to enhance light extraction from the component. In other embodiments, the submount can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used, such as standard FR-4 PCB, metal core PCB, or any other type of printed circuit board.

Any light emitters or LEDs may be used in the embodiments described herein, including those comprised of components and features, such as those described above. Some embodiments may use any commercially available LED. In one configuration, a flip chip package may be used. In other configurations, the flip chip package may include a broader far-field pattern than conventional LEDs. In yet other configurations, these chips may include shaping, such as a shaped substrate. In some configurations of these chips, the chip may further include light extraction features on the emission surface, such as an X-cut or etching. An exemplary chip with these features includes LED chips, such as the model DA 1000 chip manufactured by Cree, Inc. This chip or one similar may be suited for this application, as it has a broader far-field pattern than conventional LEDs. Furthermore, the light emission surface includes light extraction features, such as cut portions, for example, an X-shaped cut such as the one shown on the LED chips of the components in FIG. 29. It should be understood that any other chip may also be used in the configurations shown in FIG. 29. Chips such as the DA 1000 chip are available from Cree, Inc., of Durham, N.C. and related devices and methods for producing them are set forth in U.S. Pat. No. 8,368,100 to Donofrio, et al., entitled "SEMICONDUCTOR LIGHT EMITTING DIODES HAVING REFLECTIVE STRUCTURES AND METHODS OF FABRICATING THE SAME," which is commonly owned and incorporated herein by reference.

Figure 11:
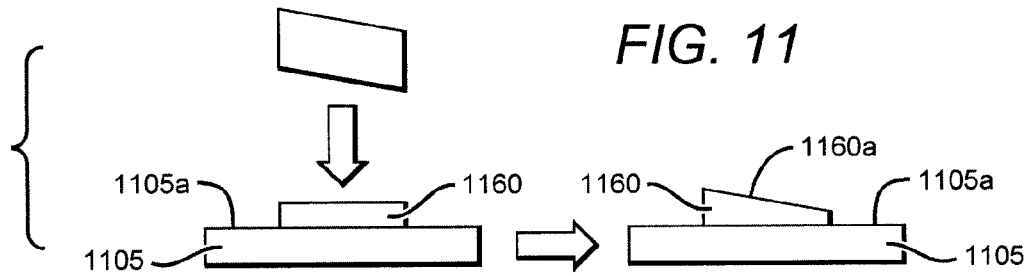
FIG. 11 is a schematic showing a stamping process that may be employed to fabricate an angled landing pad for mounting an LED chip at an angle $\gamma$ to the surface of the submount.

The submount may be modified to include one or more protruding or recessed regions that allow for a nonzero mounting angle γ of one or more of the LED chips. For example, material may be added to a substantially planar submount to create the desired surface profile for the LED component. Referring to FIG. 11, a thick chip landing pad 1160 may be deposited on the surface 1105a of the submount 1105, and the landing pad 1160 may be stamped or otherwise deformed to create an angled landing pad surface 1160a that allows an LED chip to be mounted at the desired mounting angle γ on the submount 1105.

Figure 12A:
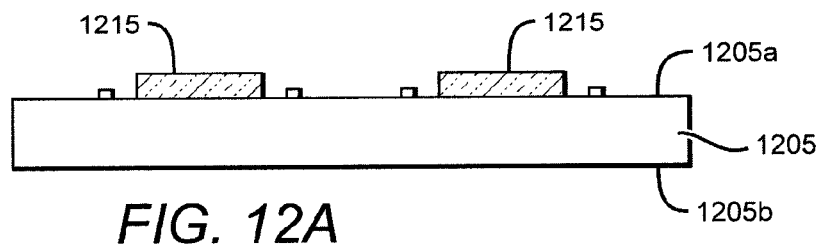

In another approach, stamping may be applied directly to a submount to create a desired surface profile. For example, one or more recessed features may be stamped into the backside of a substrate in order to create a desired profile of protruding feature(s) on the frontside of the substrate. FIG. 12A shows a cross-sectional schematic of an exemplary monolithic substrate 1205 including two LED chips 1215 disposed on the surface 1205a. Prior to stamping, the LED chips 1215 are mounted flat on the surface and do not include a mounting angle γ. FIG. 12B shows the creation of two protrusions 1270 underlying the two LED chips 1215 in the frontside 1205a of the substrate 1205 by stamping local regions of the backside 1205b of the substrate 1205. After stamping, the protruding regions 1270 extend from the front surface 1205a of the substrate 1205 at the desired mounting angle γ. LED chips 1215 positioned on the protruding regions 1270 thus have a predetermined tilt τ with respect to the centerline of the submount 1205. The LED chips 1215 may be placed on the substrate 1205 and connected electrically either before or after the protruding regions 1270 are created. Also, individual lenses overlying each LED chip 1215, or a single larger lens overlying all of the LED chips 1215 on the substrate 1205, may be molded onto the submount 1005 after forming the one or more protruding regions 1270.

The specific geometry of the mounting region depends on the desired tilt for the LED chip, as well as the size of the chip. Referring to FIG. 12C, the exemplary LED chip 1215 shown is mounted on a mounting region 1270 of 2 mm in length l at a mounting angle γ of 12°, and thus the mounting region protrudes from the surface 1205a, a distance (or height) h=2 mm·tan(12°)=0.425 mm. Generally speaking, the length l of the mounting region may range from about 1.0 mm to about 6.0 mm, and the height h of the mounting region may lie between about 0.2 mm and about 2.2 mm. The width w of the mounting region may be between about 1.0 mm and about 6.0 mm, typically. The mounting angle γ, as described above, typically ranges from about 5 degrees to about 35 degrees.

Different shifts or tilts in the peak emission of the LED component may be desired, depending on the size and intended use of the display. An appropriate range for the shift in the peak emission may be between about 5 degrees and about 30 degrees for many possible applications, and the shift may also lie between about 10 degrees and about 20 degrees. Alternatively, other ranges of shift angles can be used.

EXAMPLE 1

The change in the intensity distribution that results from purposely moving LED chips off-center with respect to an overlying lens is explored in this example. FIG. 13A is a photograph of an exemplary LED component including 12 LED chips, each with its own hemispherical lens. Three cases are examined: LED chip 1315 at lens 1320 optical center (center of lens base 1320a) (FIG. 13C); LED chip 1315 offset radially inward (FIG. 13D); and LED chip 1315 offset radially outward (FIG. 13E). The chip 1315 physical offset is ~220-230 micrometers in a 3.0 mm diameter lens 1320.

Figure 13B:
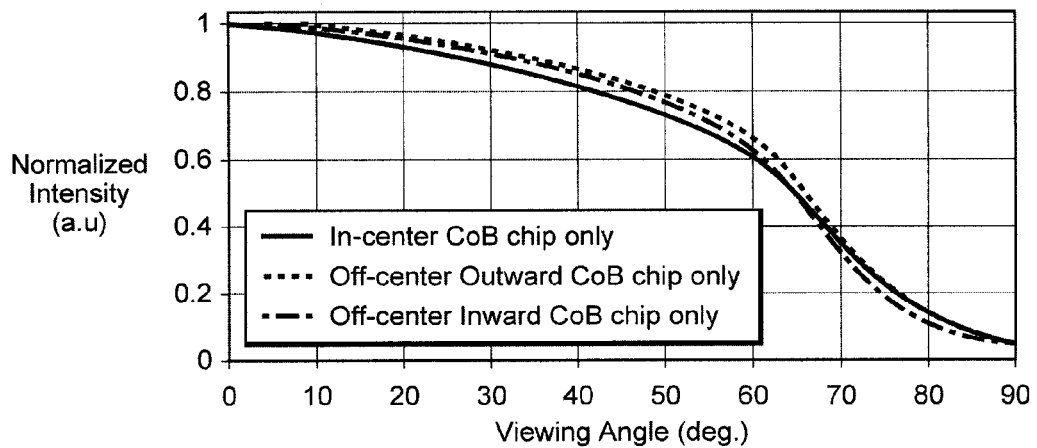
FIG. 13B includes a chart showing normalized intensity as a function of angle from the perpendicular centerline, where the data is obtained for three embodiments of the LED component of FIG. 13A, as indicated in FIGS. 13C-13E.

The chart in FIG. 13B shows that the amount of light as a function of angle from the perpendicular is different for offset chip placement vs. an on-axis placement case. In particular, offsetting the LED chip 1315 as described with respect to the overlying lens 1320 leads to a broadening of the intensity beam profile. For this example, the difference in light output varies by angle and is maximum in the 30-60 degree range at −6-8%.

EXAMPLE 2

Figure 14A:
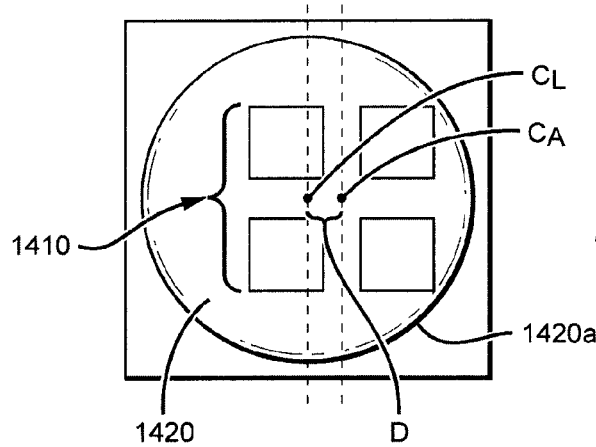
FIG. 14A is a top view of an exemplary LED component including a 2×2 array of LED chips.

In this example, the center CA of a (2×2) chip array 1410 is offset as a unit with respect to the center CL of a single overlying lens 1420. The geometry of the array 1410 is shown in FIG. 14A. The offset D between the center CA of the LED chip array 1410 and the center CL of the lens 1420 (lens base 1420a) is varied and the resulting flux profile is obtained (FIG. 14B).

Figure 14B:
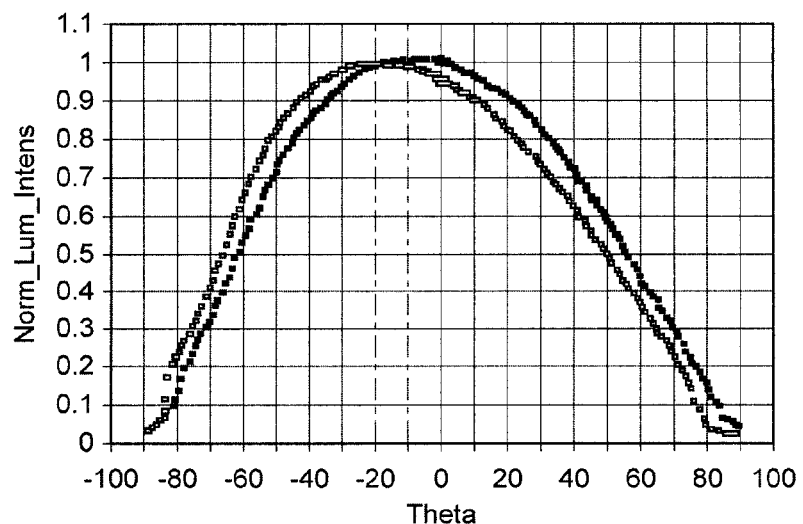
FIG. 14B is a chart showing the shift in the intensity profile that occurs depending on the amount of displacement between the center of the LED chip array of FIG. 14A and the center of the lens base.

Referring to the data shown in FIG. 14B, a 0.3 mm offset between the center CA of the LED chip array 1410 and the center CL of the lens 1420 yields approximately a 10 degree shift in the position of the emission peak. A 0.6 mm offset between the center of the LED chip array and the center of the lens yields approximately a 20 degree shift in emission peak position.

In summary, the peak emission characteristics of the LED components described in the present patent document may be shifted away from the perpendicular centerline and in some cases otherwise modified for applications where a shifted, nonuniform, broadened, and/or multi-lobed intensity profile may be advantageous. For example, the LED components described herein may be beneficial for displays that are mounted above eye level of the likely viewer. The technology may permit an LED display to be mounted flat in an elevated location, such as a stadium, eliminating the cost and complications for mounting the display at an angle while still allowing for more LED light to be directed along the viewer's line of sight. The technology may also have benefits for other display applications, including street lights, automotive lights, and architectural lighting.

The LED components and LED component configurations described above can be used in lighting systems to achieve desired system output attributes. Setting the LED components described above within a lighting system allows the creation of a light engine that combined with specified emissions will meet complex spatial illumination requirements without entirely relying on secondary optics and reflectors. FIGS. 28-34 show some examples of these systems or boards used within these systems. The LED components 2802, 2902, 3002, 3102, 3202, 3302, 3402, shown in FIGS. 28-34 all incorporate LED chip offsetting within a component as described above to provide emission shifting or tilting from the LED component itself. Therefore, the lighting systems 2800, 2900, 3000, 3100, 3200, 3300, 3400 of FIGS. 28-34 can provide tilted or shifted emission patterns without the use of secondary optics or reflectors. These systems can also use secondary optics and reflectors, in addition to the offset LED components to further modify light emissions.

Figure 28:
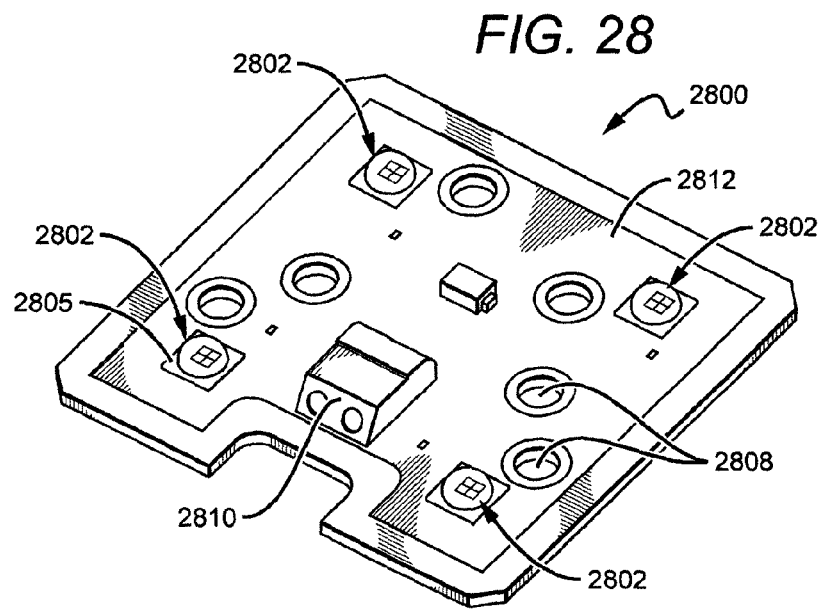
FIGS. 28-34 show different configurations of systems which employ the LED components shown in various other figures.
Figure 25A:
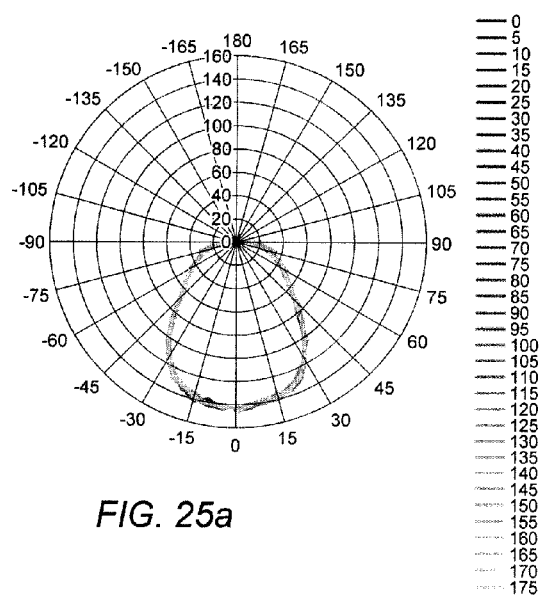
FIGS. 25A-F are graphs showing the intensity slice data for each of the respective offsets in FIGS. 24A-F.
Figure 25B:
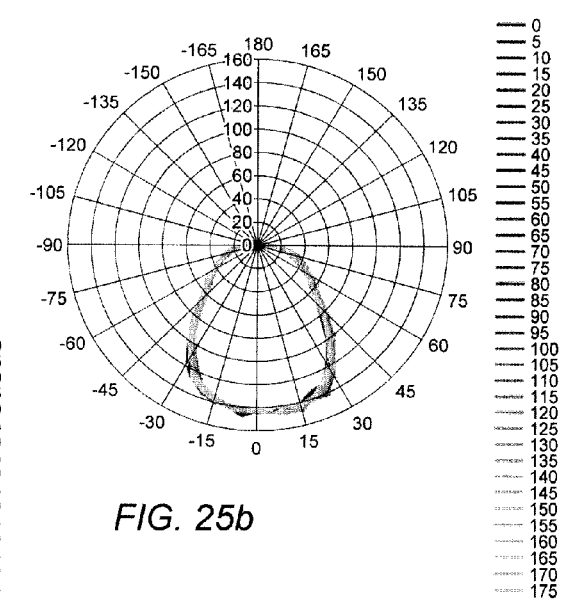
Figure 25C:
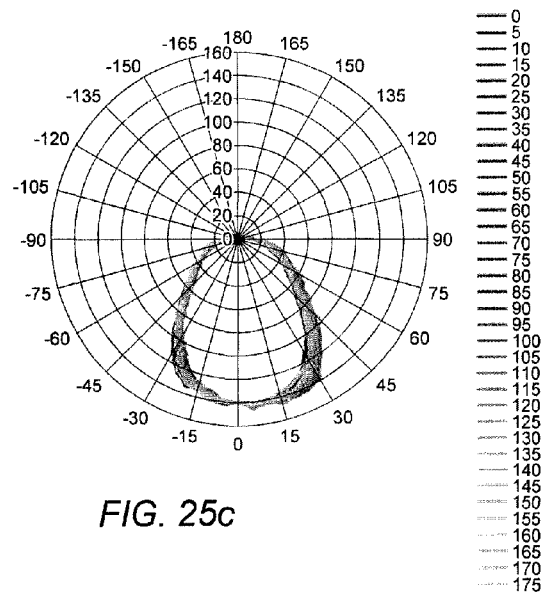
Figure 25D:
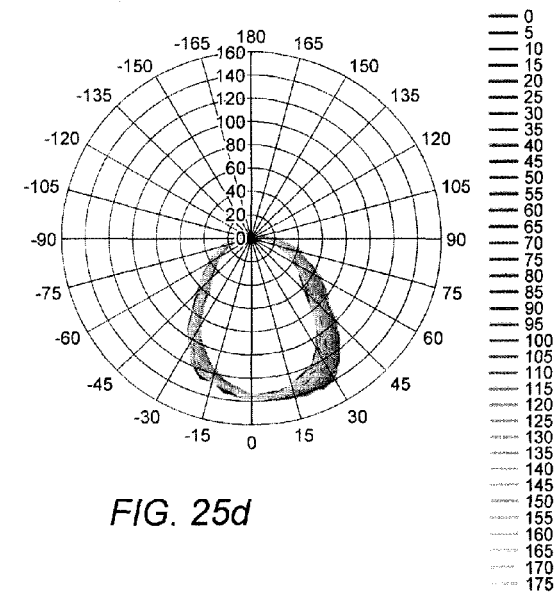
Figure 25E:
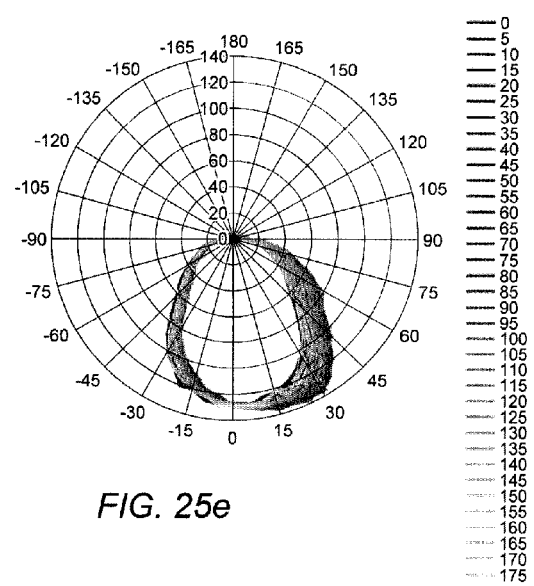
Figure 25F:
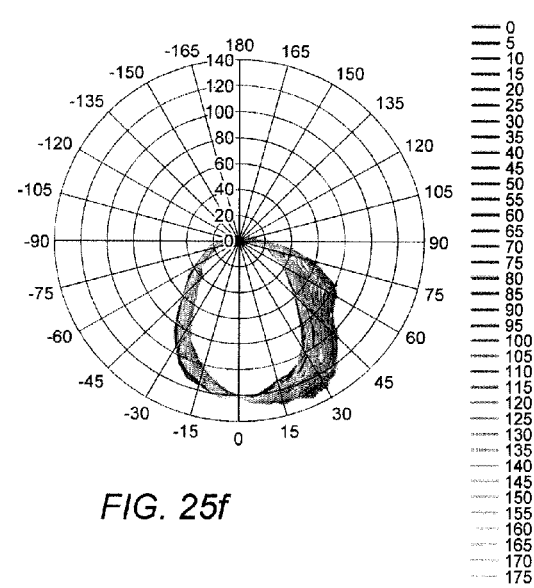
Figure 26A:
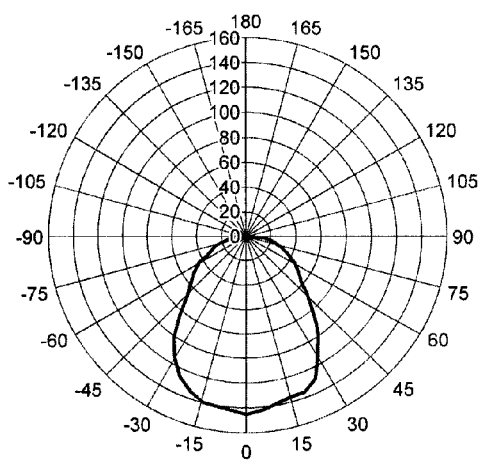
FIGS. 26A-F are graphs showing the maximum tilt intensity slice data for each of the respective offsets in FIGS. 24A-F.
Figure 26B:
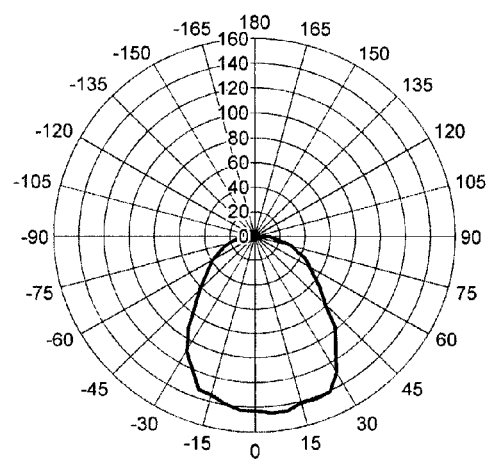
Figure 26C:
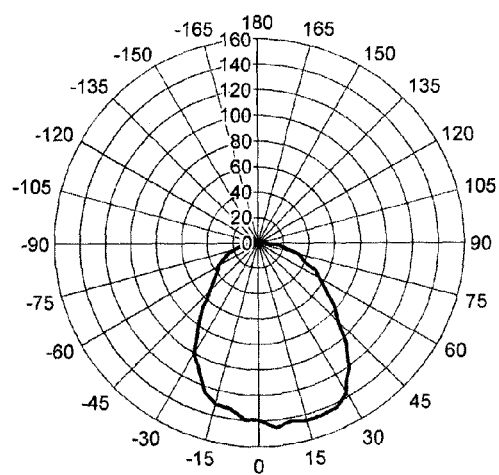
Figure 26D:
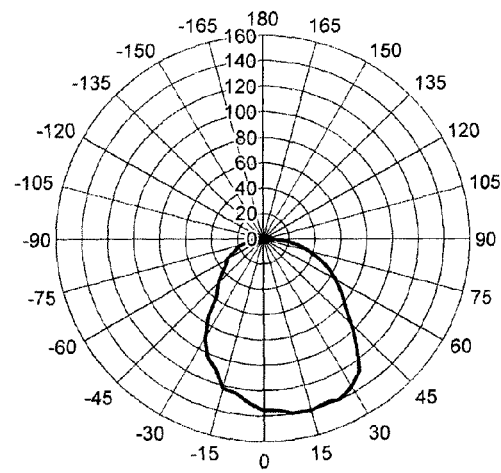
Figure 26E:
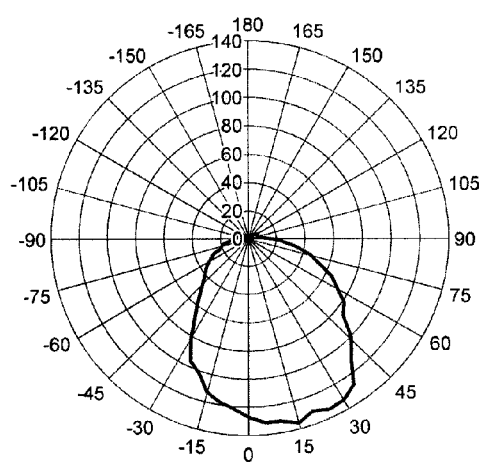
Figure 26F:
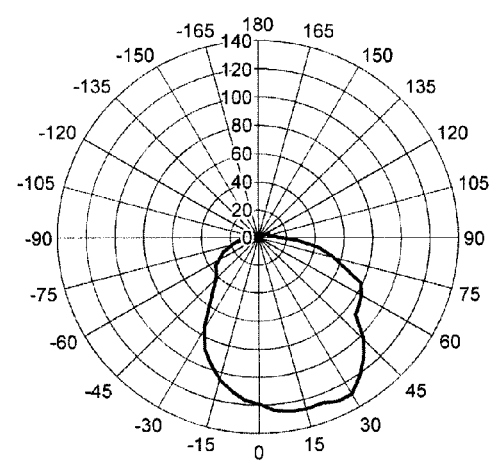
Figure 27A:
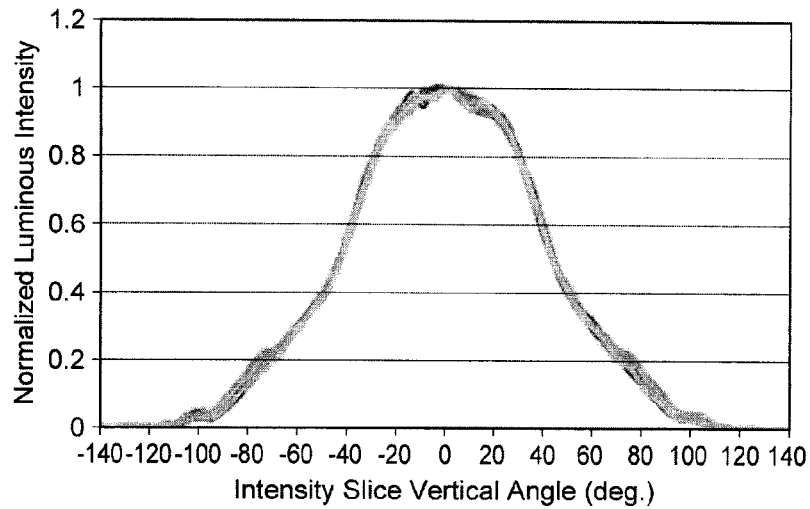
FIGS. 27A-F are graphs showing the normalized intensity slice data for each of the respective offsets in FIGS. 24A-F.
Figure 27B:
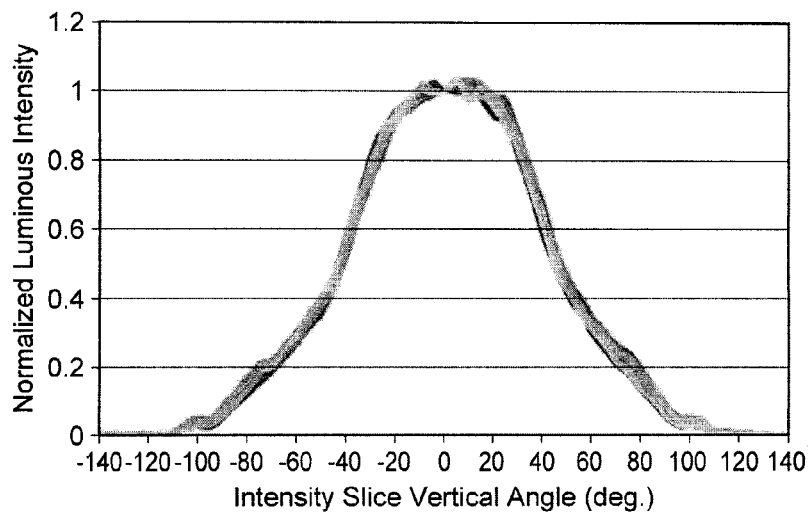
Figure 27C:
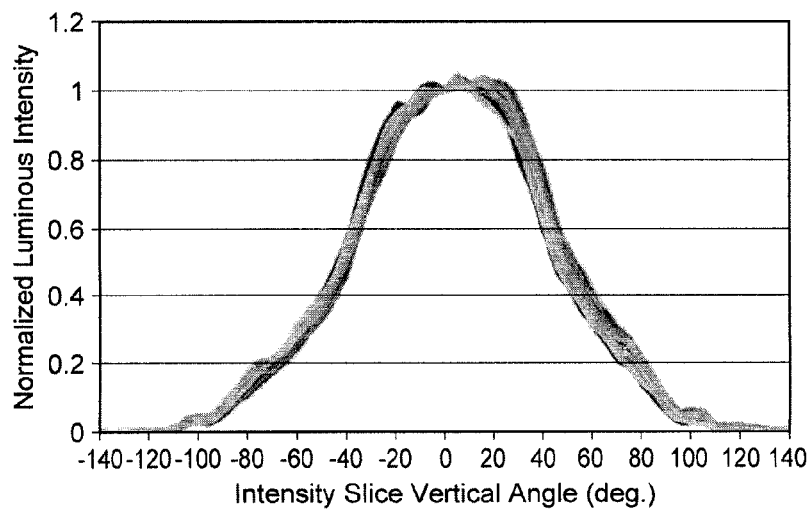
Figure 27D:
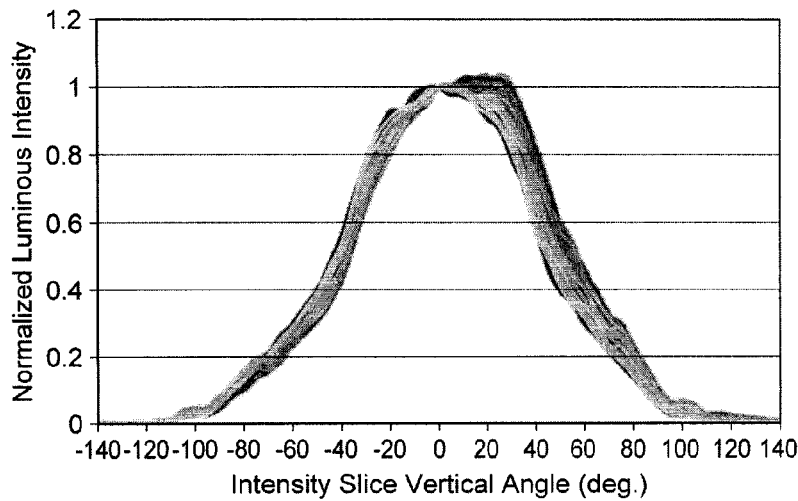
Figure 27E:
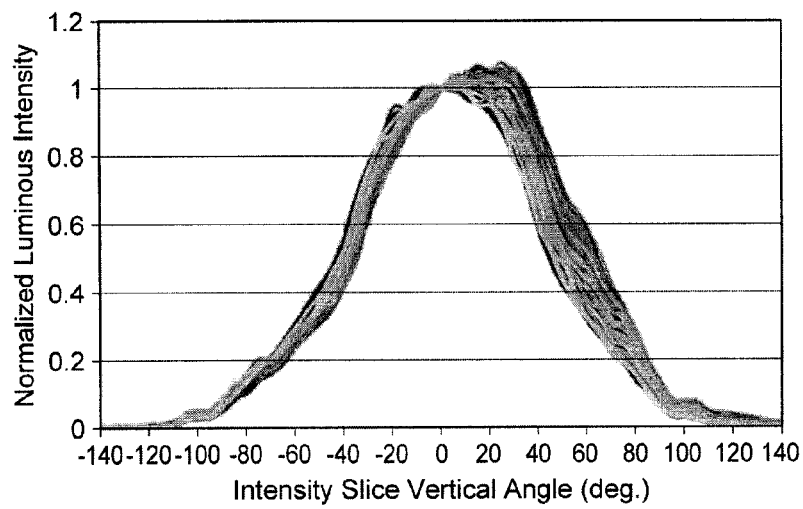
Figure 27F:
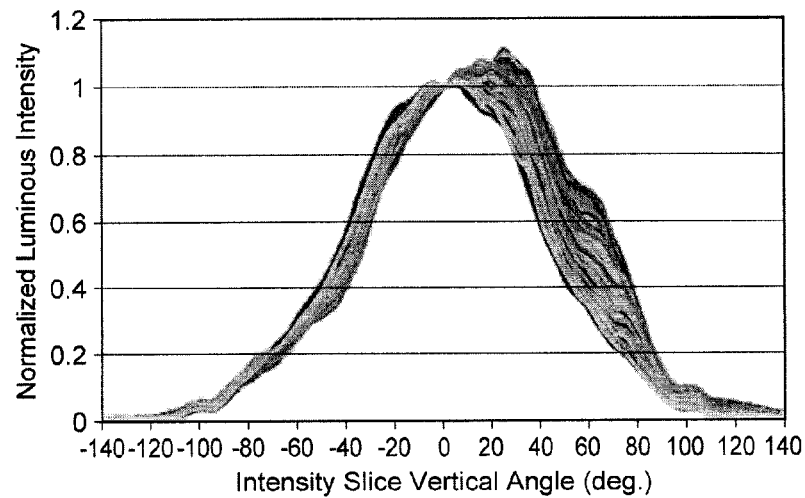

FIG. 28 depicts a portion of a lighting system 2800 including LED components 2802 on a board 2812. This portion of a lighting system 2800 could later be incorporated into a housing to create a lighting fixture. The board 2812 may be any suitable board to support the LED components 2802 and other electronic components, such as a power connector 2810 and other circuitry. In one example, the board 2812 may be a PCB. The board 2812 includes holes or cut outs 2808. These holes 2808 may be used to mount or align the board 2812 in a housing or may also be used to mount or align a secondary optic over the board 2812. In some configurations, secondary optics, such as additional lenses or arrays of lenses, may be placed over the LED components 2802. Electric connector 2810 may be any proprietary or commercially available connector, capable of providing power to the board 2812. The configuration shown in FIG. 28 includes four LED components 2802. Other configurations can use any number of LED components, placed on any areas of the board 2812. The LED components 2802 of this configuration include a substrate or submount 2805. However, other configurations, such as those in FIGS. 29 and 31 can incorporate a chip-on-board mounting method which omits the use of a submount 2805. In yet other configurations, other suitable LED component mounting techniques may be used.

Figure 29:
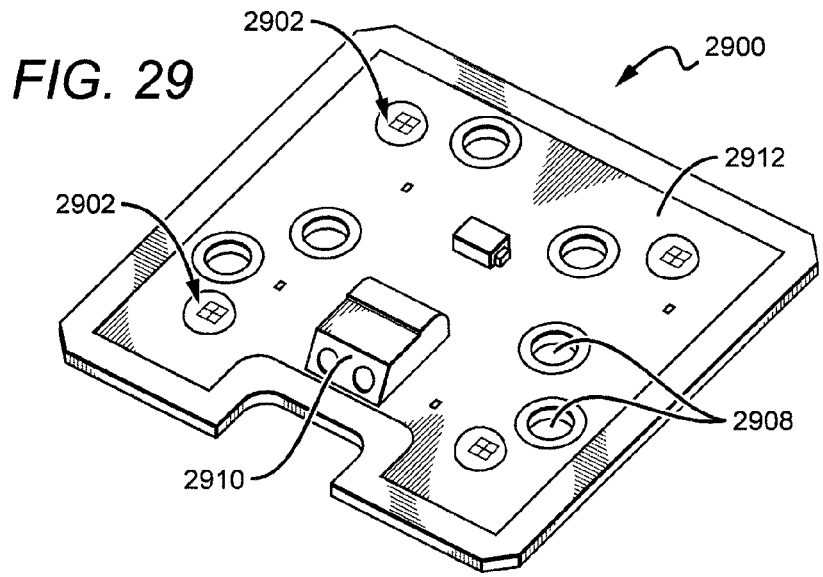

FIG. 29 shows a lighting system portion 2900 which includes a board 2912 with LED components 2902 arranged on the board in a chip-on-board configuration. The board 2912 also includes a connector 2910 and mounting or alignment holes 2908. This board is arranged similarly to the board shown in FIG. 28, however, it incorporates offset LED components, which are mounted using a chip-on-board configuration, not requiring a submount. Though a particular number and configuration of emitters, LED components, and alignment or mounting holes are shown in these figures, it should be understood that any number or configuration of these and other features may be used.

Figure 30:
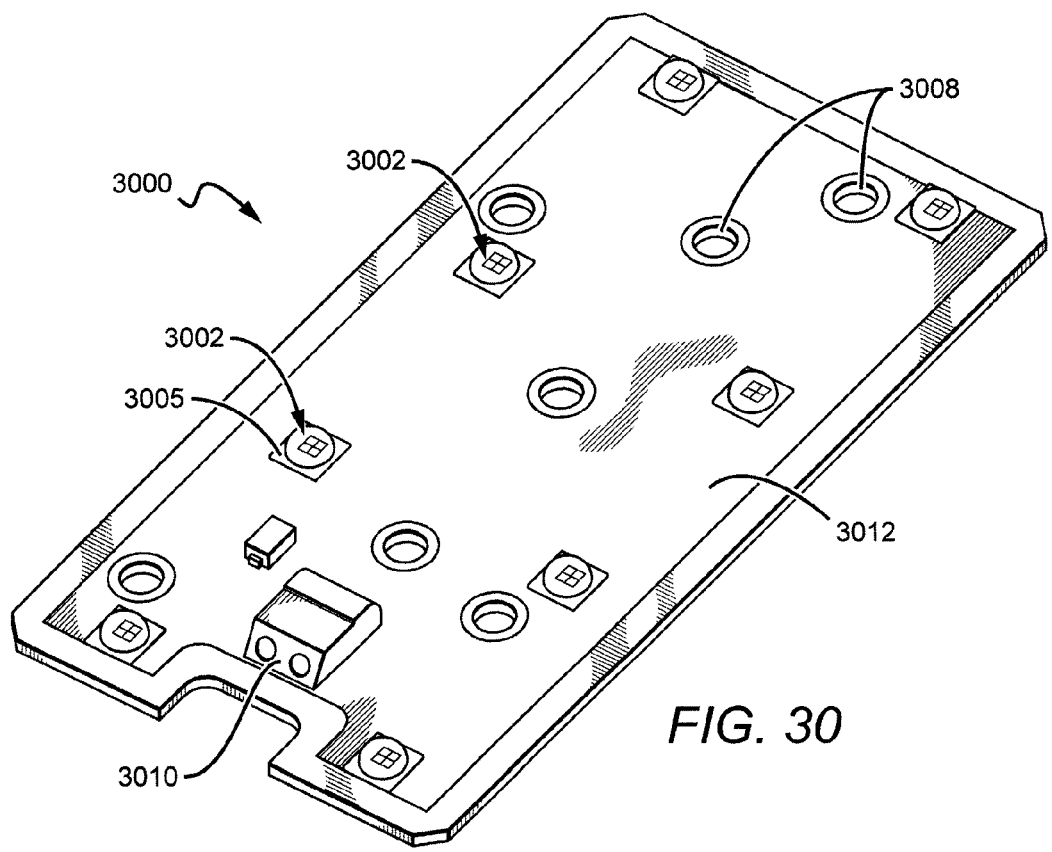
Figure 31:
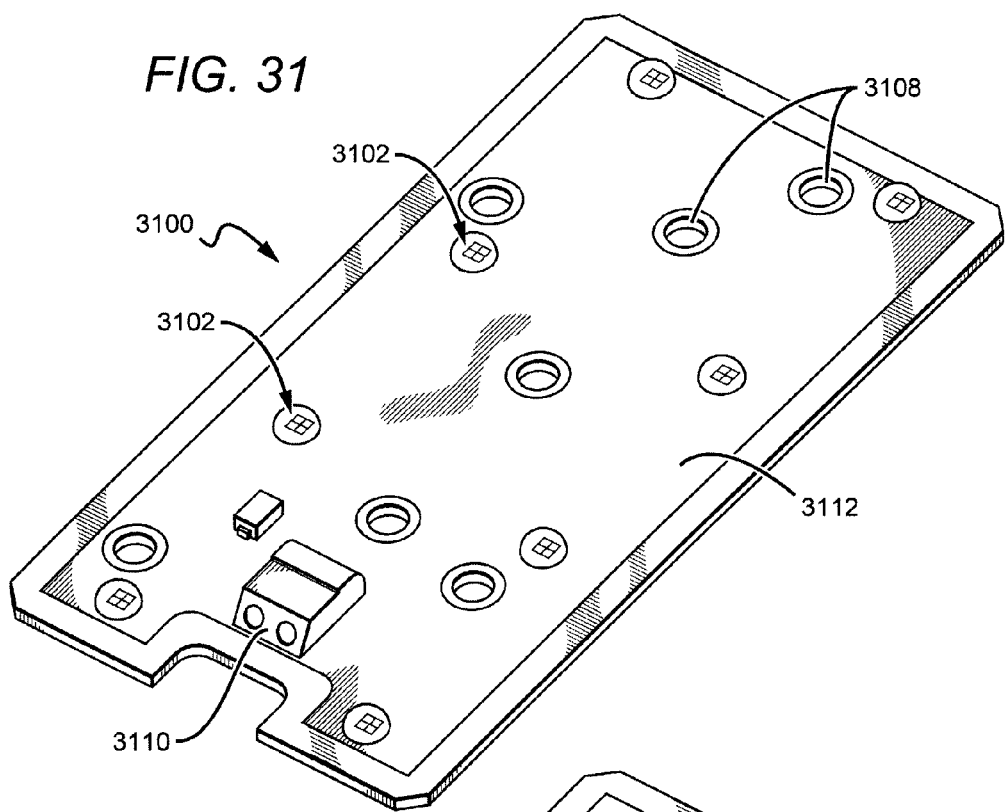

FIG. 30 shows another configuration of a portion of a lighting system 3000. This configuration includes a board 3012 with LED components 3002 mounted to the board 3012. The board also includes a connector 3010 and mounting or alignment holes 3008. As shown, this configuration incorporates the use of 8 LED components with offset emitters that are placed on submounts 3005. However, it should be noted that this is an exemplary configuration and any configurations of any number of LED components with any number or shape of offset arrays of emitters may be used. FIG. 31 shows a configuration similar to that shown FIG. 30, with alignment holes 3108, in board 3112 and connector 3110; however, the LED components 3102 are mounted using a chip-on-board configuration.

Figure 32:
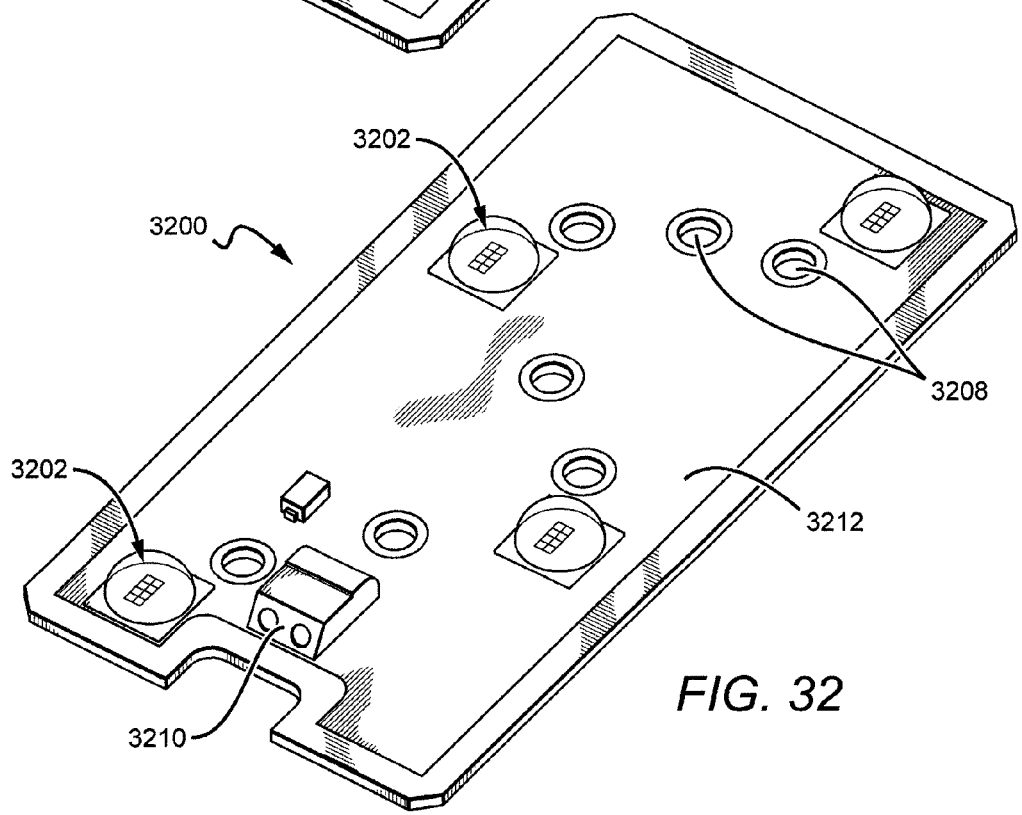

FIG. 32 is yet another configuration of a portion of a lighting system 3200. This configuration includes a board 3212 with LED components 3202 mounted to the board 3212. The board also includes a connector 3210 and mounting or alignment holes 3208. As shown, this configuration incorporates the use of 4 LED components with offset emitters. These emitters may be similar to or different from the emitters of other configurations. The emitters may include surface features to improve light output or may be unmodified.

Figure 33:
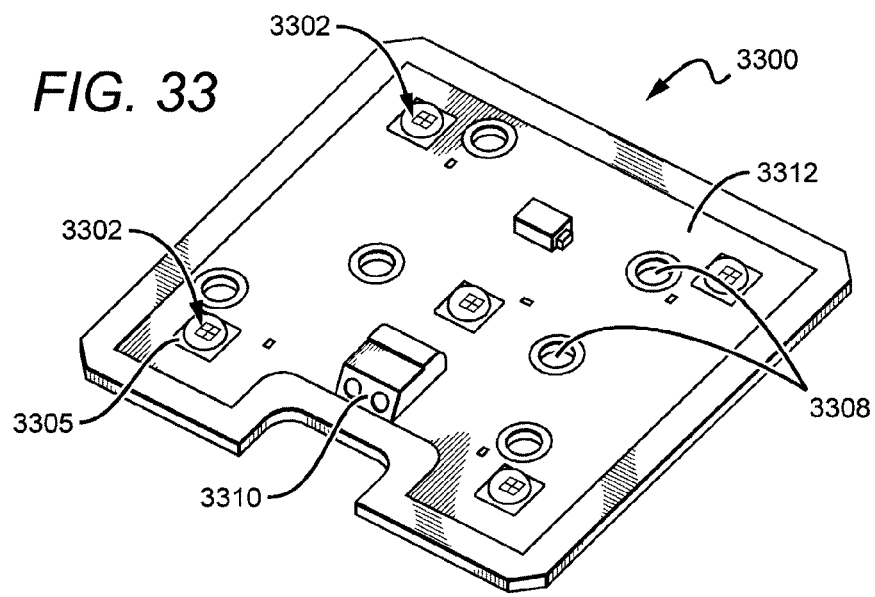

FIG. 33 is yet another configuration of a portion of a lighting system 3300. This configuration includes a board 3312 with LED components 3302 mounted to the board 3312. The board also includes a connector 3310 and mounting or alignment holes 3308. As shown this configuration incorporates the use of 5 LED components with offset emitters that are placed on submounts 3305.

Figure 34:
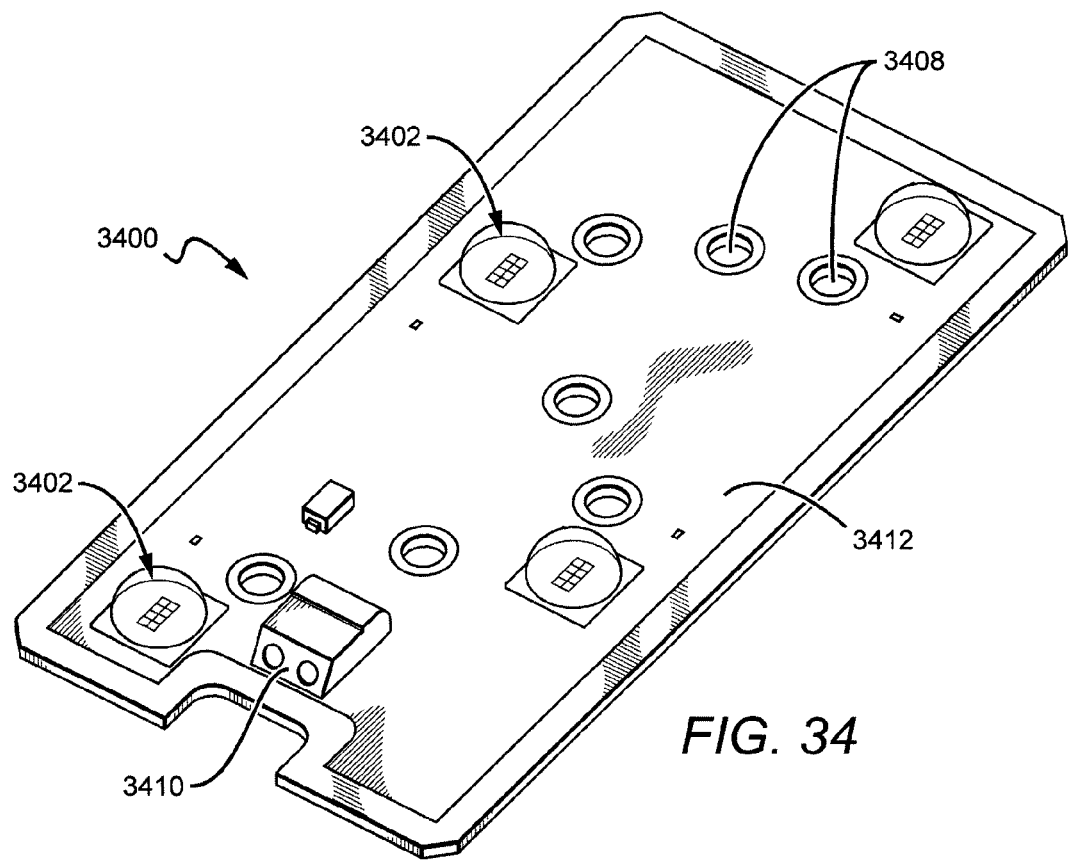

FIG. 34 is yet another configuration of a portion of a lighting system 3400. This configuration includes a board 3412 with LED components 3402 mounted to the board 3412. The board also includes a connector 3410 and mounting or alignment holes 3408. As shown this configuration incorporates the use of 4 LED components with offset emitters.

A system such as those described above with LED packages which have no offset will output light which is not tilted or offset, with patterns such as those shown in FIGS. 18A, 19A, 20A, 25A, 26A, and 27A. However, systems with packages with offset LED chips or LED chip arrays will have light emission patterns, which are tilted. The use of offset emitters allows for LED components with shifted or tilted emission patterns, without causing output at high angles of the components. This is beneficial as it allows a lighting system to have tilted emission from the LED component and primary optics, which can either be directly output as a tilted emission or further changed by secondary optics and reflectors to accommodate complex spatial illumination requirements to achieve particular system attributes. Different shapes of arrays within each LED component can also be used to further modify the emission pattern from the LED component itself. These features combined allow the shaping of total light output in a more efficient manner than relying on secondary optics and reflectors alone, as it is known that light bending within a primary optic causes less light loss than the use of a secondary optic for the same purpose.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

We claim:

1. A light emitting diode (LED) component system comprising:
a housing;
a plurality of LED components within the housing, such that light emitted from the housing comprises a peak emission shifted from a perpendicular centerline of the housing;
each of the plurality of LED components comprising:
at least one LED chip on a mounting surface; and
a primary optical lens on the at least one LED chip and comprising a lens base attached to the mounting surface such that the at least one LED chip and the lens base are aligned along the same plane, wherein the at least one LED chip is displaced in relation to the centerline of said lens base wherein the average peak emission of said at least one LED chip is shifted from a perpendicular centerline of the lens base.

2. The system of claim 1, wherein a center CA of the at least one LED chip is displaced from a center CL of the lens base by a displacement distance D.

3. The system of claim 2, wherein the center CA of the at least one LED chip is displaced from a center CS of the surface of the mounting surface.

4. The system of claim 2, wherein the center CL of the lens base is displaced from a center CS of the surface of the mounting surface.

5. The system of claim 2, further comprising at least one array of LED chips on the mounting surface, the array comprising a center Cx displaced from the center CL of the lens base.

6. The system of claim 2, wherein said at least one LED chip comprises an array of LED chips comprising a primary subsection and at least one additional subsection, the additional subsection being displaced from the primary subsection on the mounting surface, wherein the center CA of the array is defined with respect to the primary subsection and the at least one additional subsection being positioned together.

7. The system of claim 1, wherein the peak emission shifting of light emitted from the housing is achieved at least in part by the LED component structure.

8. The system of claim 1, wherein the at least one LED chip is mounted at a non-zero angle γ with respect to the mounting surface, the LED chip thereby comprising a tilt τ with respect to the perpendicular centerline.

9. The system of claim 8, wherein an amount of the non-zero angle γ lies between approximately 5° and approximately 35°, and an amount of the tilt τ lies between approximately 55° and 85°.

10. The system of claim 8, wherein a plurality of the at least one LED chips comprise the tilt τ.

11. The system of claim 10, wherein the plurality of the at least one LED chips comprising the tilt τ include from about 25% to about 75% of the at least one LED chips.

12. The system of claim 10, wherein an amount of the tilt τ is the same for each of the at least one LED chips comprising the tilt τ.

13. The system of claim 10, wherein an amount of the tilt is different for at least one of the LED chips comprising the tilt T from the amount of tilt of another one of the at least one LED chips.

14. The system of claim 1, wherein said at least one LED chip comprises an array of LED chips, wherein a center CA of the array is displaced from a center CL of the lens base by a displacement distance D, and wherein at least one of the LED chips is mounted at a non-zero angle γ with respect to the mounting surface, the LED chip thereby comprising a tilt τ with respect to the perpendicular centerline.

15. The system of claim 1, wherein the optical lens comprises an asymmetric shape.

16. The system of claim 1, wherein the peak emission comprises a shift from the perpendicular centerline of between approximately 5 degrees and approximately 30 degrees.

17. The system of claim 16, wherein the peak emission comprises a shift from the perpendicular centerline of between approximately 10 degrees and approximately 20 degrees.

18. The system of claim 1, in which the mounting surface is a substrate.

19. The system of claim 1, in which the mounting surface is a board placed within the housing.

20. The system of claim 1, in which the system comprises a higher optical efficiency than systems with LED components without peak emission shifting.

21. The system of claim 1, in which a lens array is placed over the LED components.

22. The system of claim 1, further comprising a connector for receiving power.

23. The system of claim 1, in which the at least one LED chip comprises a disordered array of LED chips.

24. The system of claim 1, in which the at least one LED chip comprises an array of LED chips.

25. The system of claim 24, in which the array of LED chips comprises an area which comprises an aspect ratio greater than 1.

26. The system of claim 25, in which the area of the array of LED chips is substantially rectangular.

27. The system of claim 25, in which the area of the array of LED chips is irregular.

28. A light emitting diode (LED) component system comprising:
a housing;
a plurality of LED components within the housing, such that light emitted from the housing comprises a peak emission shifted from a perpendicular centerline of the housing;
each of the plurality of LED components comprising:
at least one LED chip on a mounting surface, said mounting surface comprising a board placed within the housing; and
an optical lens on the at least one LED chip and comprising a lens base attached to the mounting surface, wherein the at least one LED chip is positioned at an angle with respect to the mounting surface to provide a peak emission shifted from a perpendicular centerline of the lens base.

29. A light emitting diode (LED) component system comprising:
a housing;
a plurality of LED components within the housing, such that light emitted from the housing comprises a peak emission shifted from a perpendicular centerline of the housing;
each of the plurality of LED components comprising:
at least one LED chip on a mounting surface; and
an optical lens on the at least one LED chip and comprising a lens base attached to the mounting surface, wherein the at least one LED chip is positioned to provide a peak emission shifted from a perpendicular centerline of the lens base, in which the board comprises holes for aligning a secondary optic, wherein the secondary optic is separate from the optical lens.

30. A light emitting diode (LED) component system comprising:
a housing;
a mounting board within the housing;
a plurality of LED components on the mounting board,
each of the plurality of LED components comprising:
at least one LED chip on the mounting board; and
a primary optical lens overlying the at least one LED chip, the optical lens comprising a lens base on a side of the lens adjacent to the at least one LED chip, wherein said at least one LED chip is displaced in relation to the centerline of said lens base, wherein said at least one LED chip is angled with respect to the mounting board, wherein the average peak emission of said at least one LED chip is shifted from a perpendicular centerline of the housing.

31. The system of claim 30, in which the LED chips are positioned to provide a peak emission shifted from a perpendicular centerline of the lens base.

32. The system of claim 31, in which the system comprises a higher optical efficiency than systems with LED components without peak emission shifting.

33. The system of claim 30, wherein a center CA of the at least one LED chip is displaced from a center CL of the lens base by a displacement distance D.

34. The system of claim 33, in which the peak emission shifting of light emitted from the housing is achieved at least in part by LED chip displacement.

35. The system of claim 30, in which the at least one LED chip is mounted on a substrate.

36. The system of claim 35, wherein a center CA of the at least one LED chip is displaced from a center CS of the surface of the substrate.

37. The system of claim 30, in which the LED component is mounted using a chip-on-board configuration.

38. The system of claim 30, wherein at least one of the LED chips is mounted at a non-zero angle γ with respect to the surface of the mounting surface, the LED chip thereby comprising a tilt τ with respect to the perpendicular centerline.

39. The system of claim 38, wherein an amount of the non-zero angle γ lies between approximately 5° and approximately 35°, and an amount of the tilt τ lies between approximately 55° and 85°.

40. The system of claim 38, wherein an amount of the tilt τ is the same for each of the at least one LED chips comprising the tilt T.

41. The system of claim 38, wherein an amount of the tilt is different for at least one of the LED chips comprising the tilt τ from another of the at least one of the LED chips.

42. The system of claim 30, further comprising at least one array of LED chips under the lens, the array comprising a center Cx displaced from a center CL of the lens base.

43. The system of claim 30, wherein the optical lens comprises an asymmetric shape.

44. The system of claim 30, wherein the peak emission comprises a shift from the perpendicular centerline of between approximately 5 degrees and approximately 30 degrees.

45. The system of claim 30, wherein the peak emission comprises a shift from the perpendicular centerline of between approximately 10 degrees and approximately 20 degrees.

46. The system of claim 30, in which a lens array is placed over the LED components.

47. The system of claim 30, in which the board comprises holes for aligning a secondary optic.

48. The system of claim 30, further comprising a connector on the board for receiving power.

49. The system of claim 30, in which the at least one LED chip comprises a disordered array of LED chips.

50. The system of claim 30, in which the at least one LED chip comprises an array of LED chips.

51. The system of claim 50, in which the array of LED chips comprises an area which comprises an aspect ratio greater than 1.

52. The system of claim 51, in which the area of the array of LED chips is substantially rectangular.

53. The system of claim 51, in which the area of the array of LED chips is irregular.

54. A light emitting diode (LED) component system comprising:
a housing;
a mounting board within the housing;
a plurality of LED components on the mounting board,
each of the plurality of LED components comprising:

at least one LED chip on the mounting board; and a primary optical lens overlying the at least one LED chip, the optical lens comprising a lens base on a side of the lens adjacent to the at least one LED chip, wherein said at least one LED chip is displaced in relation to the centerline of said lens base, wherein the average peak emission of said at least one LED chip is shifted from a perpendicular centerline of the housing, wherein the at least one LED chip comprises an array of LED chips which comprises a primary subsection and at least one additional subsection, the additional subsection being displaced from the primary subsection under the lens, wherein a center CA of the array is defined with respect to the primary subsection and the at least one additional subsection being positioned together.

* * * * *